(12) United States Patent
Ikeda et al.

(10) Patent No.: US 12,416,970 B2
(45) Date of Patent: Sep. 16, 2025

(54) ELECTRONIC DEVICE AND OPERATION METHOD OF THE ELECTRONIC DEVICE

(71) Applicant: Semiconductor Energy Laboratory Co., Ltd., Atsugi (JP)

(72) Inventors: Hisao Ikeda, Zama (JP); Yoshiyuki Kurokawa, Sagamihara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/290,858

(22) PCT Filed: Jul. 22, 2022

(86) PCT No.: PCT/IB2022/056781
§ 371 (c)(1),
(2) Date: Jan. 22, 2024

(87) PCT Pub. No.: WO2023/012566
PCT Pub. Date: Feb. 9, 2023

(65) Prior Publication Data
US 2024/0264665 A1    Aug. 8, 2024

(30) Foreign Application Priority Data
Aug. 5, 2021 (JP) .................................. 2021-128917

(51) Int. Cl.
*G06F 3/01* (2006.01)
*G06T 7/70* (2017.01)
(Continued)

(52) U.S. Cl.
CPC ................ *G06F 3/013* (2013.01); *G06T 7/70* (2017.01); *G06T 2207/30201* (2013.01); *G06V 40/18* (2022.01); *H10K 39/34* (2023.02)

(58) Field of Classification Search
CPC ......... G06F 3/011–013; G06F 3/04842; G02B 2027/0178; G02B 27/017; G02B 27/0101;
(Continued)

(56) References Cited

U.S. PATENT DOCUMENTS 5,982,555 A * 11/1999 Melville ............ G02B 27/0172
351/209
10,254,829 B2    4/2019 Miyaguchi
(Continued)

FOREIGN PATENT DOCUMENTS

JP     06-308371 A    11/1994
JP     2011-107482 A   6/2011
(Continued)

OTHER PUBLICATIONS

International Search Report (Application No. PCT/IB2022/056781) Dated Oct. 18, 2022.
(Continued)

*Primary Examiner* — Sanjiv D. Patel
(74) *Attorney, Agent, or Firm* — Eric J. Robinson; Robinson Intellectual Property Law Office, P.C.

(57) ABSTRACT

An electronic device capable of gaze tracking is provided. The electronic device includes a display apparatus, an image processing portion, and a control portion. The display apparatus includes a light-emitting device and a light-receiving device. The light-emitting device has a function of emitting light to a user's eye as a display image. The light-receiving device has a function of capturing a retina of the user's eye as a captured image. The image processing portion has a function of detecting a macula included in the retina from the captured image and a function of calculating position data of the macula. The control portion has a function of obtaining a position of a user's gaze destination on the display image from the position data of the macula.

4 Claims, 35 Drawing Sheets

(51) Int. Cl.
*G06V 40/18* (2022.01)
*H10K 39/34* (2023.01)

(58) Field of Classification Search
CPC ........ G02B 27/0093; G02B 2027/0138; G06V 40/193; G06V 40/18; G06T 2207/20084; G06T 2207/30041; A61B 3/0091; A61B 2034/2065; A61B 2090/365
See application file for complete search history.

(56) References Cited

U.S. PATENT DOCUMENTS

| | | | |
|---|---|---|---|
| 2010/0045933 | A1 | 2/2010 | Eberl et al. |
| 2013/0135181 | A1 | 5/2013 | Eberl et al. |
| 2017/0206412 | A1* | 7/2017 | Kaehler ................. G06V 20/20 |
| 2018/0246566 | A1* | 8/2018 | Bitauld .............. G02B 27/0172 |
| 2020/0150408 | A1* | 5/2020 | Fard ....................... H04N 23/21 |
| 2021/0279449 | A1* | 9/2021 | Yamazaki .............. G06V 10/70 |
| 2023/0368022 | A1 | 11/2023 | Yamazaki et al. |

FOREIGN PATENT DOCUMENTS

| | | |
|---|---|---|
| JP | 2018-151443 A | 9/2018 |
| WO | WO-2002/031581 | 4/2002 |
| WO | WO-2019/243955 | 12/2019 |

OTHER PUBLICATIONS

Written Opinion (Application No. PCT/IB2022/056781) Dated Oct. 18, 2022.

\* cited by examiner

DSP

DSP

400E

400F

400G

400H

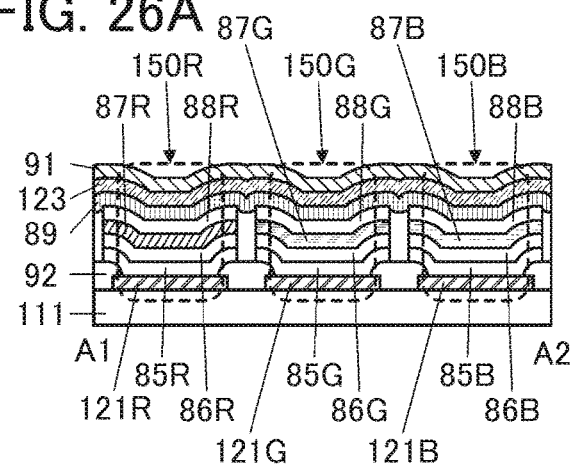
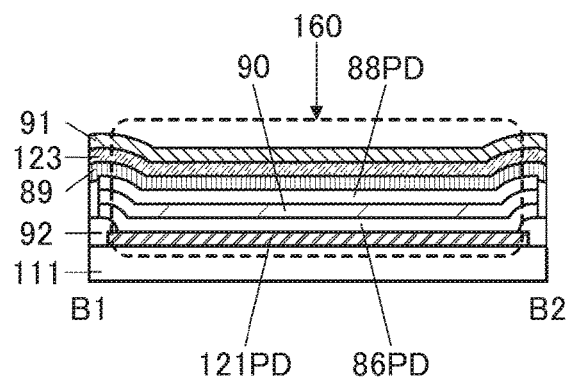
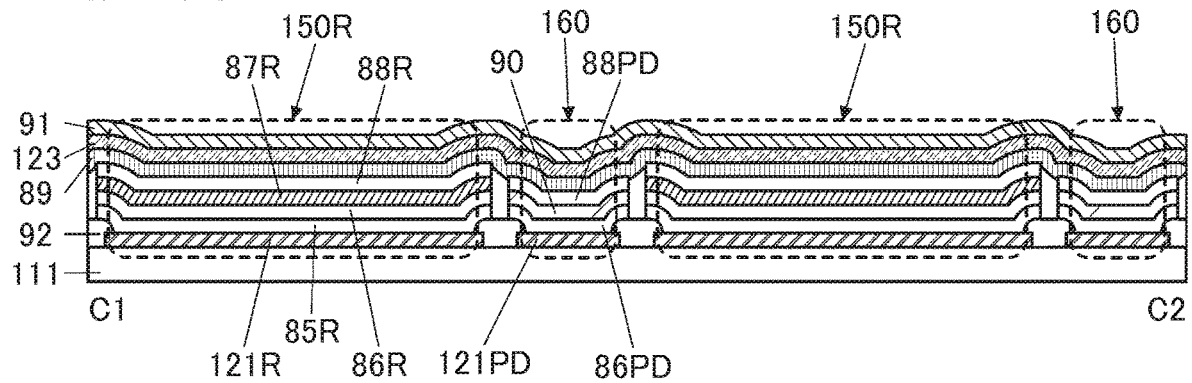
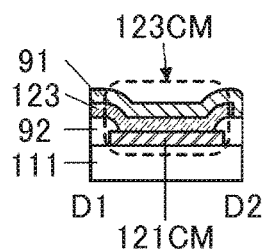

FIG. 27A
FIG. 27B
FIG. 27C
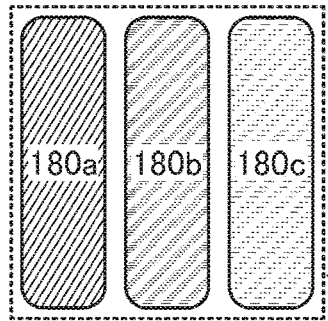
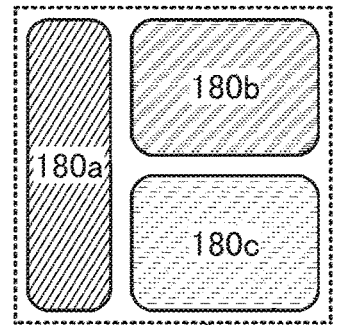
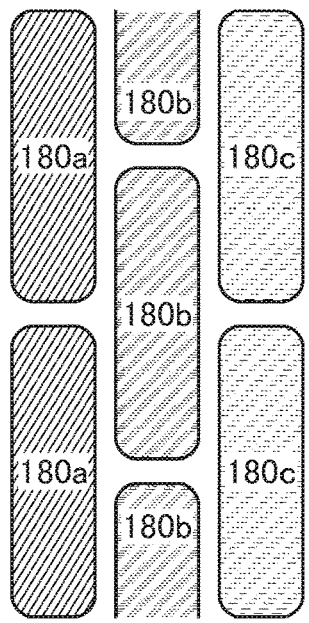
FIG. 27D
FIG. 27E
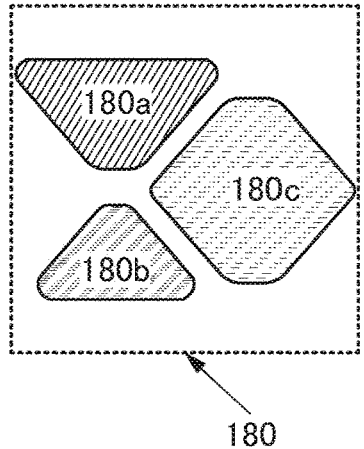
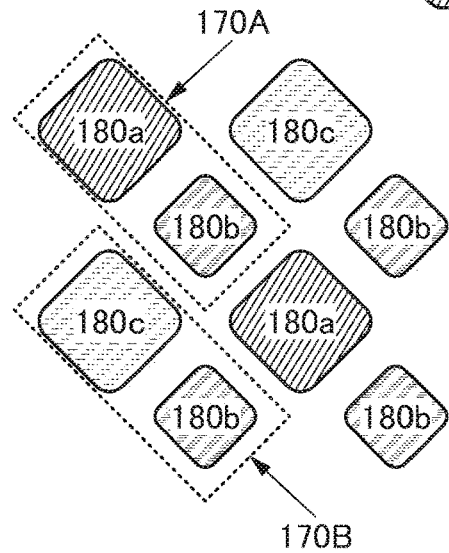
FIG. 27F
FIG. 27G
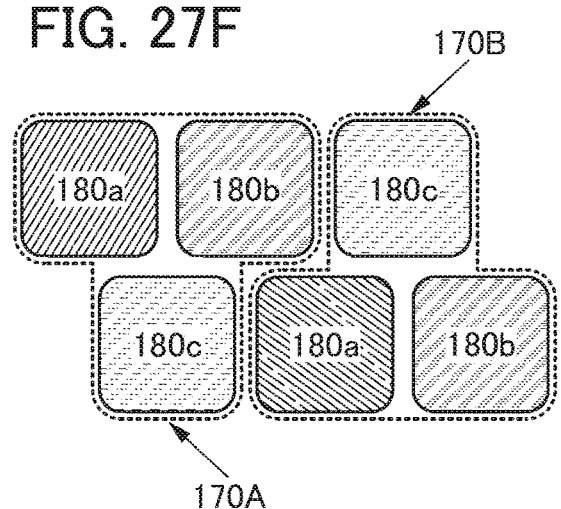
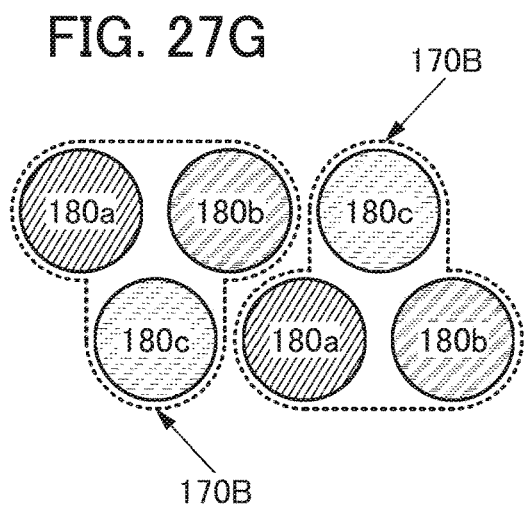

FIG. 29A    FIG. 29B    FIG. 29C
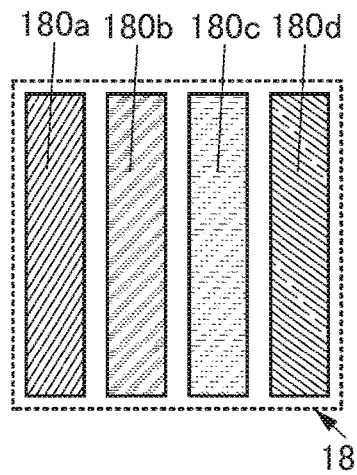 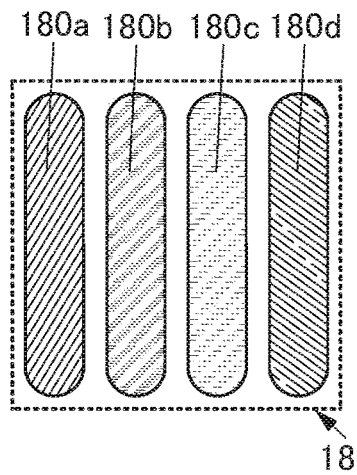 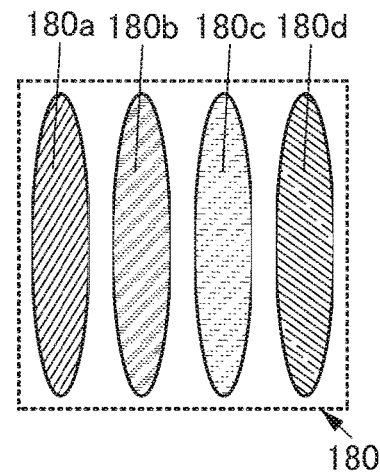
FIG. 29D    FIG. 29E    FIG. 29F
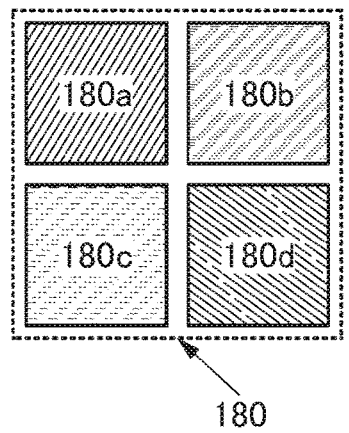 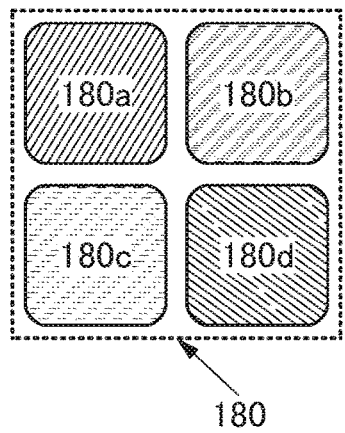 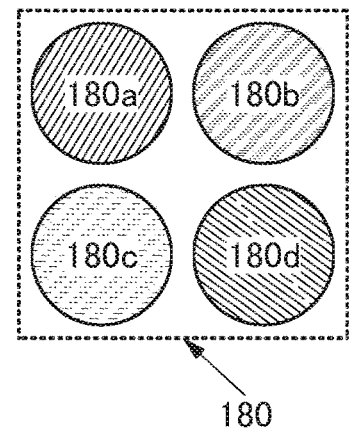
FIG. 29G    FIG. 29H
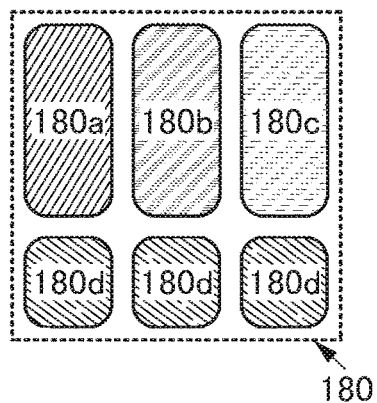 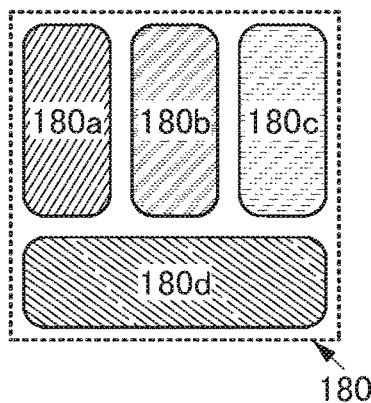

8300

8300

8300

8300

ELECTRONIC DEVICE AND OPERATION METHOD OF THE ELECTRONIC DEVICE

TECHNICAL FIELD

One embodiment of the present invention relates to an electronic device and an operation method of the electronic device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display apparatus, a liquid crystal display apparatus, a light-emitting apparatus, a power storage device, an imaging device, a memory device, a signal processing device, a processor, an electronic device, a system, a driving method thereof, a manufacturing method thereof, and a testing method thereof.

BACKGROUND ART

Display apparatuses included in electronic devices for XR (Extended Reality or Cross Reality) such as VR (Virtual Reality) or AR (Augmented Reality), mobile phones such as smartphones, tablet information terminals, laptop PCs (personal computers), and the like have undergone various improvements in recent years. For example, display apparatuses having a higher pixel density, higher color reproducibility (NTSC ratio), a smaller driver circuit, or lower power consumption have been developed.

Development has also been conducted on display apparatuses having novel functions by providing circuits other than display pixel circuits in display regions of the display apparatuses. For example, Patent Document 1 discloses a display apparatus including an imaging pixel circuit in addition to a display pixel circuit in its display region and a method for detecting an eye or the periphery of the eye as an image by using the display apparatus.

REFERENCE

Patent Document

[Patent Document 1] PCT International Publication No. 2019/243955

SUMMARY OF THE INVENTION

Problems to be Solved by the Invention

A method in which the movement of an eyeball of an examinee is measured and a gaze destination of the examinee is tracked is referred to as eye tracking. Note that in this specification and the like, eye tracking is referred to as gaze tracking in some cases. Eye tracking is expected to be applied to a user interface for sports, education, marketing, danger sensing, health management, and an electronic device, for example. Thus, in recent years, a variety of gaze tracking methods has been proposed.

An object of one embodiment of the present invention is to provide an electronic device capable of gaze tracking (eye tracking). Another object of one embodiment of the present invention is to provide an electronic device capable of sensing a user's eye blinking. Another object of one embodiment of the present invention is to provide a novel electronic device.

Another object of one embodiment of the present invention is to provide an operation method of an electronic device capable of gaze tracking (eye tracking). Another object of one embodiment of the present invention is to provide an operation method of an electronic device capable of sensing a user's eye blinking. Another object of one embodiment of the present invention is to provide an operation method of a novel electronic device.

Note that the objects of one embodiment of the present invention are not limited to the objects listed above. The objects listed above do not preclude the existence of other objects. Note that the other objects are objects that are not described in this section and will be described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1)

One embodiment of the present invention is an electronic device including a display apparatus, an image processing portion, and a control portion. The display apparatus includes a light-emitting device and a light-receiving device. The light-emitting device has a function of emitting light to a user's eye as a display image, and the light-receiving device has a function of capturing a retina of the user's eye as a captured image. The image processing portion has a function of detecting a macula included in the retina from the captured image and a function of calculating position data of the macula. The control portion has a function of obtaining a position of a user's gaze destination on the display image from the position data of the macula.

(2)

In the above (1), one embodiment of the present invention may have a structure in which the image processing portion has a function of detecting a defocused object included in the captured image from the captured image and sensing a user's eye blinking.

(3)

In the above (1) or (2), one embodiment of the present invention may have a structure in which the image processing portion includes a product-sum operation circuit and a circuit performing an arithmetic operation of an activation function.

(4)

One embodiment of the present invention is an operation method of an electronic device including a display apparatus. The display apparatus includes a light-emitting device, a light-receiving device, and an image processing portion. The operation method of the electronic device includes a first step, a second step, and a third step. The first step includes a step in which light of the light-emitting device illuminates a retina of a user's eye as a display image. The second step includes a step in which light reflected by the retina is captured by the light-receiving device as a captured image. The third step includes a step in which the image processing portion obtains coordinates of a macula included in the retina from the captured image.

(5)

In the above (4), one embodiment of the present invention may be the operation method of an electronic device including a control portion. The operation method of the electronic device includes a fourth step. The fourth step includes a step in which the control portion obtains a position of a user's gaze destination on the display image from the coordinates of the macula and updates the display image in accordance with the position.

(6)

In the above (4) or (5), one embodiment of the present invention may be the operation method of an electronic device including a fifth step and a sixth step. The fifth step includes a step in which the image processing portion detects a defocused region included in the captured image and senses a user's eye blinking. The sixth step includes a step in which the display image is updated in a case where the user's eye blinking is sensed in the fifth step.

(7)

In any of the above (4) to (6), one embodiment of the present invention may be the operation method of an electronic device in which the image processing portion includes a product-sum operation circuit and a circuit performing an arithmetic operation of an activation function.

Effect of the Invention

According to one embodiment of the present invention, an electronic device capable of gaze tracking (eye tracking) can be provided. According to another embodiment of the present invention, an electronic device capable of sensing a user's eye blinking can be provided. According to another embodiment of the present invention, a novel electronic device can be provided.

According to another embodiment of the present invention, an operation method of an electronic device capable of gaze tracking (eye tracking) can be provided. According to another embodiment of the present invention, an operation method of an electronic device capable of sensing a user's eye blinking can be provided. According to another embodiment of the present invention, an operation method of a novel electronic device can be provided.

Note that the effects of one embodiment of the present invention are not limited to the effects listed above. The effects listed above do not preclude the existence of other effects. Note that the other effects are effects that are not described in this section and will be described below. The effects that are not described in this section are derived from the description of the specification, the drawings, and the like and can be extracted as appropriate from the description by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 26A to FIG. 26D are schematic cross-sectional views illustrating structure examples of light-emitting devices, light-receiving devices, and a connection electrode included in a display apparatus.

FIG. 27A to FIG. 27G are top views illustrating examples of pixels.

FIG. 29A to FIG. 29H are top views illustrating examples of pixels.

MODE FOR CARRYING OUT THE INVENTION

Figure 1A:
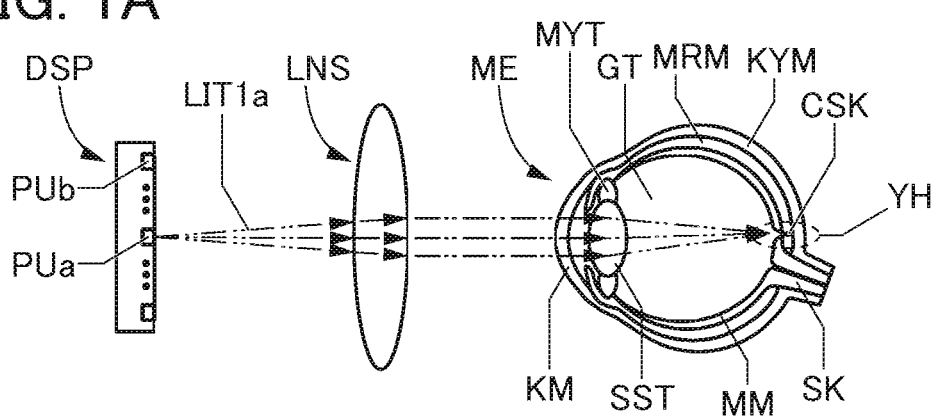
FIG. 1A and FIG. 1B are diagrams illustrating examples of a path of light between a display apparatus included in an electronic device and an eye of a user.

In this specification and the like, a semiconductor device refers to a device that utilizes semiconductor characteristics, and means a circuit including a semiconductor element (e.g., a transistor, a diode, and a photodiode), or a device including the circuit. The semiconductor device also means all devices that can function by utilizing semiconductor characteristics. For example, an integrated circuit, a chip including an integrated circuit, and an electronic component including a chip in a package are each an example of the semiconductor device. Moreover, a memory device, a display apparatus, a light-emitting apparatus, a lighting device, an electronic device, and the like themselves are semiconductor devices or include semiconductor devices in some cases.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conducting state (on state) or a non-conducting state (off state) to control whether current flows or not.

For example, in the case where X and Y are functionally connected, one or more circuits that allow functional connection between X and Y (e.g., a logic circuit (e.g., an inverter, a NAND circuit, or a NOR circuit); a signal converter circuit (e.g., a digital-analog converter circuit, an analog-digital converter circuit, or a gamma correction circuit); a potential level converter circuit (e.g., a power supply circuit such as a step-up circuit or a step-down circuit, or a level shifter circuit for changing the potential level of a signal); a voltage source; a current source; a switching circuit; an amplifier circuit (e.g., a circuit that can increase signal amplitude, the amount of current, or the like, an operational amplifier, a differential amplifier circuit, a source follower circuit, or a buffer circuit); a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description "X and Y are electrically connected" includes the case where X and Y are electrically connected (i.e., the case where X and Y are connected with another element or another circuit provided therebetween) and the case where X and Y are directly connected (i.e., the case where X and Y are connected without another element or another circuit provided therebetween).

This specification describes a circuit structure in which a plurality of elements are electrically connected to a wiring (a wiring for supplying a constant potential or a wiring for transmitting a signal). For example, in the case where X is directly connected to a wiring and Y is directly connected to the wiring, this specification may describe that X and Y are directly electrically connected to each other.

It can be expressed as, for example, "X, Y, a source (sometimes called one of a first terminal and a second terminal) of a transistor, and a drain (sometimes called the other of the first terminal and the second terminal) of the transistor are electrically connected to each other, and X, the source of the transistor, the drain of the transistor, and Y are electrically connected to each other in this order". Alternatively, it can be expressed as "a source of a transistor is electrically connected to X; a drain of the transistor is electrically connected to Y; and X, the source of the transistor, the drain of the transistor, and Y are electrically connected to each other in this order". Alternatively, it can be expressed as "X is electrically connected to Y through a source and a drain of a transistor, and X, the source of the transistor, the drain of the transistor, and Y are provided in this connection order". When the connection order in a circuit structure is defined by an expression similar to the above examples, a source and a drain of a transistor can be distinguished from each other to specify the technical scope. Note that these expressions are examples and the expression is not limited to these expressions. Here, each of X and Y denotes an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both of the components that are a wiring and an electrode. Thus, electrical connection in this specification includes, in its category, such a case where one conductive film has functions of a plurality of components.

In this specification and the like, a "resistor" can be, for example, a circuit element having a resistance value higher than $0\Omega$ or a wiring having a resistance value higher than $0\Omega$. Therefore, in this specification and the like, a "resistor" includes a wiring having a resistance value, a transistor in which current flows between a source and a drain, a diode, and a coil. Thus, the term "resistor" can sometimes be replaced with the term "resistance", "load", "region having a resistance value", or the like. Conversely, the term "resistance", "load", "region having a resistance value", or the like can sometimes be replaced with the term "resistor". The resistance value can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. For another example, the resistance value may be higher than or equal to 1Ω and lower than or equal to 1×10$^9$Ω.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. The term "capacitor", "parasitic capacitance", "gate capacitance", or the like can sometimes be replaced with the term "capacitance". Conversely, the term "capacitance" can sometimes be replaced with the term "capacitor", "parasitic capacitance", "gate capacitance", or the like. In addition, a "capacitor" (including a "capacitor" with three or more terminals) includes an insulator and a pair of conductors between which the insulator is interposed. Thus, the term "pair of conductors" of "capacitor" can be replaced with "pair of electrodes", "pair of conductive regions", "pair of regions", or "pair of terminals". In addition, the terms "one of a pair of terminals" and "the other of the pair of terminals" are referred to as a first terminal and a second terminal, respectively, in some cases. Note that the electrostatic capacitance value can be higher than or equal to 0.05 fF and lower than or equal to 10 pF, for example. For another example, the electrostatic capacitance value may be higher than or equal to 1 pF and lower than or equal to 10 μF.

In this specification and the like, a transistor includes three terminals called a gate, a source, and a drain. The gate is a control terminal for controlling the conducting state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" can sometimes be replaced with each other in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, a third gate, for example, in this specification and the like.

In this specification and the like, for example, a transistor with a multi-gate structure having two or more gate electrodes can be used as the transistor. With the multi-gate structure, channel formation regions are connected in series; accordingly, a plurality of transistors are connected in series. Thus, with the multi-gate structure, the amount of off-state current can be reduced, and the withstand voltage of the transistor can be increased (the reliability can be improved). Alternatively, with the multi-gate structure, drain-source current does not change very much even if drain-source voltage changes at the time of an operation in a saturation region, so that a flat slope of voltage-current characteristics can be obtained. By utilizing the flat slope of the voltage-current characteristics, an ideal current source circuit or an active load having an extremely high resistance value can be obtained. Accordingly, a differential circuit, a current mirror circuit, and the like having excellent properties can be obtained.

In this specification and the like, circuit elements such as a "light-emitting device" and a "light-receiving device" sometimes have polarities called an "anode" and a "cathode". In the case of a "light-emitting device", the "light-emitting device" can sometimes emit light when a forward bias is applied (a positive potential with respect to a "cathode" is applied to an "anode"). In the case of a "light-receiving device", current is sometimes generated between an "anode" and a "cathode" when a zero bias or a reverse bias is applied (a negative potential with respect to a "cathode" is applied to an "anode") and the "light-receiving device" is irradiated with light. As described above, an "anode" and a "cathode" are sometimes regarded as input/output terminals of the circuit elements such as a "light-emitting device" and a "light-receiving device". In this specification and the like, an "anode" and a "cathode" of the circuit element such as a "light-emitting device" or a "light-receiving device" are sometimes called terminals (a first terminal, a second terminal, and the like). For example, one of an "anode" and a "cathode" is called a first terminal and the other of the "anode" and the "cathode" is called a second terminal in some cases.

The case where a single circuit element is illustrated in a circuit diagram may indicate a case where the circuit element includes a plurality of circuit elements. For example, the case where a single resistor is illustrated in a circuit diagram may indicate a case where two or more resistors are electrically connected to each other in series. For another example, the case where a single capacitor is illustrated in a circuit diagram may indicate a case where two or more capacitors are electrically connected to each other in parallel. For another example, the case where a single transistor is illustrated in a circuit diagram may indicate a case where two or more transistors are electrically connected to each other in series and their gates are electrically connected to each other. Similarly, for another example, the case where a single switch is illustrated in a circuit diagram may indicate a case where the switch includes two or more transistors which are electrically connected to each other in series or in parallel and whose gates are electrically connected to each other.

In this specification and the like, a node can be referred to as a terminal, a wiring, an electrode, a conductive layer, a conductor, or an impurity region depending on the circuit structure and the device structure. Furthermore, a terminal or a wiring can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit or the like, and a potential output from a circuit or the like, for example, change with a change of the reference potential.

In this specification and the like, the terms "high-level potential" and "low-level potential" do not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer phenomenon (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer phenomenon (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of current" in a wiring or the like refers to the direction in which a carrier with a positive charge moves, and the amount of current is expressed as a positive value. In other words, the direction in which a carrier with a negative charge moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A". The description "current is input to element A" can be rephrased as "current is output from element A".

Ordinal numbers such as "first", "second", and "third" in this specification and the like are used to avoid confusion among components. Thus, the ordinal numbers do not limit the number of components. In addition, the ordinal numbers do not limit the order of components. In this specification and the like, for example, a "first" component in one embodiment can be referred to as a "second" component in other embodiments or the scope of claims. For another example, a "first" component in one embodiment in this specification and the like can be omitted in other embodiments or the scope of claims.

In this specification and the like, the terms for describing positioning, such as "over" and "under", are sometimes used for convenience to describe the positional relation between components with reference to drawings. The positional relation between components is changed as appropriate in accordance with the direction in which the components are described. Thus, the positional relation is not limited to the terms described in the specification and the like, and can be described with another term as appropriate depending on the situation. For example, the expression "an insulator positioned over (on) the top surface of a conductor" can be replaced with the expression "an insulator positioned under (on) a bottom surface of a conductor" when the direction of a drawing showing these components is rotated by 180°.

Furthermore, the terms "over" and "under" do not necessarily mean that a component is placed directly over or directly under and in direct contact with another component. For example, the expression "electrode B over insulating layer A" does not necessarily mean that the electrode B is formed over and in direct contact with the insulating layer A, and does not exclude the case where another component is provided between the insulating layer A and the electrode B. Similarly, for example, the expression "electrode B above insulating layer A" does not necessarily mean that the electrode B is formed over and in direct contact with the insulating layer A, and does not exclude the case where another component is provided between the insulating layer A and the electrode B. Similarly, for example, the expression "electrode B under insulating layer A" does not necessarily mean that the electrode B is formed under and in direct contact with the insulating layer A, and does not exclude the case where another component is provided between the insulating layer A and the electrode B.

In this specification and the like, components arranged in a matrix and their positional relation are sometimes described using terms such as "row" and "column". The positional relation between components is changed as appropriate in accordance with the direction in which the components are described. Thus, the positional relation is not limited to the terms described in the specification and the like, and can be described with another term as appropriate depending on the situation. For example, the term "row direction" can be replaced with the term "column direction" when the direction of the diagram is rotated by 90°.

In this specification and the like, the terms "film" and "layer" can be interchanged with each other depending on the situation. For example, the term "conductive layer" can be changed into the term "conductive film" in some cases. For another example, the term "insulating film" can be changed into the term "insulating layer" in some cases. Alternatively, the terms "film" and "layer" are not used and can be interchanged with another term depending on the case or the situation. For example, the term "conductive layer" or "conductive film" can be changed into the term "conductor" in some cases. For another example, the term "insulating layer" or "insulating film" can be changed into the term "insulator" in some cases.

In this specification and the like, the terms "electrode", "wiring", "terminal", and the like do not limit the functions of such components. For example, an "electrode" is used as part of a "wiring" in some cases, and vice versa. Furthermore, the term "electrode" or "wiring" also includes, for example, the case where a plurality of "electrodes" or "wirings" are formed in an integrated manner. For example, a "terminal" is used as part of a "wiring" or an "electrode" in some cases, and vice versa. Furthermore, the term "terminal" also includes the case where a plurality of "electrodes", "wirings", or "terminals" are formed in an integrated manner, for example. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region" depending on the case.

In this specification and the like, the terms "wiring", "signal line", and "power supply line" can be interchanged with each other depending on the case or the situation. For example, the term "wiring" can be changed into the term "signal line" in some cases. For another example, the term "wiring" can be changed into the term "power supply line" in some cases. Conversely, the term "signal line" or "power supply line" can be changed into the term "wiring" in some cases. The term "power supply line" can be changed into the term "signal line" in some cases. Conversely, the term "signal line" can be changed into the term "power supply line" in some cases. The term "potential" that is applied to a wiring can be changed into the term "signal" depending on the case or the situation. Conversely, the term "signal" can be changed into the term "potential" in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is included in a channel formation region of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also collectively referred to as a metal oxide in some cases. A metal oxide containing nitrogen may be called a metal oxynitride.

In this specification and the like, an impurity in a semiconductor refers to, for example, an element other than a main component of a semiconductor layer. For example, an element with a concentration of lower than 0.1 atomic % is an impurity. When an impurity is contained, for example, one or more selected from an increase in the density of defect states in a semiconductor, a decrease in carrier mobility, and a decrease in crystallinity may occur. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. In the case where the semiconductor is a silicon layer, examples of an impurity that changes characteristics of the semiconductor include Group 1 elements, Group 2 elements, Group 13 elements, and Group 15 elements (except oxygen and hydrogen).

In this specification and the like, a switch has a function of being in a conducting state (on state) or a non-conducting state (off state) to determine whether current flows or not. Alternatively, a switch has a function of selecting and changing a current path. Thus, a switch may have two or more terminals through which current flows, in addition to a control terminal. For example, an electrical switch or a mechanical switch can be used. That is, a switch can be any element capable of controlling current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conducting state" of the transistor refers to a state where a source electrode and a drain electrode of the transistor can be regarded as being electrically short-circuited or a state where current can be made to flow between the source electrode and the drain electrode. Furthermore, a "non-conducting state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification and the like, a device formed using a metal mask or an FMM (fine metal mask, high-resolution metal mask) may be referred to as a device having an MM (metal mask) structure. In this specification and the like, a device formed without using a metal mask or an FMM may be referred to as a device having an MML (metal maskless) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display apparatus.

Light-emitting devices can be classified roughly into a single structure and a tandem structure. A device with a single structure includes one light-emitting unit between a pair of electrodes, and the light-emitting unit preferably includes one or more light-emitting layers. When white light emission is obtained using two light-emitting layers, the two light-emitting layers are selected such that emission colors of the light-emitting layers are complementary colors. For example, when an emission color of a first light-emitting layer and an emission color of a second light-emitting layer are complementary colors, a light-emitting device can be configured to emit white light as a whole. When white light emission is obtained using three or more light-emitting layers, a light-emitting device is configured to emit white light as a whole by combining emission colors of the three or more light-emitting layers.

A device with a tandem structure includes two or more light-emitting units between a pair of electrodes, and each light-emitting unit preferably includes one or more light-emitting layers. To obtain white light emission, the structure is made such that light from light-emitting layers of the plurality of light-emitting units can be combined to be white light. Note that a structure for obtaining white light emission is similar to that in the case of a single structure. In the device with a tandem structure, an intermediate layer such as a charge-generation layer is suitably provided between the plurality of light-emitting units.

When the above white-light-emitting device (having a single structure or a tandem structure) and the above light-emitting device having an SBS structure are compared to each other, the light-emitting device having an SBS structure can have lower power consumption than the white-light-emitting device. The light-emitting device having an SBS structure is suitably used in the case where the power consumption is required to be low. Meanwhile, the white-light-emitting device is suitable in terms of lower manufacturing cost or higher manufacturing yield because the manufacturing process of the white-light-emitting device is simpler than that of the light-emitting device having an SBS structure.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described using a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted with the same reference numerals, and in particular need to be distinguished from each other, an identification sign such as "_1", "[n]", or "[m,n]" is sometimes added to the reference numerals. Components denoted with identification signs such as "_1", "[n]", and "[m,n]" in the drawings and the like are sometimes denoted without such identification signs in this specification and the like when the components do not need to be distinguished from each other.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes, values, or the like shown in the drawings. For example, variations in signal, voltage, or current due to noise, variations in signal, voltage, or current due to difference in timing, or the like can be included.

Embodiment 1

In this embodiment, a structure of a device for XR which is an electronic device of one embodiment of the present invention will be described.

Figure 1B:
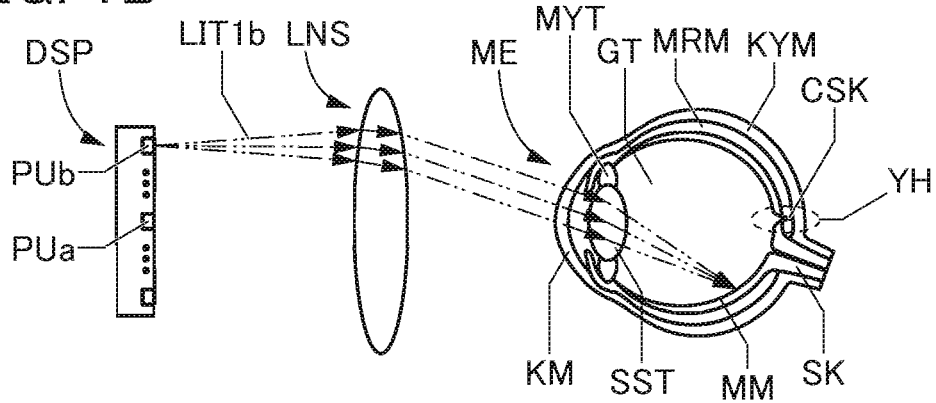

FIG. 1A and FIG. 1B are cross-sectional views illustrating a display apparatus DSP and a lens LNS that are included in a device for XR and a user's eye ME, for example. FIG. 1A and FIG. 1B also illustrate a path of light emitted from the display apparatus to the user's eye.

In FIG. 1A and FIG. 1B, the display apparatus DSP includes a plurality of display pixel circuits, for example. The plurality of display pixel circuits are preferably arranged regularly in a matrix or the like, for example. For example, the display apparatus DSP illustrated in FIG. 1A and FIG. 1B includes a pixel circuit PUa and a pixel circuit PUb, and display pixel circuits are included in each of the pixel circuit PUa and the pixel circuit PUb.

Each of the plurality of display pixel circuits has a function of emitting light based on a video signal input to the display apparatus DSP toward a display surface of the display apparatus DSP. For example, FIG. 1A illustrates a state in which light LIT1$a$ based on a video signal is emitted from a display pixel circuit included in the pixel circuit PUa toward the display surface of the display apparatus DSP, and FIG. 1B illustrates a state in which light LIT1$b$ based on a video signal is emitted from a display pixel circuit included in the pixel circuit PUb toward the display surface of the display apparatus DSP.

The lens LNS has, for example, a function of refracting light emitted from the display apparatus DSP and emitting the light in the direction of the user's eye ME. For example, FIG. 1A illustrates a state in which the lens LNS refracts the light LIT1$a$ and emits the light LIT1$a$ in the direction of the user's eye ME, and FIG. 1B illustrates a state in which the lens LNS refracts the light LIT1$b$ and emits the light LIT1$b$ in the direction of the user's eye ME.

In FIG. 1A, the user's eye ME includes a cornea KM, a ciliary body MYT (in this specification and the like, a ciliary zonule (a zonule of Zinn) is included in the ciliary body MYT), a crystalline lens SST, a vitreous body GT, a retina MM, a choroid MRM, a sclera KYM, and an optic nerve SK.

A macula YH is included in part of a region of the retina MM. Cells having a function of recognizing details and color of an object are concentrated in the macula YH. Furthermore, a fovea CSK is included in the macula YH. The user recognizes converged light (an image) on the macula YH included in the user's eye as a point or a region of a gaze destination (referred to as a gaze point in some cases).

For example, FIG. 1A illustrates a state in which the light LIT1$a$ emitted from the display pixel circuit included in the pixel circuit PUa of the display apparatus DSP is converged at the macula YH through the lens LNS and the crystalline lens SST. In this case, the user recognizes light (an image) displayed by the pixel circuit PUa as a point or a region of a gaze destination.

For example, FIG. 1B illustrates a state in which the light LIT1$b$ emitted from the display pixel circuit included in the pixel circuit PUb of the display apparatus DSP is converged in a region of the retina MM that is not the macula YH through the lens LNS and the crystalline lens SST. In this case, the user recognizes light (an image) displayed by the pixel circuit PUb, not as a point or a region of a gaze destination, but as an image within the user's visual field.

The crystalline lens SST of the user's eye ME functions as a lens for converging light to the above-described fovea CSK, for example. The ciliary body MYT has a function of changing the thickness of the crystalline lens SST. The adjustment of the degree of light converged at the fovea CSK can be performed by changing the thickness of the crystalline lens SST. In other words, the crystalline lens SST and the ciliary body MYT can perform adjustment of the focus of light incident on the user's eye ME.

A distance between the display apparatus DSP and the lens LNS (or a distance between the lens LNS and the user's eye ME) can be freely determined, and the distance between the display apparatus DSP and the lens LNS is preferably a distance in which light emitted from the display pixel circuit is converged on the retina MM of the user's eye ME, for example.

As described above, when an image is displayed on a display portion of the display apparatus DSP, at least one of changing the thickness of the crystalline lens SST and changing the distance between the display apparatus DSP and the lens LNS is performed, whereby light emitted from the plurality of display pixel circuits included in the display portion can be converged on the retina MM. In particular, the user can recognize converged light (an image) on the macula YH in the retina MM as a point or a region of a gaze destination.

Next, a case where not only the plurality of display pixel circuits but also a plurality of imaging pixel circuits are provided in the display portion of the display apparatus DSP is considered. The plurality of imaging pixel circuits are preferably arranged regularly in a matrix or the like with the plurality of display pixel circuits, for example. For example, the plurality of imaging pixel circuits may be included in a pixel circuit with the display pixel circuits. Here, the pixel circuit PUa and the pixel circuit PUb illustrated in FIG. 1A and FIG. 1B each include not only the display pixel circuits but also the imaging pixel circuits.

Each of the plurality of imaging pixel circuits has a function of generating an electric signal (e.g., current or voltage) corresponding to light incident on an imaging device included in each of the plurality of imaging pixel circuits and outputting the electric signal.

When light is incident on an object in a direction perpendicular to the object, the light is reflected in a 180° direction with respect to the incident direction. In other words, the path of incident light in a direction perpendicular to the object is substantially aligned with the path of reflected light by the object.

Figure 2A:
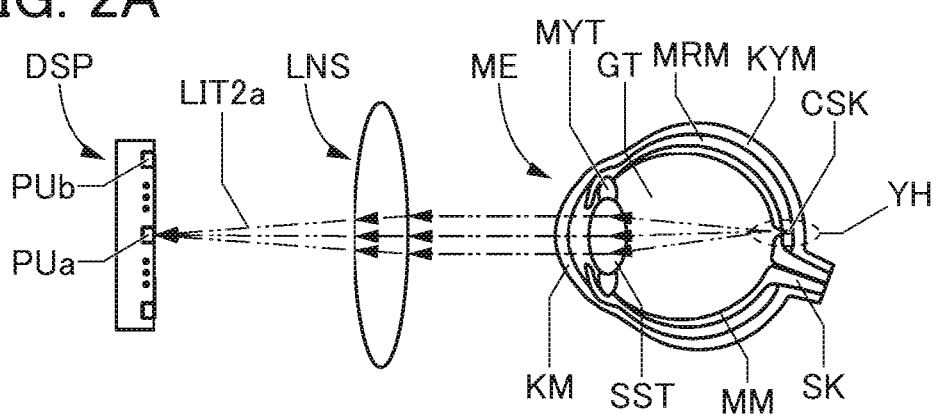
FIG. 2A and FIG. 2B are diagrams illustrating examples of a path of light between a display apparatus included in an electronic device and an eye of a user.

FIG. 1A illustrates a state in which the light LIT1a emitted from the display pixel circuit of the pixel circuit PUa reaches the macula YH. FIG. 2A illustrates a state in which the light LIT1a is reflected by the macula YH. As illustrated in FIG. 2A, light LIT2a that is reflected light from the macula YH reaches the pixel circuit PUa in a path substantially the same as that of the light LIT1a.

Figure 2B:
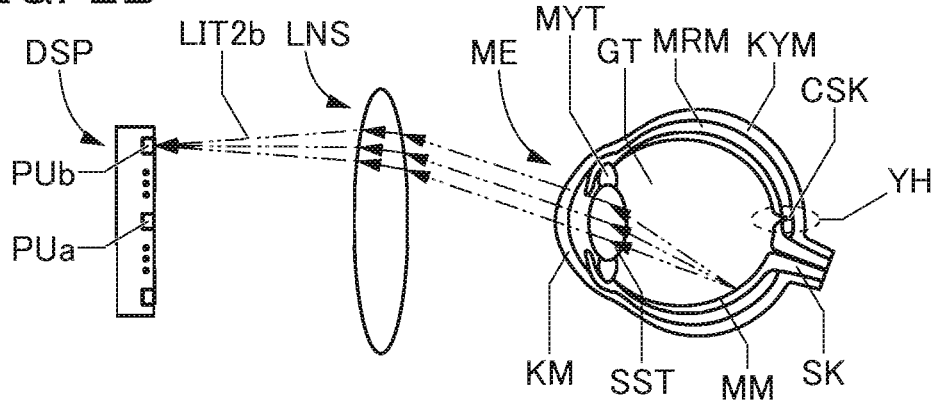

FIG. 1B illustrates a state in which the light LIT1b emitted from the display pixel circuit of the pixel circuit PUb reaches a region other than the macula YH in the retina MM. FIG. 2B illustrates a state in which the light LIT1b is reflected in a region other than the macula YH in the retina MM. As illustrated in FIG. 2B, light LIT2b that is reflected light from the retina MM reaches the pixel circuit PUb in a path substantially the same as that of the light LIT1b.

Thus, when an image capturing operation is performed using the imaging pixel circuits included in all the pixel circuits in the display apparatus DSP, the retina MM and the macula YH that is part of a region of the retina MM can be captured as an image. Since the user recognizes incident light (an image) on the macula YH as a point or a region of a gaze destination, a region of a display image of the display apparatus DSP where the user's gaze is facing can be found from the position (coordinates) where the macula YH is captured in the image.

Specifically, an address of an imaging pixel circuit that has captured an image of the macula YH is obtained from the image, and a display pixel circuit included in the same pixel circuit as the imaging pixel circuit can be found. Light emitted by the display pixel circuit included in the same pixel circuit as the imaging pixel circuit that has captured the image of the macula YH reaches the macula YH. Accordingly, in a display image of the display apparatus DSP, a display image displayed by the display pixel circuit included in the same pixel circuit as the imaging pixel circuit that has captured the image of the macula YH is a region where the user's gaze is facing.

Figure 3A:
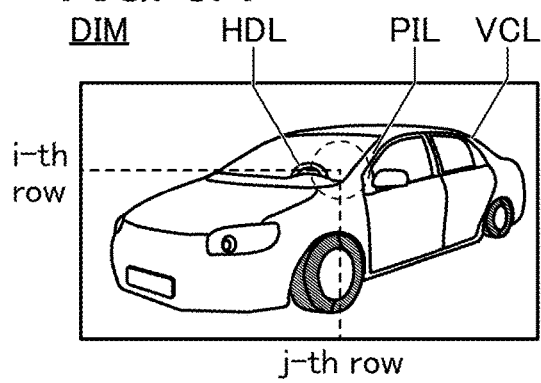
FIG. 3A is a diagram illustrating an example of an image displayed by a display apparatus included in an electronic device.

Here, the relation between a display image displayed on the display apparatus DSP and a captured image captured by the imaging pixel circuits included in the display apparatus DSP is described as an example. FIG. 3A illustrates a display image DIM output to the plurality of display pixel circuits included in the display apparatus DSP, and FIG. 3B illustrates a captured image TIM captured by the plurality of imaging pixel circuits included in the display apparatus DSP.

FIG. 3A illustrates an example in which the display apparatus DSP displays the display image DIM including a moving object VCL. Meanwhile, FIG. 3B illustrates the user's eye looking at the display image DIM as the captured image TIM captured by the plurality of imaging pixel circuits included in the display apparatus DSP.

Figure 3B:
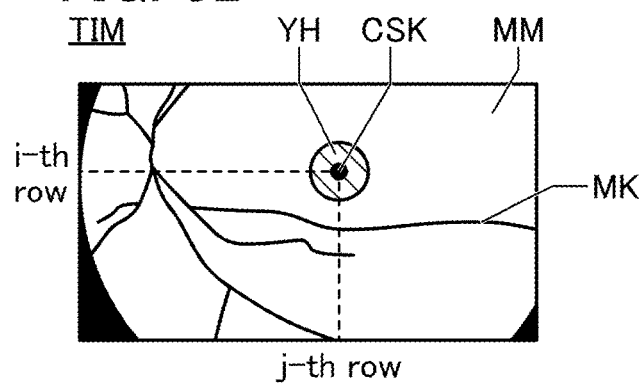
FIG. 3B is a diagram illustrating an example of an image captured by an imaging circuit included in the electronic device.

FIG. 3B illustrates an example in which the retina MM is captured. Specifically, the macula YH including the fovea CSK and blood vessels MK spreading over the retina MM are captured. In particular, the macula YH and the fovea CSK are captured at a position of the i-th row and the j-th column (i and j are each an integer greater than or equal to 1) or in the vicinity thereof in a pixel array of the display apparatus DSP.

In the display image DIM in FIG. 3A, a steering wheel HDL, a pillar PIL, and a driver's seat provided in the moving object VCL are in the position of the i-th row and the j-th column or in the vicinity thereof.

As described in FIG. 1A, FIG. 1B, FIG. 2A, and FIG. 2B, the path of light that reaches the macula YH from the display pixel circuit and the path of light reflected by the macula YH that reaches the display pixel circuit (the imaging pixel circuit) are substantially the same; thus, the fact that the user looking at the display image DIM in FIG. 3A is turning his or her gaze toward, in particular, the steering wheel HDL, the pillar PIL, and the driver's seat can be determined from the positions of the macula YH and the fovea CSK that are captured in the captured image TIM in FIG. 3B.

Furthermore, when an image capturing operation is performed repeatedly, a point or a region where the user's gaze is facing can be obtained successively in an image displayed on the display apparatus DSP. Thus, gaze tracking (eye tracking) of the user can be achieved.

Structure Example

Figure 4A:
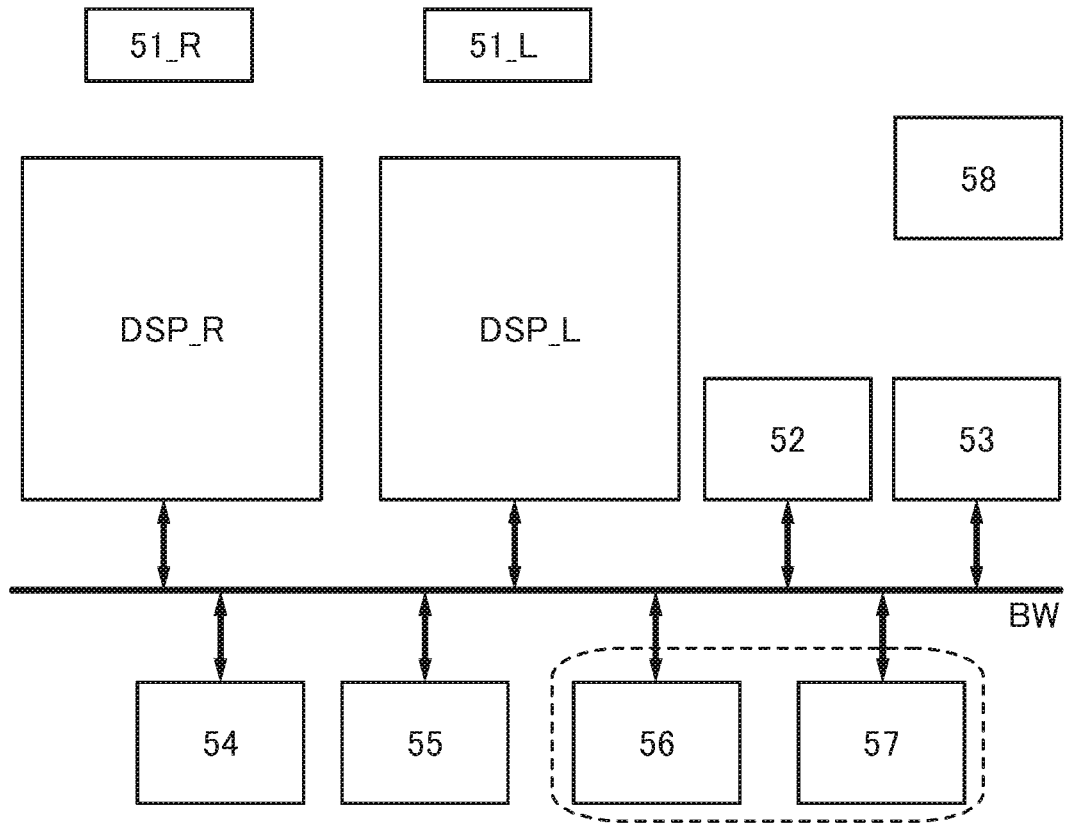
FIG. 4A is a block diagram illustrating a structure example of an electronic device.

A structure of an electronic device of one embodiment of the present invention will be described with reference to block diagrams illustrated in FIG. 4A and FIG. 4B. An electronic device 50 illustrated in FIG. 4A includes the display apparatus DSP (a display apparatus DSP_R and a display apparatus DSP_L), an optical system 51 (an optical system 51_R and an optical system 51_L), an image processing portion 52, a motion detection portion 53, an audio 54, a camera 55, a control portion 56, a communication portion 57, and a battery 58. The display apparatus DSP, the image processing portion 52, the motion detection portion 53, the audio 54, the camera 55, the control portion 56, and the communication portion 57 can transmit and receive various kinds of signals to and from one another through a bus wiring BW.

Figure 4B:
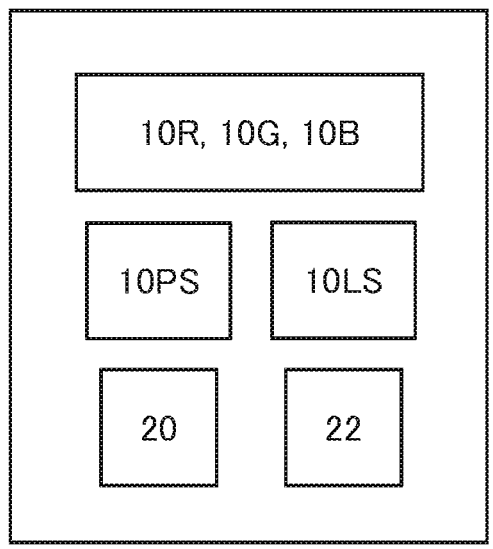
FIG. 4B is a block diagram illustrating a structure example of a display apparatus.

As illustrated in FIG. 4B, the display apparatus DSP includes a light-emitting device 10R, a light-emitting device 10G, and a light-emitting device 10B that serve as display elements, a light-emitting device 10LS that serves as a light source, a light-receiving device 10PS that serves as an imaging element, a driver circuit portion 20, and a frame memory 22. The driver circuit portion includes a gate driver circuit and a source driver circuit. Note that one or more gate driver circuits may be provided and one or more source driver circuits may be provided. Although in the example illustrated in FIG. 4A, two display apparatuses DSP, one for the right eye and the other for the left eye, are provided, one or three or more display apparatuses may be provided.

Note that hereafter, in the description common to the light-emitting device 10R, the light-emitting device 10G, the light-emitting device 10B, and a light-emitting device 10LS, the alphabets are omitted from the reference numerals and the term "light-emitting device 10" is used in some cases. Alternatively, in the case where the term "light-emitting device 10" is used, it refers to one or more of the light-emitting device 10R, the light-emitting device 10G, the light-emitting device 10B, and the light-emitting device 10LS in some cases.

The optical system 51 includes a lens, for example. Note that as the lens, specifically, the lens LNS described in FIG. 1A, FIG. 1B, FIG. 2A, and FIG. 2B can be used. The optical system 51 may include one or more selected from a reflective plate, a half mirror, and a waveguide as needed. Although in the example illustrated in FIG. 4A, two optical systems 51, one for the right eye and the other for the left eye, are provided, one or three or more optical systems may be provided.

The audio 54 includes, for example, one or both of a microphone and a speaker. The motion detection portion 53 includes an inertial sensor and has a function of sensing the motion of the user's body. Note that the inertial sensor here refers to a sensor for sensing the acceleration and angular velocity of an object. The control portion 56 includes a CPU, a GPU, and a memory. The communication portion 57 can transmit and receive data to and from another terminal or a server on a network through wireless communication. Note that in FIG. 4A, the control portion 56 and the communication portion 57 surrounded by a dotted line may be provided separately from the electronic device. In that case, the electronic device can be less bulky.

Image data generated by the control portion 56 is transmitted to the display apparatus DSP through the bus wiring BW. The image data is stored in the frame memory 22 and then displayed by the light-emitting device 10R, the light-emitting device 10G, and the light-emitting device 10B through the source driver included in the driver circuit portion 20.

Data (analog data) obtained by the light-receiving device 10PS is converted into digital data in the image processing portion 52 and transmitted to the control portion 56. For example, the light-receiving device 10PS obtains an image of the retina of the user's eye, and the image processing portion 52 identifies the position of the user's gaze destination from the image. The control portion 56 receives the position data of the gaze destination from the image processing portion 52 and the position data is reflected in image data seen by the user.

The image processing portion 52 has a function of performing image analysis. By performing the image analysis, the position of the user's gaze destination can be identified from the image of the retina of the user's eye obtained by the light-receiving device 10PS. That is, gaze tracking can be performed using the image processing portion 52. For the above image analysis, a calculation model such as an artificial neural network can be used. Note that in some cases, a product-sum operation and a function operation (e.g., an arithmetic operation using an activation function) are regarded as arithmetic operations of the artificial neural network. Thus, the image processing portion 52 includes at least one of an arithmetic circuit capable of performing a product-sum operation and a function operation and a processing device capable of executing a program including an artificial neural network.

It is particularly preferable that an arithmetic circuit having a function of performing a product-sum operation be used for the above image analysis. The use of the arithmetic circuit enables the image analysis to be performed with low power. In other words, it is possible to reduce power consumption of the display apparatus of one embodiment of the present invention or the electronic device provided with the display apparatus. Note that details of the arithmetic circuit having a function of performing a product-sum operation will be described in Embodiment 2.

It is particularly preferable to use deep learning for the artificial neural network used for the above image analysis. For the deep learning, a convolutional neural network (CNN), a recurrent neural network (RNN), an autoencoder (AE), a variational autoencoder (VAE), random forest, a support vector machine, gradient boosting, a generative adversarial network (GAN), or the like is preferably used, for example.

Structures of a display apparatus provided for the electronic device of one embodiment of the present invention will be described below with reference to FIG. 5A, FIG. 5B, FIG. 6A, and FIG. 6B.

Structure Example of Display Apparatus

A schematic view of the display apparatus DSP illustrated in FIG. 4B that is included in the electronic device of one embodiment of the present invention is illustrated in FIG. 5A, FIG. 5B, FIG. 6A, and FIG. 6B. The display apparatus DSP illustrated in FIG. 5A includes a substrate 11, a substrate 12, the light-emitting device 10, and the light-receiving device 10PS. The light-emitting device 10 includes the light-emitting device 10R, the light-emitting device 10G, and the light-emitting device 10B serving as display elements and the light-emitting device 10LS serving as a light source, and is positioned in a layer 16. The light-receiving device 10PS is provided over a support plate 13, the substrate 11 is provided over the light-receiving device 10PS, the light-emitting device 10 is provided over the substrate 11, the substrate 12 is provided over the light-emitting device 10, and a protective member 15 is provided over the substrate 12. The display apparatus DSP illustrated in FIG. 5A has a structure in which the light-emitting device 10R, the light-emitting device 10G, the light-emitting device 10B, the light-emitting device 10LS, and the light-receiving device 10PS are provided in one pixel region 19. Note that the details of the components will be described later.

For example, a structure may be employed in which the light-emitting device 10R emitting red light, the light-emitting device 10G emitting green light, the light-emitting device 10B emitting blue light, and the light-emitting device 10LS emitting visible light are each used as the light-emitting device 10. In this case, the light-emitting device 10R, the light-emitting device 10G, and the light-emitting device 10B function as display elements, and the light-emitting device 10LS functions as a light source. There is no particular limitation on the number of the light-emitting elements 10LS, and one or more or zero light-emitting elements 10LS may be included. The light-emitting device 10 is placed in a region interposed between the substrate 11 and the substrate 12. Furthermore, the substrate 11 is placed between the support plate 13 and the light-emitting device 10, and the substrate 12 is placed between the light-emitting device 10 and the protective member 15.

Light emitted from the light-emitting device 10LS preferably includes visible light. For example, the light-emitting device 10LS is preferably an element emitting monochromatic light that has one peak in the visible light region of the emission spectrum, and the light-emitting device 10LS is further preferably an element emitting monochromatic light that has a peak in the red wavelength range of the emission spectrum. The light-emitting device 10LS is preferably a light-emitting element having the same structure as the light-emitting device 10R, the light-emitting device 10G, or the light-emitting device 10B. Accordingly, the light-emitting device 10LS can be formed without an increase in the number of manufacturing steps. Note that the light-emitting device 10LS may be a device emitting light that has two or more peaks in the visible light region of the emission spectrum, and the light-emitting device 10LS may be a device emitting light that has a peak in a region (e.g., the infrared light region or the ultraviolet light region) other than the visible light region.

The light-receiving device 10PS has a function of detecting visible light. The light-receiving device 10PS preferably has light sensitivity with respect to visible light emitted from the light-emitting device 10LS. Note that in the case where the light-emitting device 10LS is a device that emits light having a peak in a region other than the visible light region of the emission spectrum, the light-receiving device 10PS preferably has a function of detecting light in the region.

Figure 5A:
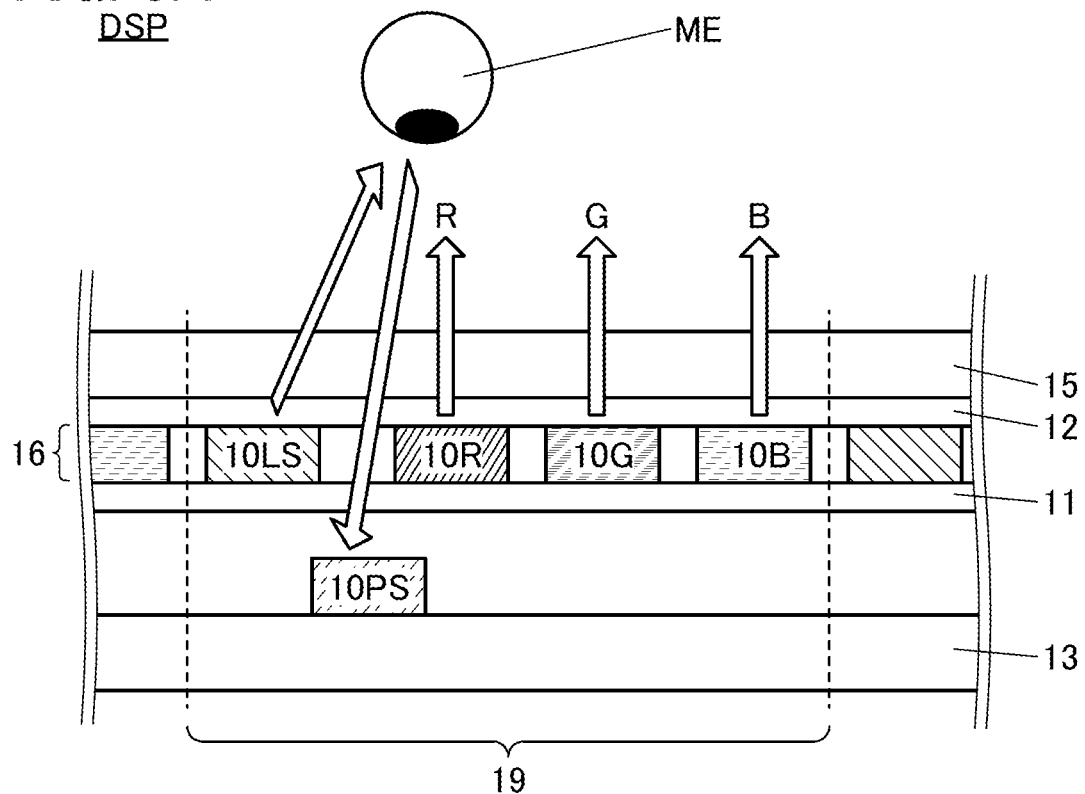
FIG. 5A and FIG. 5B are schematic cross-sectional views illustrating structure examples of a display apparatus included in an electronic device.

As illustrated in FIG. 5A, an image is displayed using light emitted from the light-emitting device 10R, the light-emitting device 10G, and the light-emitting device 10B. In addition, the visible light emitted from the light-emitting device 10LS reaches the retina MM inside the user's eye ME. Furthermore, reflected light from the retina MM is detected by the light-receiving device 10PS, so that gaze tracking is performed. Thus, the substrate 12 and the protective member 15 need to transmit the visible light emitted from the light-emitting device 10R, the light-emitting device 10G, the light-emitting device 10B, and the light-emitting device 10LS. Furthermore, the substrate 11, the substrate 12, and the protective member 15 need to transmit the visible light reflected by the retina MM of the eye ME. It is thus preferable that the substrate 11, the substrate 12, and the protective member 15 each have a light-transmitting property with respect to visible light.

For each of the substrate 11 and the substrate 12, an insulator (an insulating substrate) such as glass, quartz, ceramic, sapphire, or stabilized zirconia (e.g., yttria-stabilized zirconia) can be used, for example. For each of the substrate 11 and the substrate 12, a resin such as an insulating resin or a conductive resin can be used, for example. For each of the substrate 11 and the substrate 12, a semiconductor (a semiconductor substrate) such as silicon, germanium, silicon carbide, silicon germanium, gallium arsenide, indium phosphide, or zinc oxide can be used, for example. For each of the substrate 11 and the substrate 12, a conductor (a conductive substrate) such as a metal or an alloy can be used, for example. Note that the substrate on the side where light from the light-emitting device 10 is extracted is formed using a material that transmits the light. When each of the substrate 11 and the substrate 12 is formed using a flexible material, the display apparatus DSP can have increased flexibility and moreover, the display apparatus DSP can be reduced in weight and thickness. Furthermore, the substrate 11 or the substrate 12 may include a polarizing plate.

For each of the substrate 11 and the substrate 12, one or more selected from polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber may be used. Glass that is thin enough to have flexibility may be used for one or both of the substrate 11 and the substrate 12.

As described above, in the display apparatus DSP illustrated in FIG. 5A, the layer 16 where the light-emitting device 10 including the light-emitting device 10LS is positioned is over and overlaps with the light-receiving device 10PS. In the layer 16 where the light-emitting device is positioned, the light-emitting device 10 is electrically connected to a common electrode in some cases. Therefore, in the display apparatus DSP, the retina MM inside the eye ME can be irradiated with light and the light reflected by the retina MM can be received without a complicated optical system. Furthermore, the distance between the light-emitting device 10LS and the light-receiving device 10PS is relatively small. This can increase the detection sensitivity with respect to the reflected light from the retina MM inside the eye ME. Since the optical system structure can be simplified, the size of the display apparatus can be reduced. Note that the light-emitting device 10LS may include a portion overlapping with the light-receiving device 10PS or may include no portion overlapping with the light-receiving device 10PS.

Figure 5B:
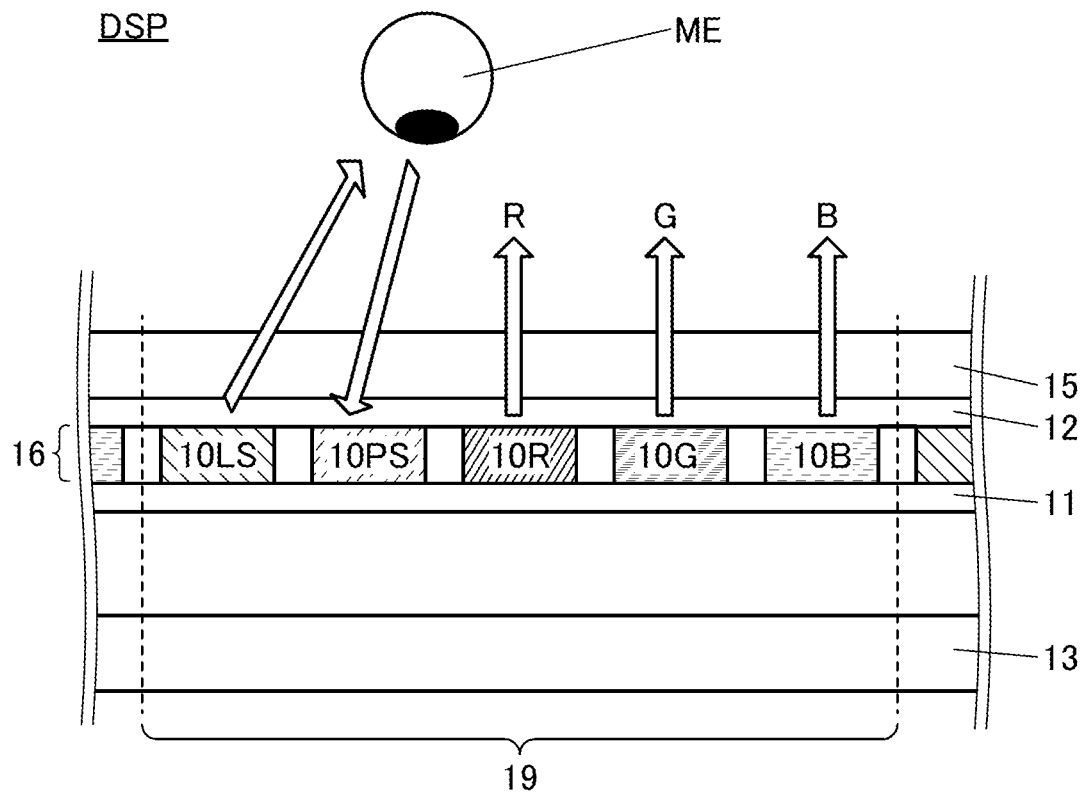

Note that one embodiment of the present invention is not limited thereto, and the light-receiving device 10PS may be provided between the substrate 11 and the substrate 12 together with the light-emitting device 10 as illustrated in FIG. 5B. Specifically, the display apparatus DSP illustrated in FIG. 5B is different from the display apparatus DSP illustrated in FIG. 5A in that the light-receiving device 10PS and the light-emitting device 10 are provided between the substrate 11 and the substrate 12. In the display apparatus DSP illustrated in FIG. 5B, since the light-receiving device 10PS is provided over the substrate 11, the substrate 11 may have a low light-transmitting property with respect to visible light or does not need to have a light-transmitting property with respect to infrared light in some cases.

Although a structure in which the light-emitting device 10LS is provided in the pixel region 19 is described above, the present invention is not limited thereto, and the light-emitting device 10LS does not necessarily include the pixel region 19. Specifically, as in the display apparatus DSP illustrated in FIG. 6A, a structure in which the light-emitting device 10LS is not provided in the layer 16 in the display apparatus DSP in FIG. 5A may be employed, where instead of light emitted by the light-emitting device 10LS, light emitted by one or more selected from the light-emitting device 10R, the light-emitting device 10G, and the light-emitting device 10B reaches the retina MM inside the user's eye ME and reflected light from the retina MM is sensed by the light-receiving device 10PS. As in the display apparatus DSP illustrated in FIG. 6B, similar to the display apparatus DSP in FIG. 6A, a structure in which the light-emitting device 10LS is not provided in the layer 16 in the display apparatus DSP in FIG. 5B may be employed, where instead of light emitted by the light-emitting device 10LS, light emitted by one or more selected from the light-emitting device 10R, the light-emitting device 10G, and the light-emitting device 10B reaches the retina MM inside the user's eye ME and reflected light from the retina MM is sensed by the light-receiving device 10PS.

Although a pixel is formed using three kinds of light-emitting elements of the light-emitting device 10R emitting red (R) light, the light-emitting device 10G emitting green (G) light, and the light-emitting device 10B emitting blue (B) light in the structure described above, the present invention is not limited to this structure. For example, a pixel may be formed using one or more selected from a light-emitting device emitting yellow (Y) light, a light-emitting device emitting orange (O) light, a light-emitting device emitting cyan (C) light, a light-emitting device emitting magenta (M) light, and a light-emitting device emitting white (W) light, or a pixel may be formed using two or more light-emitting devices including a light-emitting substance that emits light containing two or more spectral components of R, G, and B.

Figure 6A:
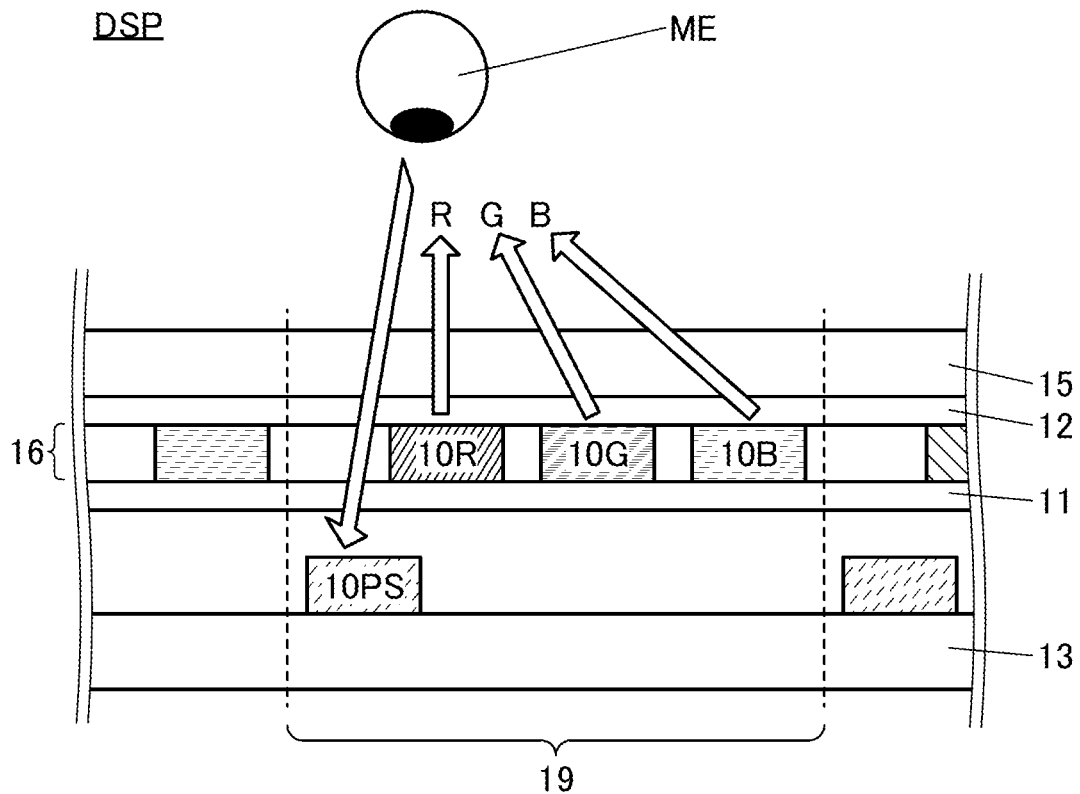
FIG. 6A and FIG. 6B are schematic cross-sectional views illustrating structure examples of a display apparatus included in an electronic device.
Figure 6B:
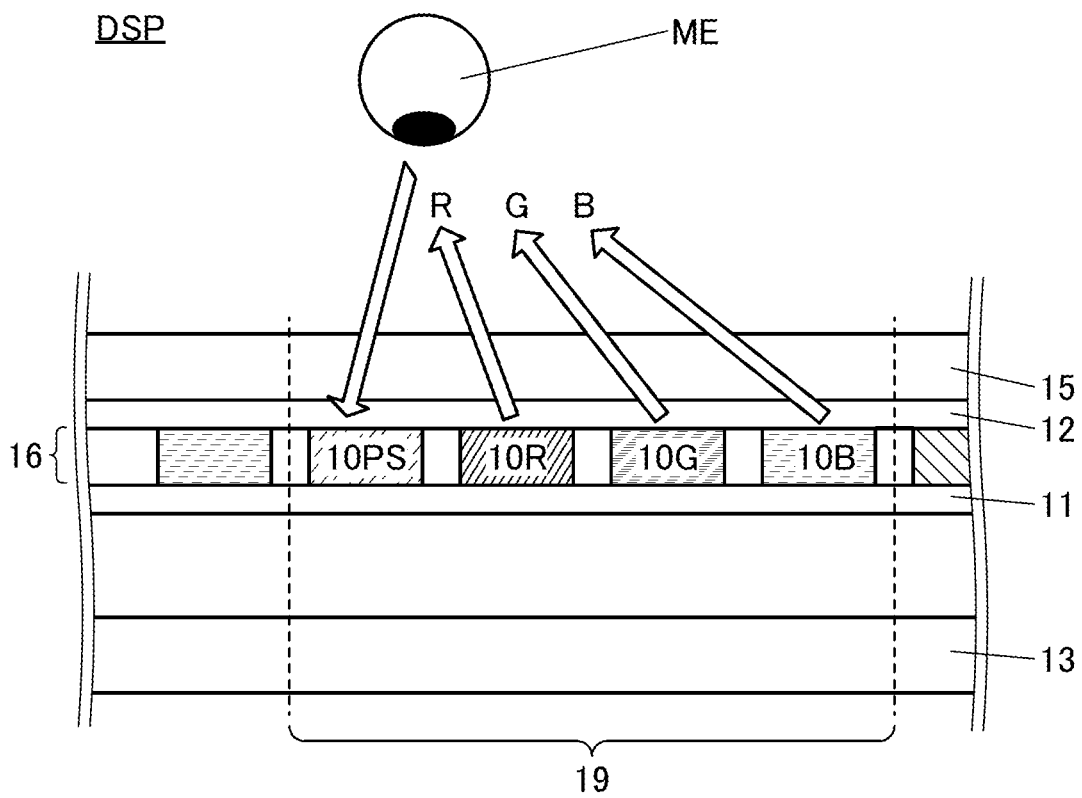

Note that in the display apparatus DSP illustrated in each of FIG. 5B and FIG. 6B, the support plate 13 is not necessarily provided in some cases.

In the display apparatus DSP illustrated in each of FIG. 5A and FIG. 6A, the support plate 13 may be replaced with a base material and the substrate 11 may be replaced with an insulating layer. Note that as the base material, any of the materials usable for the substrate 11 can be used, for example. In this case, the light-receiving device 10PS may be provided over the base material. Furthermore, an insulating layer is provided over the light-receiving device 10PS, and the light-emitting device 10 may be provided over the insulating layer. The insulating layer preferably has a light-transmitting property with respect to visible light.

Furthermore, in the display apparatus DSP illustrated in each of FIG. 5A, FIG. 5B, FIG. 6A, and FIG. 6B, the protective member 15 is not necessarily provided in some cases.

Operation Example 1 of Electronic Device

Figure 7:
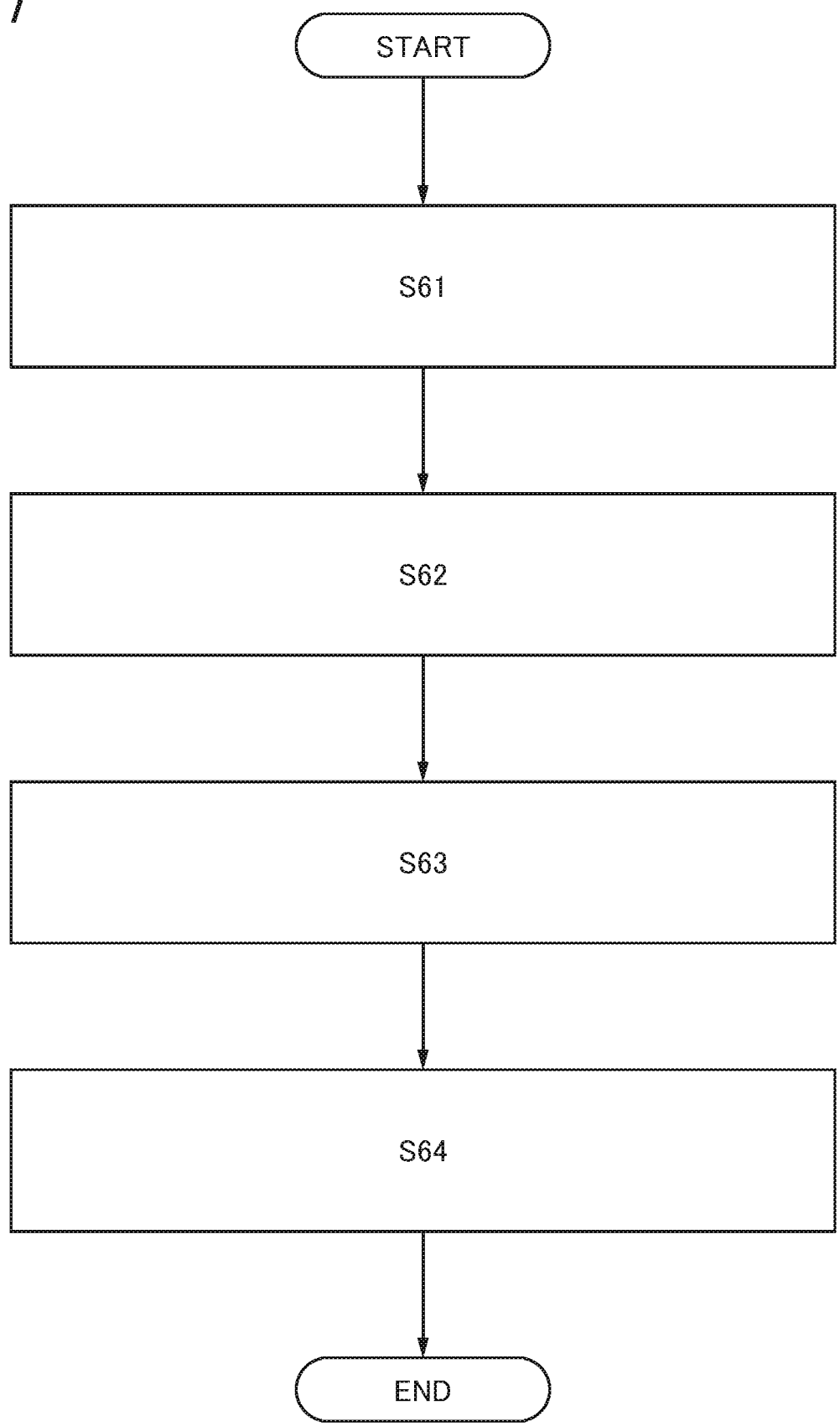
FIG. 7 is a flow chart showing an operation example of an electronic device.

An operation example of the electronic device of one embodiment of the present invention will be described below with reference to a flowchart shown in FIG. 7. The flow chart shown in FIG. 7 includes Step S61 to Step S64. In FIG. 7, "START" which shows the start of the operation and "END" which shows the end of the operation are denoted.

<Step S61>

Step S61 includes a step in which light emitted from a light source illuminates (sometimes rephrased as irradiates) the entire retina MM inside the user's eye ME. The light source can be one or more selected from the light-emitting device 10 (the light-emitting device 10R, the light-emitting device 10G, and the light-emitting device 10B) and the light-emitting device 10LS included in the display apparatus DSP in FIG. 4B, for example.

<Step S62>

Step S62 includes a step in which light reflected by the retina MM is captured by the light-receiving device 10PS. Through Step S62, the captured image TIM can be obtained.

<Step S63>

Step S63 includes a step in which the image processing portion 52 processes the captured image TIM obtained in Step S62 and calculates position data (Position data is one of a point and a range. In addition, position data can be rephrased as coordinates.) on the captured image TIM where the macula YH and the fovea CSK are positioned. Note that as a processing method of the captured image TIM, the calculation model of the artificial neural network described above can be used. By calculating position data on the captured image TIM where the macula YH and the fovea CSK are positioned, the position of the user's gaze destination on the display image can be obtained.

<Step S64>

Step S64 includes a step in which the control portion 56 updates the display image DIM on the basis of the coordinates of the user's gaze destination obtained in Step S63.

As contents of an update of the display image DIM, an increase in image definition of the portion of the coordinates of the user's gaze destination can be given as an example. In this case, image definition may be reduced in a display region where the user's gaze is not facing. When displayed image definition is high only in a portion where the user's gaze is facing and displayed image definition is low in the other display regions, the load on the GPU included in the control portion 56 can be reduced.

Step S64 may include a step in which the display image DIM is updated by the user gazing at the coordinates of the gaze destination, in addition to updating the display image DIM on the basis of the coordinates of the user's gaze destination. Here, gazing includes a case where the position of the user's gaze destination does not change more than a predetermined distance in a certain period of time.

Figure 8A:
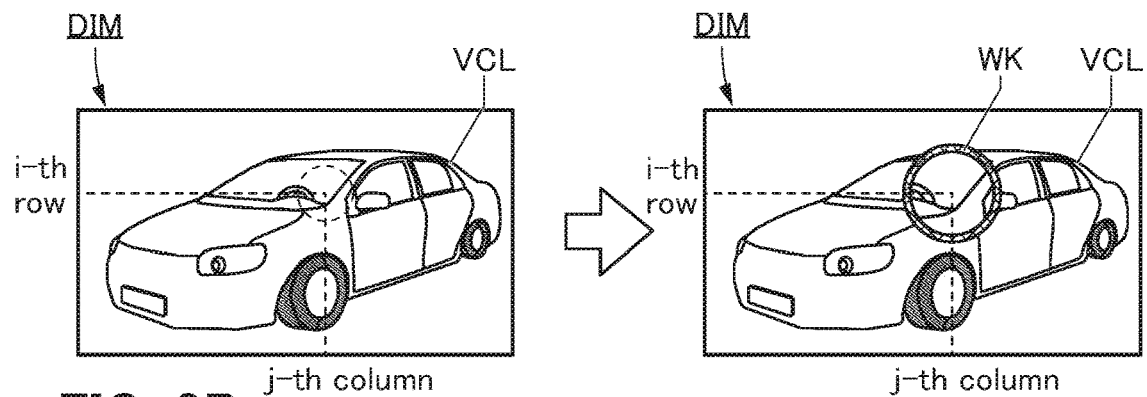
FIG. 8A to FIG. 8D are diagrams illustrating examples of an update of an image displayed by a display apparatus included in an electronic device.

As contents of an update of the display image DIM, zooming in on a peripheral region of the coordinates of the user's gaze destination can be given as an example. Specifically, as illustrated in FIG. 8A, when the user gazes at a peripheral region of the coordinates for the i-th row and the j-th column of the display image DIM, the display apparatus DSP can display a frame WK on the display image DIM and may display an enlarged image of peripheral region inside the frame WK, for example.

Figure 8B:
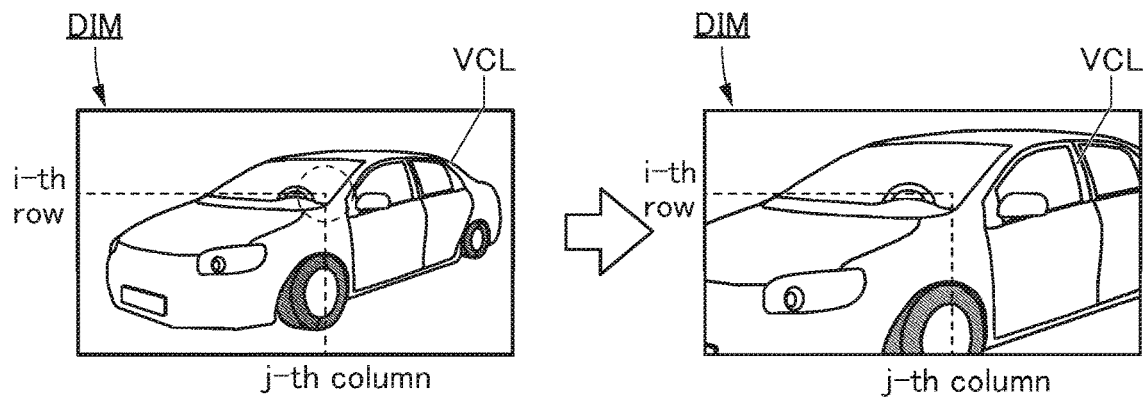

Specifically, as illustrated in FIG. 8B, when the user gazes at a peripheral region of the coordinates for the i-th row and the j-th column of the display image DIM, the display apparatus DSP may display an enlarged display image DIM on the basis of the coordinates for the i-th row and the j-th column, for example.

Figure 8C:
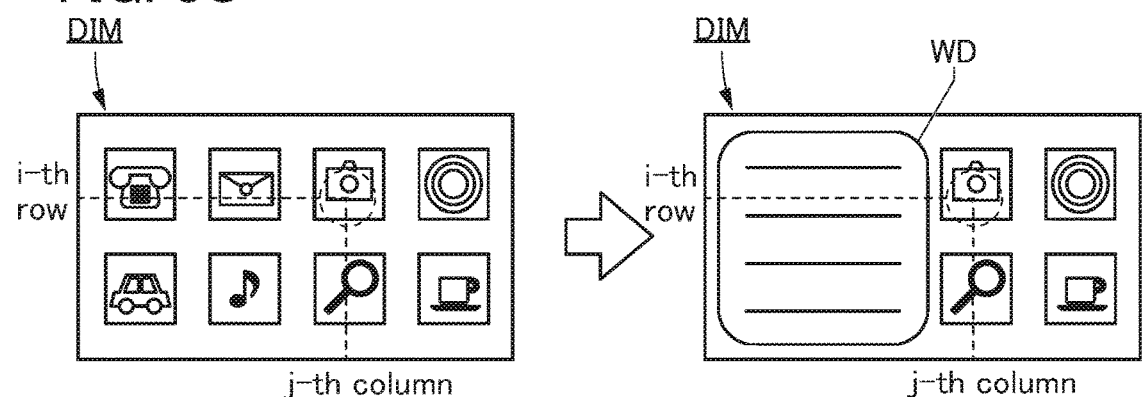

As contents of an update of the display image DIM, starting an application and displaying a screen of the application can be given as an example. For example, the electronic device has a structure in which, in response to the user gazing at a particular icon in a screen where icons are arranged, an application relating to the icon can be started. Then, when the application is started, the display apparatus DSP may display a screen of the application on the display image DIM. Specifically, as illustrated in FIG. 8C, when the user gazes at an icon positioned in the coordinates for the i-th row and the j-th column or in the vicinity thereof of the display image DIM, the display apparatus DSP may display a region WD to display an application relating to the icon, for example.

Figure 8D:
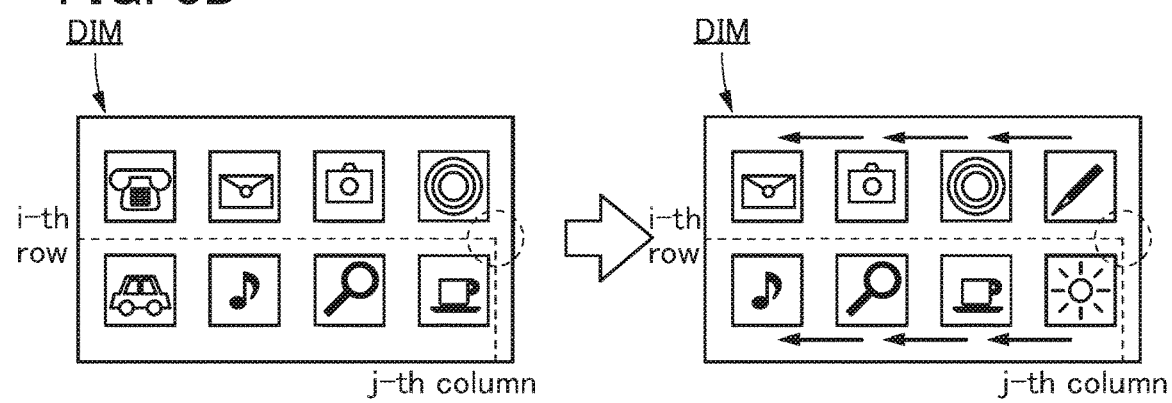

As contents of an update of the display image DIM, displaying an icon that is not displayed on the display image DIM in response to the user gazing at an end of the display image DIM in a screen where icons are arranged can be given as an example. Specifically, as illustrated in FIG. 8D, when the user gazes at the coordinates for the i-th row and the j-th column or in the vicinity thereof at the right end of the display image DIM, the display apparatus DSP can scroll an icon from the right end of the display image DIM to the left end direction of the display image DIM where the user is not gazing and may display an icon that has not been displayed, for example.

After the operation in Step S64, the operation in the flow chart in FIG. 7 ends.

As described above, through Step S61 to Step S64, the display image DIM displayed on the display apparatus DSP can be updated in accordance with the position of the user's gaze destination.

As described above, sequentially obtaining the coordinates of the user's gaze destination through Step S61 to Step S63 enables the user's gaze to be tracked (enables eye tracking). This allows determination of the user's attention, for example, in which case the user's action can be analyzed. Furthermore, the movement of the user's eye can be reproduced by an avatar (a character displayed on a display apparatus or the like that serves as an alter ego of the user).

Operation Example 2 of Electronic Device

In each of FIG. 1A and FIG. 1B, when a display image for the retina MM of the user's eye ME from the display apparatus DSP is in focus, it can be said that a captured image that has captured light reflected by the retina MM in FIG. 2A and FIG. 2B is also in focus. By contrast, in the case where a display image for the retina MM of the user's eye ME from the display apparatus DSP is out of focus, it can be said that a captured image that has captured light reflected by the retina MM is also out of focus.

As the cause of the captured image that has captured light reflected by the retina MM being out of focus, an obstacle existing on an optical path can be given as an example. When an object (an obstacle) inhibiting the progress of light exists on a path of light reflected by the retina MM (light emitted toward the retina MM of the user's eye ME from the display apparatus DSP), an image of a defocused object (an obstacle) is included in the captured image. Note that at this time, an image of the retina MM is not included in the captured image in some cases.

An eyelid at the time of blinking can be the above-described object (the obstacle), for example. Particularly in the case where the display apparatus DSP is used as a device for XR, as the object, an example other than an eyelid at the time of blinking is considered to be few. That is, when a captured image including a defocused region is obtained in Step S61 to Step S64 described above, it can be regarded as the user blinking at the moment of capturing. Thus, by capturing the user's eye sequentially, the user's eye blinking can be detected from the captured image.

Figure 9:
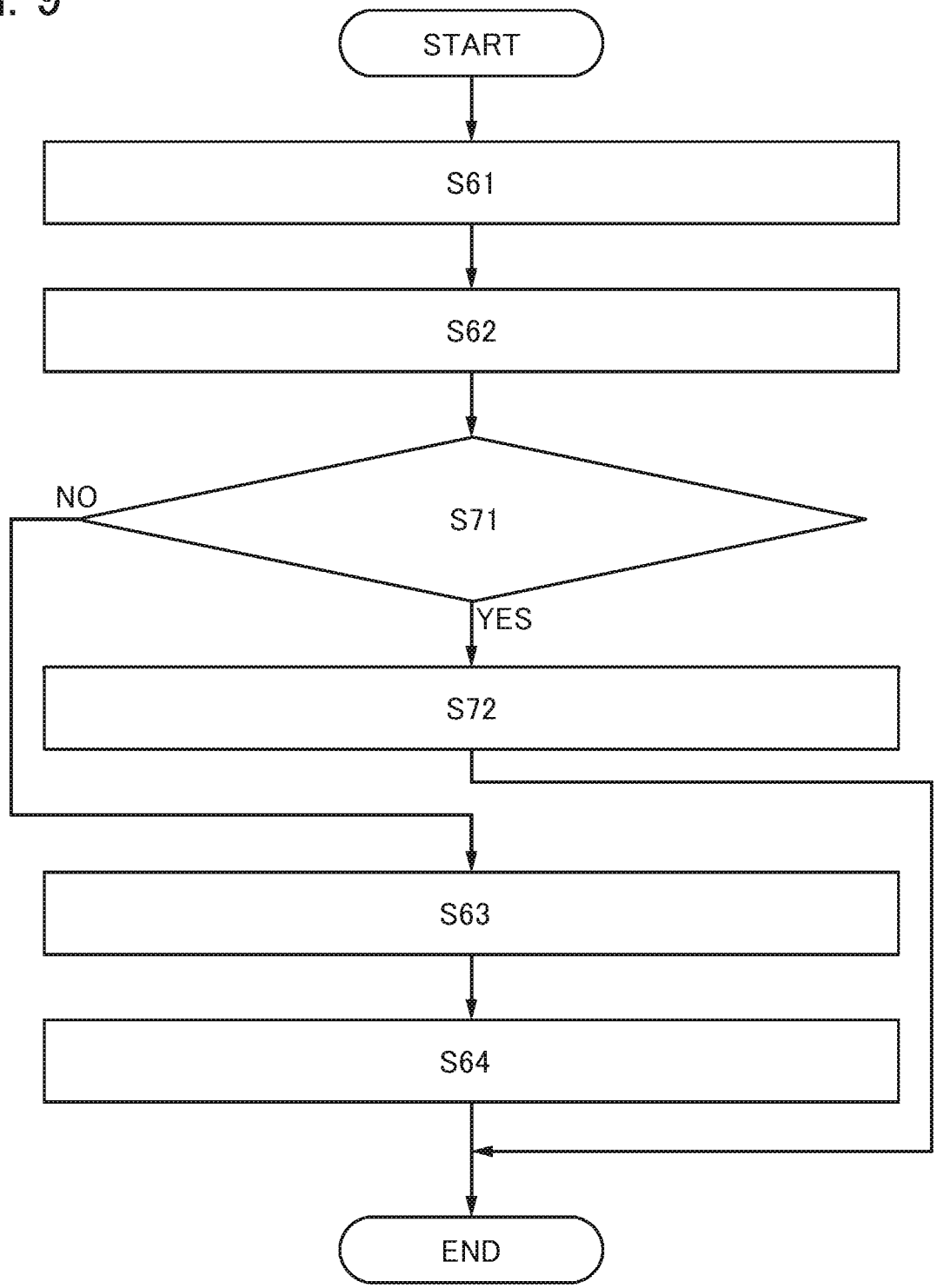
FIG. 9 is a flow chart showing an operation example of an electronic device.

An operation example of detecting the user's eye blinking using the electronic device of one embodiment of the present invention will be described below with reference to a flowchart shown in FIG. 9. The flow chart shown in FIG. 9 includes Step S61 to Step S64, Step S71, and Step S72. In FIG. 9, "START" which shows the start of the operation and "END" which shows the end of the operation are denoted.

Step S61 to Step S64 shown in FIG. 9 are similar to the operation example in Step S61 to Step S64 in the flow chart shown in FIG. 7. Thus, the description of the flow chart in FIG. 7 is referred to for Step S61 to Step S64 shown in FIG. 9.

The flow chart in FIG. 9 is different in the operation from the flow chart in FIG. 7 in that after the operation in Step S62, the operation proceeds to Step S71.

<Step S71>

Step S71 includes a step in which the image processing portion 52 determines whether the captured image TIM obtained in Step S62 includes a defocused region. Note that as a processing method for determination, the calculation model of the artificial neural network described above can be used. Another processing method for determination is a method in which a plurality of captured images TIM are obtained continuously for a certain period of time in Step S62 and the captured images TIM are compared with each other to find an image including a defocused region. By finding a defocused region with the above-described processing method, whether the user blinked is determined. The operation proceeds to Step S63 in the case where no defocused region is included in the captured image TIM (denoted as "NO" in FIG. 9), and the operation proceeds to Step S72 in the case where a defocused region is included in the captured image TIM (denoted as "YES" in FIG. 9).

Through Step S71, when the image processing portion 52 determines that a defocused region is included in the captured image TIM, the user's eye blinking is sensed.

<Step S72>

Step S72 may include a step in which the display image DIM is updated on the basis of the contents of eye blinking.

Furthermore, contents of an update of the display image DIM may change, for example, in the case where eye blinking is short and in the case where eye blinking is long. Specifically, in the case where the user's eye blinking is short, an enlarged view of the display image (see FIG. 8A and FIG. 8B) and selection of an icon (see FIG. 8C) can be the updates of the display image DIM, for example. In the case where eye blinking is long, a menu screen can be opened, for example.

After the operation in Step S72, the operation in the flow chart in FIG. 9 ends.

As described above, performing the operation in the flow chart in FIG. 9 not only updates the display image DIM displayed on the display apparatus DSP in accordance with the position of the user's gaze destination but also updates the display image DIM in accordance with the user's eye blinking.

Note that this embodiment can be combined with any of the other embodiments in this specification as appropriate.

Embodiment 2

In this embodiment, an arithmetic circuit for performing calculation of the model of the artificial neural network described in the above embodiment will be described.

<Structure Example of Arithmetic Circuit>

Figure 10:
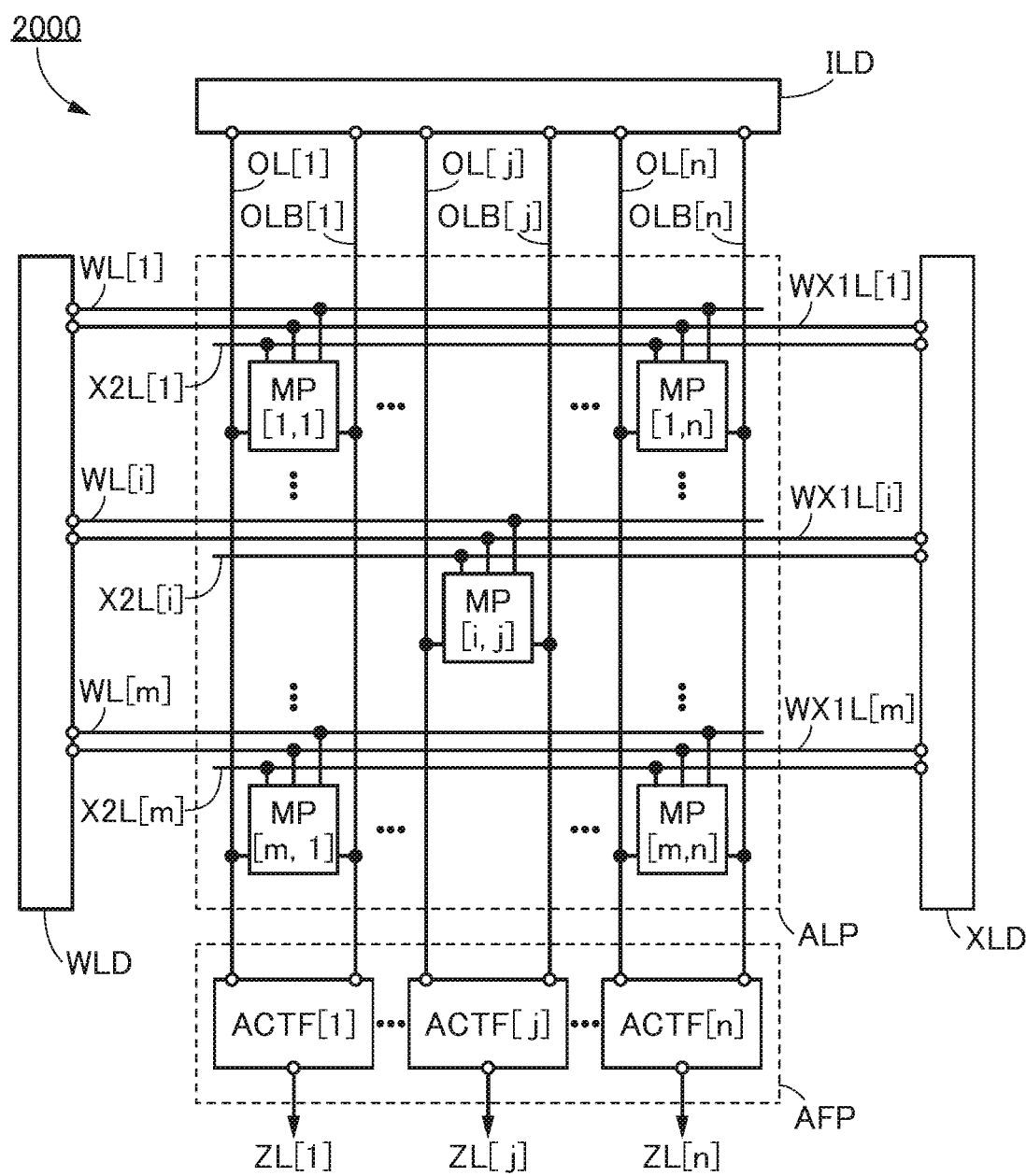
FIG. 10 is a block diagram illustrating a structure example of an arithmetic circuit.

An arithmetic circuit 2000 illustrated in FIG. 10 has a function of performing a product-sum operation of a plurality of pieces of first data and a plurality of pieces of second data and a function of performing a function operation using the result of the product-sum operation as an input value, for example. The arithmetic circuit 2000 is a semiconductor device including an array portion ALP, a circuit ILD, a circuit WLD, a circuit XLD, and a circuit AFP, for example.

Note that the whole or part of the arithmetic circuit 2000 may be used for applications other than an artificial neural network. For example, in the case where product-sum operation processing or matrix operation processing is performed in calculation for graphics (e.g., convolutional processing for performing image feature extraction) and scientific calculation, the processing may be performed using the whole or part of the arithmetic circuit 2000. In other words, the whole or part of the arithmetic circuit 2000 may be used for not only calculation for an artificial neural network but also general calculation.

The circuit ILD is electrically connected to a wiring OL[1] to a wiring OL[n] and a wiring OLB[1] to a wiring OLB[n], for example. The circuit WLD is electrically connected to a wiring WL[1] to a wiring WL[m] and a wiring WXIL[1] to a wiring WXIL[m], for example. The circuit XLD is electrically connected to the wiring WXIL[1] to the wiring WXIL[m] and a wiring X2L[1] to a wiring X2L[m], for example. The circuit AFP is electrically connected to the wiring OL[1] to the wiring OL[n] and the wiring OLB[1] to the wiring OLB[n], for example.

«Array Portion ALP»

The array portion ALP includes m×n circuits MP, for example. The circuits MP are arranged in a matrix of m rows and n columns in the array portion ALP, for example. Note that in FIG. 10, the circuit MP positioned in the i-th row and the j-th column (here, i is an integer greater than or equal to 1 and less than or equal to m, and j is an integer greater than or equal to 1 and less than or equal to n) is denoted by a circuit MP[i,j]. Note that FIG. 10 illustrates only the circuit MP[1,1], the circuit MP[m,1], the circuit MP[i,j], the circuit MP[1,n], and the circuit MP[m,n] and does not illustrate the other circuits MP.

The circuit MP[i,j] is electrically connected to the wiring WL[i], the wiring WXIL[i], the wiring X2L[i], the wiring OL[j], and the wiring OLB[i], for example.

The circuit MP[i,j] has a function of retaining the first data (in the case of an arithmetic operation of an artificial neural network, the first data can be rephrased as a weight coefficient), for example. Specifically, the circuit MP[i,j] retains information (e.g., a potential, a resistance value, or a current value) corresponding to the first data input from the circuit ILD through the wiring OL[j] and the wiring OLB[j]. The circuit MP[i,j] has a function of outputting the product of the second data (in the case of an arithmetic operation of an artificial neural network, the second data can be rephrased as an input signal, input data, or the like) and the first data. As a specific example, when the second data is input from the circuit XLD through the wiring WXIL[i] and the wiring X2L[i], the circuit MP[i,j] outputs, to the wiring OL[j] and the wiring OLB[j], information (e.g., a current value or a potential) corresponding to the product of the first data and the second data.

«Circuit ILD»

The circuit ILD has a function of inputting, to the circuit MP[1,1] to the circuit MP[m,n], information (e.g., a potential, a resistance value, or a current value) corresponding to the plurality of pieces of first data, through the wiring OL[1] to the wiring OL[n] and the wiring OLB[1] to the wiring OLB[n], for example.

«Circuit XLD»

The circuit XLD has a function of supplying, to the circuit MP[1,1] to the circuit MP[m,n], information (e.g., a potential or a current value) corresponding to the second data, through the wiring WXIL[1] to a wiring WXIL[n] and the wiring X2L[1] to the wiring X2L[m], for example.

«Circuit WLD»

The circuit WLD has a function of selecting the circuit MP to which information (e.g., a potential, a resistance value, or a current value) corresponding to the first data input from the circuit ILD is to be written, for example. In the case where information (e.g., a potential, a resistance value, or a current value) is written to the circuit MP[i,1] to the circuit MP[i,n] positioned in the i-th row of the array portion ALP, for example, the circuit WLD supplies, to the wiring WXIL[i], a signal for turning on or off writing switching elements included in the circuit MP[i,1] to the circuit MP[i,n], and supplies, to the other wirings WXIL, a potential for turning off writing switching elements included in the circuits MP in rows other than the i-th row, for example.

«Circuit AFP»

The circuit AFP includes a circuit ACTF[1] to a circuit ACTF[n], for example. The circuit ACTF[1] is electrically connected to the wiring OL[1], the wiring OLB[1], and a wiring ZL[1], for example. The circuit ACTF[j] is electrically connected to the wiring OL[j], the wiring OLB[j], and a wiring ZL[j], for example. The circuit ACTF[n] is electrically connected to the wiring OL[n], the wiring OLB[n], and a wiring ZL[n], for example.

The circuit ACTF[j] generates a signal corresponding to information (e.g., a potential or a current value) input from the wiring OL[j] and the wiring OLB[j] and outputs the signal to the wiring ZL[j], for example. For example, information input from the wiring OL[j] and information input from the wiring OLB[j] (e.g., potentials or current values) are compared and a signal corresponding to the comparison result is generated and the signal is output to the wiring ZL[j]. In the arithmetic circuit 2000, the circuit ACTF[j] outputs the product-sum result of the plurality of pieces of first data and the plurality of pieces of second data calculated in each of the circuit MP[1,j] to the circuit MP[m,j]. The circuit ACTF[1] to the circuit ACTF [n] may also have a function of performing an arithmetic operation of a function using the product-sum result as an input value, for example.

«Circuit MP»

Figure 11:
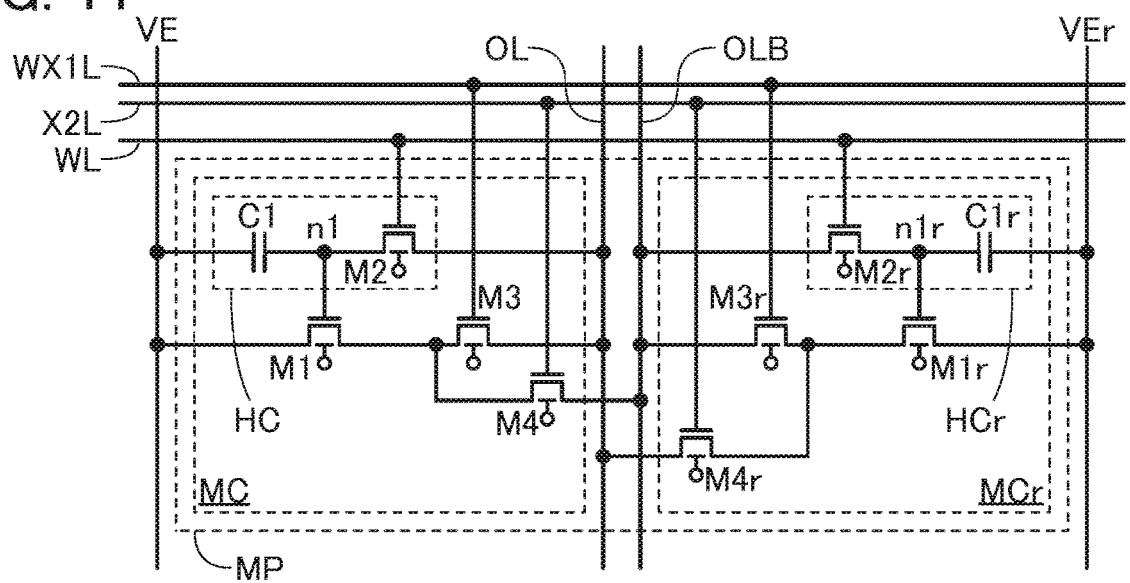
FIG. 11 is a circuit diagram illustrating a structure example of a circuit included in an arithmetic circuit.

Next, an example of a circuit structure that can be applied to the circuit MP included in the arithmetic circuit 2000 in FIG. 10 will be described. The circuit MP illustrated in FIG. 11 is an example of the structure of the circuit MP illustrated in FIG. 10, and a circuit MC included in the circuit MP in FIG. 11 includes a transistor M1 to a transistor M4 and a capacitor C1, for example. Note that, for example, a circuit HC includes a transistor M2 and the capacitor C1.

In the circuit MP in FIG. 11, a circuit MCr has substantially the same circuit structure as the circuit MC. Thus, "r" is added to the reference numerals of the circuit elements and the like included in the circuit MCr to differentiate them from the circuit elements and the like included in the circuit MC.

The transistor M1 to the transistor M4 illustrated in FIG. 11 are each an n-channel transistor having a multi-gate structure including gates over and under a channel, and the transistor M1 to the transistor M4 each include a first gate and a second gate. Note that in this specification and the like, for convenience, the first gate is referred to as a gate (referred to as a front gate in some cases) and the second gate is referred to as a back gate so that they are distinguished from each other, for example; however, the first gate and the second gate can be interchanged with each other. Therefore, in this specification and the like, the term "gate" can be replaced with the term "back gate". Similarly, the term "back gate" can be replaced with the term "gate". As a specific example, a connection structure in which "a gate is electrically connected to a first wiring and a back gate is electrically connected to a second wiring" can be replaced with a connection structure in which "a back gate is electrically connected to a first wiring and a gate is electrically connected to a second wiring". For example, as illustrated in FIG. 11, the back gate of the transistor M1 may be electrically connected to a first terminal of the capacitor C1 and a first terminal of the transistor M2.

The arithmetic circuit of the display apparatus of one embodiment of the present invention does not depend on the connection structure of a back gate of a transistor. In the transistor M1 to the transistor M4 illustrated in FIG. 11, the back gate is illustrated and the connection structure of the back gate is not illustrated; however, a target to which the back gate is electrically connected can be determined at the design stage. For example, in a transistor including a back gate, a gate and the back gate may be electrically connected to each other to increase the on-state current of the transistor. In other words, the gate and the back gate of the transistor M2 may be electrically connected to each other, for example. Alternatively, in a transistor including a back gate, a wiring electrically connected to an external circuit may be provided and a fixed potential or a variable potential may be supplied to the back gate of the transistor by the external circuit to change the threshold voltage of the transistor or to reduce the off-state current of the transistor, for example. Note that the same applies to a transistor described in other parts of the specification and a transistor illustrated in other drawings, not only to that in FIG. 11.

The arithmetic circuit of the display apparatus of one embodiment of the present invention does not depend on the structure of a transistor included in the semiconductor device. For example, the transistor M1 to the transistor M4 illustrated in FIG. 11 may be a transistor having a structure not including a back gate, that is, a single-gate structure. It is also possible that some transistors have a structure including a back gate and the other transistors have a structure not including a back gate. Note that the same applies to a transistor described in other parts of the specification and a transistor illustrated in other drawings, not only to that in the circuit diagram illustrated in FIG. 11.

In the arithmetic circuit of the display apparatus of one embodiment of the present invention, the sizes, e.g., the channel lengths and the channel widths, of the transistor M1, the transistor M2, a transistor M3, and the transistor M4 are preferably equal to the sizes of a transistor M1r, a transistor M2r, a transistor M3r, and a transistor M4r. Such a circuit structure might enable efficient layout of the arithmetic circuit 2000.

The sizes of the transistor M3 and the transistor M4 (the transistor M3r and the transistor M4r) are preferably equal to each other. With such a circuit structure, the electrical characteristics of the transistor M3 and the transistor M4 can be substantially equal to each other, and thus the arithmetic circuit 2000 can have higher arithmetic operation accuracy.

In this specification and the like, transistors with a variety of structures can be used as a transistor. Thus, there is no limitation on the type of transistors used. Examples of the transistor include a transistor including single crystal silicon and a transistor including a non-single-crystal semiconductor film typified by amorphous silicon, polycrystalline silicon, low-temperature polycrystalline silicon (also referred to as LTPS), microcrystalline (also referred to as microcrystal, nanocrystal, or semi-amorphous) silicon, or the like. Alternatively, a thin film transistor (TFT) including a thin film of any of these semiconductors can be used, for example. The use of the TFT has various advantages. For example, since the TFT can be manufactured at a lower temperature than the case of using single crystal silicon, manufacturing costs can be reduced or a larger manufacturing apparatus can be used. Since a larger manufacturing apparatus can be used, TFTs can be manufactured over a large substrate. This enables a large number of display apparatuses to be manufactured at a time, resulting in low cost manufacturing. Alternatively, a low manufacturing temperature allows the use of a low heat-resistance substrate. Thus, transistors can be manufactured over a light-transmitting substrate. Alternatively, transmission of light in a display element can be controlled using the transistor over a light-transmitting substrate. Alternatively, some of the films included in the transistor can transmit light because the transistor is thin. Accordingly, the aperture ratio can be increased.

For example, a transistor including a compound semiconductor (e.g., silicon germanium and gallium arsenide) or an oxide semiconductor (e.g., Zn—O, In—Ga—Zn—O, In—Zn—O, In—Sn—O (ITO), Sn—O, Ti—O, Al—Zn—Sn—O (AZTO), and In—Sn—Zn—O) can be used. Alternatively, a thin film transistor including a thin film of such a compound semiconductor or oxide semiconductor can be used, for example. Accordingly, manufacturing temperature can be lowered and, for example, such a transistor can be manufactured at room temperature. As a result, the transistor can be formed directly on a substrate having low heat resistance, such as a plastic substrate or a film substrate. Note that such a compound semiconductor or oxide semiconductor can be used not only for a channel portion of the transistor but also for other applications. For example, such a compound semiconductor or oxide semiconductor can be used for a wiring, a resistor, a pixel electrode, or a light-transmitting electrode. Since such components can be deposited or formed at the same time as the transistor, the cost can be reduced.

As another example, a transistor formed by an inkjet method or a printing method can be used. The transistor can be manufactured at room temperature, manufactured at a low vacuum degree, or manufactured over a large substrate. Accordingly, the transistor can be manufactured without using a mask (reticle), so that the layout of the transistor can be easily changed. Alternatively, since the transistor can be manufactured without using a resist, the material cost is reduced, and the number of steps can be reduced. Alternatively, since a film can be formed only where needed, a material is not wasted as compared with a manufacturing method by which etching is performed after the film is formed over the entire surface; thus, the cost can be reduced. As another example, a transistor containing an organic semiconductor and a carbon nanotube can be used. Thus, a transistor can be formed over a bendable substrate. A device using a transistor containing an organic semiconductor and a carbon nanotube can be highly resistant to impact.

Note that a transistor with any of a variety of other structures can also be used. For example, a MOS transistor, a junction transistor, or a bipolar transistor can be used as the transistor. By using a MOS transistor as the transistor, the size of the transistor can be reduced. Thus, a large number of transistors can be mounted. By using a bipolar transistor as the transistor, a large amount of current can flow therethrough. Thus, a circuit can operate at high speed. Note that a MOS transistor and a bipolar transistor may be formed over one substrate. Thus, one or more selected from a reduction in power consumption, a reduction in size, and high-speed operation can be achieved.

As another example, it is possible to use a transistor having a structure in which gate electrodes are placed over and under an active layer. With the structure in which the gate electrodes are placed over and under the active layer, a circuit structure is such that a plurality of transistors are connected in parallel. Thus, a channel formation region is increased, so that the amount of current can be increased. Alternatively, with the structure in which the gate electrodes are placed over and under the active layer, a depletion layer can be easily formed, so that subthreshold swing can be improved.

As another example, it is possible to use a transistor having a structure in which a gate electrode is placed over an active layer, a structure in which a gate electrode is placed under an active layer, a staggered structure, an inverted staggered structure, a structure in which a channel region is divided into a plurality of regions, a structure in which active layers are connected in parallel, a structure in which active layers are connected in series, or the like. Alternatively, for example, a transistor can have a variety of structures such as a planar type, a FIN-type, a TRI-GATE type, a top-gate type, a bottom-gate type, and a double-gate type (with gates placed over and under a channel).

As another example, it is possible to use a transistor having a structure in which a source electrode and a drain electrode overlaps with an active layer (or part thereof). Employing the structure in which the source electrode and the drain electrode overlaps with the active layer (or part thereof) can prevent unstable operation due to charge accumulation in part of the active layer.

As another example, it is possible to use a transistor having a structure in which an LDD (Lightly Doped Drain) region is provided. By providing the LDD region, it is possible to achieve a reduction in off-state current or an increase in withstand voltage (an improvement in reliability) of the transistor. Alternatively, by providing the LDD region, in the case of operation in a saturation region, the drain current does not change much even if the drain-source voltage changes, and thus the voltage-current characteristics having a flat slope can be obtained.

In this specification and the like, a transistor can be formed using a variety of substrates, for example. The type of the substrate is not limited to a certain type. Examples of the substrate include a semiconductor substrate (e.g., a single crystal substrate or a silicon substrate), an SOI (Silicon On Insulator) substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, and paper and a base material film including a fibrous material. Examples of the glass substrate include barium borosilicate glass, aluminoborosilicate glass, and soda lime glass. As examples of the flexible substrate, the attachment film, the base material film, and the like, plastics typified by polyethylene terephthalate (PET), polyethylene naphthalate (PEN), polyether sulfone (PES), and polytetrafluoroethylene (PTFE) can be given. Another example is a synthetic resin such as acrylic. Other examples include polypropylene, polyester, polyvinyl fluoride, and polyvinyl chloride. Other examples include polyamide, polyimide, aramid, an epoxy resin, an inorganic vapor deposition film, and paper. In particular, the use of a semiconductor substrate, a single crystal substrate, or an SOI substrate enables the manufacture of small-sized transistors with a small variation in characteristics, size, or shape and with high current capability. When a circuit is formed with such transistors, lower power consumption of the circuit or higher integration of the circuit can be achieved.

Alternatively, a flexible substrate may be used as the substrate, and a transistor may be directly formed over the flexible substrate. Alternatively, a separation layer may be provided between the substrate and the transistor. After part or the whole of a semiconductor device is completed over the separation layer, the separation layer can be used for separation from the substrate and transfer to another substrate. In that case, the transistor can be transferred onto a substrate having low heat resistance or a flexible substrate as well. As the separation layer, a stacked-layer structure of inorganic films of a tungsten film and a silicon oxide film, or a structure in which an organic resin film of polyimide or the like is formed over a substrate can be used, for example.

In other words, the transistor may be formed using one substrate and then transferred to another substrate; thus, the transistor may be positioned over another substrate. Examples of the substrate to which the transistor is transferred include, in addition to the above-described substrates where the transistor can be formed, a paper substrate, a cellophane substrate, an aramid film substrate, a polyimide film substrate, a stone substrate, a wood substrate, a cloth substrate (examples include a natural fiber (e.g., silk, cotton, and hemp), a synthetic fiber (e.g., nylon, polyurethane, and polyester), and a regenerated fiber (e.g., acetate, cupro, rayon, and regenerated polyester)), a leather substrate, and a rubber substrate. When such a substrate is used, forming a transistor with excellent characteristics, forming a transistor with low power consumption, manufacturing a device with high durability, providing high heat resistance, reducing weight, or reducing thickness can be achieved.

Note that all the circuits necessary to achieve a predetermined function can be formed over one substrate (e.g., a glass substrate, a plastic substrate, a single crystal substrate, and an SOI substrate). In this manner, the cost can be reduced by a reduction in the number of components or the reliability can be improved by a reduction in the number of connection points to circuit components.

Note that it is possible that not all the circuits necessary to achieve a predetermined function are formed over one substrate. That is, it is possible to form part of the circuits necessary to achieve the predetermined function over a given substrate and form the other part of the circuits necessary to achieve the predetermined function over another substrate. For example, part of the circuits necessary to achieve the predetermined function can be formed over a glass substrate, and the other part of the circuits necessary to achieve the predetermined function can be formed on a single crystal substrate (or an SOI substrate). The single crystal substrate where the other part of the circuits necessary to achieve the predetermined function is formed (also referred to as an IC chip) can be connected to the glass substrate by COG (Chip On Glass), and the IC chip can be placed over the glass substrate. Alternatively, the IC chip can be connected to the glass substrate by TAB (Tape Automated Bonding), COF (Chip On Film), or SMT (Surface Mount Technology), or using a printed circuit board, for example. When part of the circuits is formed over the same substrate as a pixel portion in this manner, the cost can be reduced by a reduction in the number of components or the reliability can be improved by a reduction in the number of connection points to circuit components. In particular, a circuit in a portion where the driving voltage is high, a circuit in a portion where the driving frequency is high, or the like consumes much power in many cases. In view of this, such a circuit is formed over a substrate (e.g., a single crystal substrate) different from a substrate where a pixel portion is formed, whereby an IC chip is formed. The use of this IC chip can prevent the increase in power consumption.

In the circuit MP in FIG. 11, a first terminal of the transistor M1 is electrically connected to a wiring VE. A second terminal of the transistor M1 is electrically connected to a first terminal of the transistor M3 and a first terminal of the transistor M4. A gate of the transistor M1 is electrically connected to the first terminal of the capacitor C1 and the first terminal of the transistor M2. A second terminal of the capacitor C1 is electrically connected to the wiring VE. A second terminal of the transistor M2 is electrically connected to the wiring OL. A gate of the transistor M2 is electrically connected to the wiring WL. A second terminal of the transistor M3 is electrically connected to the wiring OL, and a gate of the transistor M3 is electrically connected to the wiring WXIL. A second terminal of the transistor M4 is electrically connected to the wiring OLB, and a gate of the transistor M4 is electrically connected to the wiring X2L.

The connection structure of the circuit MCr different from that of the circuit MC is described. A second terminal of the transistor M3r is electrically connected to not the wiring OL but the wiring OLB, and a second terminal of the transistor M4r is electrically connected to not the wiring OLB but the wiring OL. A first terminal of the transistor M1r and a first terminal of a capacitor C1r are electrically connected to a wiring VEr.

The wiring VE and the wiring VEr function as wirings for supplying a constant voltage, for example.

Note that the first terminal of the transistor M1 may be electrically connected not to the wiring VE but to another wiring supplying a constant voltage. Similarly, the first terminal of the transistor M1r may be electrically connected to not the wiring VEr but to another wiring supplying a constant voltage.

Note that in the circuit HC illustrated in FIG. 11, an electrical connection point of the gate of the transistor M1, the first terminal of the capacitor C1, and the first terminal of the transistor M2 is a node n1.

The circuit HC has a function of holding a potential corresponding to the first data, for example. The potential is held in the circuit HC included in the circuit MC in FIG. 11 in the following manner: when the transistor M2 and the transistor M3 are turned on, the potential is input from the wiring OL and written to the capacitor C1, and then the transistor M2 is turned off. Thus, the potential of the node n1 can be held as the potential corresponding to the first data. At this time, current is input from the wiring OL and a potential having a level corresponding to the amount of current can be held in the capacitor C1. Hence, the influence of variations in current characteristics of the transistor M1 can be reduced.

As the transistor M1, a transistor with a low off-state current is preferably used to hold the potential of the node n1 for a long time. As the transistor with a low off-state current, an OS transistor can be used, for example. Alternatively, a transistor including a back gate may be used as the transistor M1, and an off-state current may be reduced by applying a low-level potential to the back gate to shift the threshold voltage to the positive side.

The structure of the circuit MP in FIG. 11 can be changed according to circumstances. For example, the transistor M1, the transistor M1r, the transistor M2, the transistor M2r, the transistor M3, the transistor M3r, the transistor M4, and the transistor M4r in the circuit MP in FIG. 11 may each be replaced with a p-channel transistor. As each of the above transistors, a p-channel transistor having an SOI structure can be used, for example.

Operation Example of Arithmetic Circuit

Next, an operation example of the arithmetic circuit 2000 in FIG. 10 including the circuit MP in FIG. 11 will be described.

In this operation example, the constant voltage supplied by each of the wiring VE and the wiring VEr is a ground potential. Thus, when a potential of each of the wiring OL and the wiring OLB is higher than a ground potential, current flowing through the wiring OL flows to the wiring VE through the circuit MC or flows to the wiring VEr through the circuit MCr. Furthermore, current flowing through the wiring OLB flows to the wiring VEr through the circuit MCr or flows to the wiring VE through the circuit MC.

《Writing of First Data to Circuit MP》

Writing of the first data to the circuits MP will be described.

First, the circuits MP to which the first data is written are selected by the circuit WLD. Specifically, in the case where the circuits MP arranged in the i-th row of the array portion ALP are selected, the circuit WLD supplies a high-level potential to each of the wiring WL[i] and the wiring WXIL[i]. Thus, the transistor M2, the transistor M3, the transistor M2r, and the transistor M3r included in each of the circuits MP that are arranged in the i-th row of the array portion ALP are turned on. Meanwhile, the circuit WLD supplies a low-level potential to each of the wiring WL and the wiring WXIL in the rows other than the i-th row of the array portion ALP, so that the transistor M2, the transistor M3, the transistor M2r, and the transistor M3r included in each of the circuits MP that are arranged in the rows other than the i-th row of the array portion ALP are turned off.

Next, the circuit ILD outputs, to the wiring OL[1] to the wiring OL[n] and the wiring OLB[1] to the wiring OLB[n], current corresponding to the first data written to the circuit MP[i,1] to the circuit MP[i,n] arranged in respective columns.

Here, the amount of current corresponding to the first data flowing through the wiring OL[j] and the wiring OLB[j] is defined as follows.

When the first data written to the circuit MP[i,j] is "1", the circuit ILD supplies current with an amount of $I_{ut}$ to the wiring OL[j] and supplies current with an amount of 0 to the wiring OLB[j]. When the first data written to the circuit MP[i,j] is "2", the circuit ILD supplies current with an amount of $2\times I_{ut}$ to the wiring OL[j] and supplies current with an amount of 0 to the wiring OLB[j]. That is, when the first data written to the circuit MP[i,j] is "a" (a is a positive real number), the circuit ILD supplies current with an amount of $a\times I_{ut}$ to the wiring OL[j] and supplies current with an amount of 0 to the wiring OLB[j].

When the first data written to the circuit MP[i,j] is "−1", the circuit ILD supplies current with an amount of 0 to the wiring OL[j] and supplies current with an amount of $I_{ut}$ to the wiring OLB[j]. When the first data written to the circuit MP[i,j] is "−2", the circuit ILD supplies current with an amount of 0 to the wiring OL[j] and supplies current with an amount of $2\times I_{ut}$ to the wiring OLB[j]. That is, when the first data written to the circuit MP[i,j] is "-a", the circuit ILD supplies current with an amount of 0 to the wiring OL[j] and supplies current with an amount of $a\times I_{ut}$ to the wiring OLB[i].

When the first data written to the circuit MP[i,j] is "0", the circuit ILD supplies current with an amount of 0 to the wiring OL[j] and supplies current with an amount of 0 to the wiring OLB[j].

Note that in this specification and the like, the description "supply current with an amount of 0" means that "no current flows through the wiring or the circuit".

As described above, when the first data is written to the circuit MP[i,j], one of the two amounts of current corresponding to the first data flows from the wiring OL to the circuit MC included in the circuit MP[i,j], and the other of the two amounts of current corresponding to the first data flows from the wiring OLB to the circuit MCr included in the circuit MP[i,j]. Here, one of the two amounts of current corresponding to the first data flowing from the wiring OL to the circuit MC included in the circuit MP[i,j] is $I_{in}[i,j]$, and the other of the two amounts of current corresponding to the first data flowing from the wiring OLB to the circuit MCr included in the circuit MP[i,j] is $I_{inB}[i,j]$.

In the circuit MP[i,j], electrical continuity is established between the gate and the second terminal of the transistor M1 in the circuit MC. Since a ground potential is supplied to the wiring VE, the potential of the node n1 becomes a potential satisfying a gate-source voltage at which the amount of current flowing between a source and a drain of the transistor M1 is $I_{in}[i,j]$. Similarly, electrical continuity is established between the gate and the second terminal of the transistor M1r in the circuit MCr. Since a ground potential is supplied to the wiring VEr, a potential of a node n1r becomes a potential satisfying a gate-source voltage at which the amount of current flowing between a source and a drain of the transistor M1r is $I_{inB}[i,j]$.

Here, a potential supplied to each of the wiring WL[i] and the wiring WXIL[i] by the circuit WLD is a low-level potential and the transistor M2, the transistor M3, the transistor M2r, and the transistor M3r included in each of the circuits MP that are arranged in the i-th row of the array portion ALP are turned off. Accordingly, in the circuit MP[i,j], the potential satisfying the gate-source voltage at which the amount of the current flowing between the source and the drain of the transistor M1 is $I_{in}[i,j]$ is retained in the node n1 by the circuit HC included in the circuit MC, and the potential satisfying the gate-source voltage at which the amount of the current flowing between the source and the drain of the transistor M1r is $I_{inB}[i,j]$ is retained in the node n1r by the circuit HCr included in the circuit MCr.

With the above operation, the first data can be written to the circuit MP[i,j].

《Input of Second Data to Array Portion ALP》

Next, input of the second data to the array portion ALP will be described.

After the first data is written to each of the circuits MP included in the array portion ALP, the circuit XLD supplies a potential set corresponding to the second data to each of the wiring WXIL and the wiring X2L.

Here, a potential set corresponding to the second data supplied to each of the wiring WX1L and the wiring X2L is defined as follows.

In the case where "1" is input as the second data to each of the circuit MP[i,1] to the circuit MP[i,n] arranged in the i-th row of the array portion ALP, the circuit XLD supplies a high-level potential to the wiring WXIL[i] and supplies a low-level potential to the wiring X2L[i]. Thus, in the circuit MP[i,j], the transistor M3 in the circuit MC is turned on and the transistor M4 in the circuit MC is turned off. Furthermore, in the circuit MP[i,j], the transistor M3r in the circuit MCr is turned on and the transistor M4r in the circuit MCr is turned off. In this case, the gate-source voltage of the transistor M1 is voltage at which the current $I_{in}[i,j]$ flows between the source and the drain of the transistor M1, and thus the current with an amount of $I_{in}[i,j]$ flows from the wiring OL to the wiring VE through the transistor M3 and the transistor M1. Similarly, the gate-source voltage of the transistor M1r is voltage at which the current $I_{inB}[i,j]$ flows between the source and the drain of the transistor M1r, and thus the current with an amount of $I_{inB}[i,j]$ flows from the wiring OLB to the wiring VEr through the transistor M3r and the transistor M1r.

In the case where "−1" is input as the second data to each of the circuit MP[i,1] to the circuit MP[in] arranged in the i-th row of the array portion ALP, the circuit XLD supplies a low-level potential to the wiring WXIL[i] and supplies a high-level potential to the wiring X2L[i]. Thus, in the circuit MP[i,j], the transistor M3 in the circuit MC is turned off and the transistor M4 in the circuit MC is turned on. Furthermore, in the circuit MP[i,j], the transistor M3r in the circuit MCr is turned off and the transistor M4r in the circuit MCr is turned on. In this case, the gate-source voltage of the transistor M1 is voltage at which the current $I_{in}[i,j]$ flows between the source and the drain of the transistor M1, and thus the current with an amount of $I_{in}[i,j]$ flows from the wiring OLB to the wiring VE through the transistor M4 and the transistor M1. Similarly, the gate-source voltage of the transistor M1r is voltage at which the current $I_{inB}[i,j]$ flows between the source and the drain of the transistor M1r, and thus the current with an amount of $I_{inB}[i,j]$ flows from the wiring OL to the wiring VEr through the transistor M4r and the transistor M1r.

In the case where "O" is input as the second data to each of the circuit MP[i,1] to the circuit MP[i,n] arranged in the i-th row of the array portion ALP, the circuit XLD supplies a low-level potential to the wiring WXIL[i] and supplies a low-level potential to the wiring X2L[i]. Thus, in the circuit MP[i,j], the transistor M3 and the transistor M4 in the circuit MC are turned off. Furthermore, in the circuit MP[i,j], the transistor M3r and the transistor M4r in the circuit MCr are turned off. In this case, electrical continuity is not established between the wiring OL and the wiring VE and between the wiring OLB and the wiring VE through the circuit MC, and thus no current flows from the wiring OL and the wiring OLB to the circuit MC. Similarly, electrical continuity is also not established between the wiring OL and the wiring VEr and between the wiring OLB and the wiring VEr through the circuit MCr, and thus no current flows from the wiring OL and the wiring OLB to the circuit MCr.

The summary of the above description is as follows: when the second data is input to the circuit MP[i,j] retaining the first data, the amount of current output from each of the wiring OL and the wiring OLB to the circuit MP[i,j] is as shown in Table 1.

TABLE 1

| First data | Current written to circuit MC | Current written to circuit MCr | Second data | Potential supplied to wiring WX1L | Potential supplied to wiring X2L | First data × Second data | Amount of current flowing from wiring OL to circuit MP | Amount of current flowing from wiring OLB to circuit MP |
|---|---|---|---|---|---|---|---|---|
| −2 | 0 | $2I_{ut}$ | −1 | Low | High | 2 | $2I_{ut}$ | 0 |
| −2 | 0 | $2I_{ut}$ | 0 | Low | Low | 0 | 0 | 0 |
| −2 | 0 | $2I_{ut}$ | 1 | High | Low | −2 | 0 | $2I_{ut}$ |
| −1 | 0 | $I_{ut}$ | −1 | Low | High | 1 | $I_{ut}$ | 0 |
| −1 | 0 | $I_{ut}$ | 0 | Low | Low | 0 | 0 | 0 |
| −1 | 0 | $I_{ut}$ | 1 | High | Low | −1 | 0 | $I_{ut}$ |
| 0 | 0 | 0 | −1 | Low | High | 0 | 0 | 0 |
| 0 | 0 | 0 | 0 | Low | Low | 0 | 0 | 0 |
| 0 | 0 | 0 | 1 | High | Low | 0 | 0 | 0 |
| 1 | $I_{ut}$ | 0 | −1 | Low | High | −1 | 0 | $I_{ut}$ |
| 1 | $I_{ut}$ | 0 | 0 | Low | Low | 0 | 0 | 0 |
| 1 | $I_{ut}$ | 0 | 1 | High | Low | 1 | $I_{ut}$ | 0 |
| 2 | $2I_{ut}$ | 0 | −1 | Low | High | −2 | 0 | $2I_{ut}$ |
| 2 | $2I_{ut}$ | 0 | 0 | Low | Low | 0 | 0 | 0 |
| 2 | $2I_{ut}$ | 0 | 1 | High | Low | 2 | $2I_{ut}$ | 0 |

That is, when the product of the first data and the second data is "2", current with an amount of $2\times I_{ut}$ flows from the wiring OL to one of the circuit MC and the circuit MCr. When the product of the first data and the second data is "1", current with an amount of $I_{ut}$ flows from the wiring OL to one of the circuit MC and the circuit MCr. When the product of the first data and the second data is "−1", current with an amount of $I_{ut}$ flows from the wiring OLB to one of the circuit MC and the circuit MCr. When the product of the first data and the second data is "−2", current with an amount of $2\times I_{ut}$ flows from the wiring OLB to one of the circuit MC and the circuit MCr. When the product of the first data and the second data is "0", no current flows from the wiring OL and the wiring OLB to the circuit MC and the circuit MCr.

Here, inputting the second data corresponding to each column to the circuit MP[1,1] to the circuit MP[m,n] arranged respectively in the first row to the m-th row of the array portion ALP is considered. In this case, a potential higher than a potential (a ground potential) supplied by the wiring VE and the wiring VEr is supplied to the wiring OL[j], whereby the amount of current flowing through the wiring OL[j] is the sum of current flowing through the circuit MP in which the product of the first data and the second data is positive among the circuit MP[1,j] to the circuit MP[m,j], for example. Similarly, a potential higher than a potential supplied from the wiring VE and the wiring VEr to the wiring OLB[j] is supplied, whereby the amount of current flowing through the wiring OLB[j], in the circuit MP[1,j] to the circuit MP[m,j], is the sum of current flowing through the circuit MP in which the product of the first data and the second data is negative, for example.

«Arithmetic Operation in Circuit AFP»

In the circuit ACTF[j] included in the circuit AFP, a potential corresponding to a difference in the amount of current flowing from the circuit ACTF[j] through each of the wiring OL[j] and the wiring OLB[j] is generated. Note that the difference in the amount of the current corresponds to the result of a product-sum operation of the plurality of pieces of first data and the plurality of pieces of second data in the circuit MP[1,j] to the circuit MP[m,j] in the j-th column of the array portion ALP. Thus, the circuit ACTF[j] can output the result of the product-sum operation as a potential to the wiring ZL[j].

In this case, the circuit ACTF[j] may perform a function operation using the result of the product-sum operation as an input value and may output the result of the function operation to the wiring ZL[j]. Particularly in the case where an arithmetic operation of a model of an artificial neural network is performed using the arithmetic circuit 2000, as a function operation, an arithmetic operation of an activation function can be performed. As the activation function, a step function, a ramp function (ReLU function), a sigmoid function, a tan h function, or a softmax function can be used, for example.

With use of the arithmetic circuit 2000, the arithmetic operation of the model of the artificial neural network can be performed. Thus, image analysis can be performed on an image captured in the electronic device of the above embodiment.

Note that this embodiment can be combined with any of the other embodiments in this specification as appropriate.

Embodiment 3

In this embodiment, a structure example of a display apparatus of one embodiment of the present invention will be described.

Figure 12:
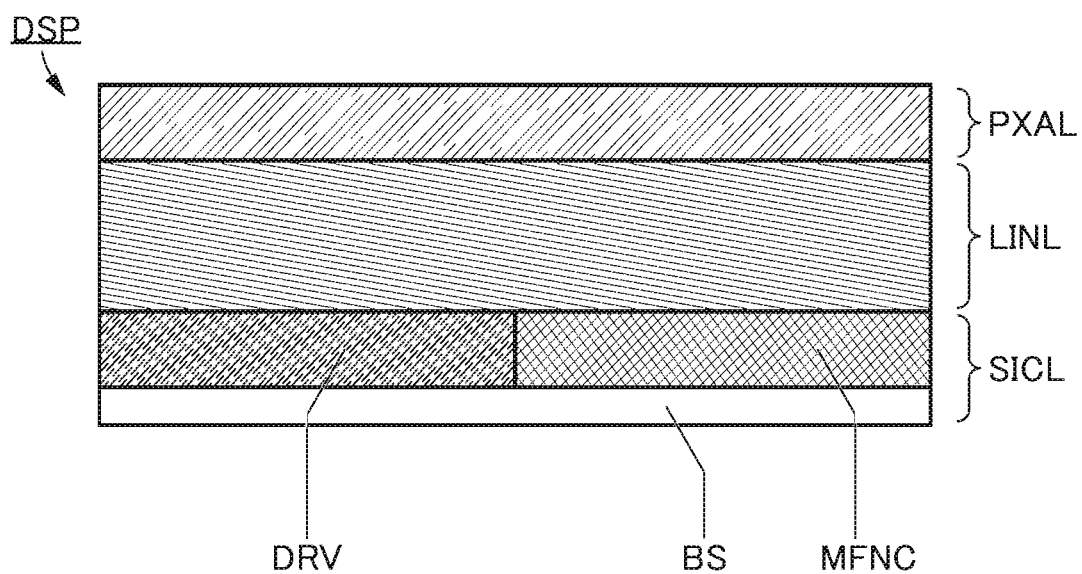
FIG. 12 is a schematic cross-sectional view illustrating a structure example of a display apparatus.

FIG. 12 is a schematic cross-sectional view of a display apparatus of one embodiment of the present invention. The display apparatus DSP includes a pixel layer PXAL, a wiring layer LINL, and a circuit layer SICL.

The wiring layer LINL is provided over the circuit layer SICL, and the pixel layer PXAL is provided over the wiring layer LINL.

The circuit layer SICL includes a substrate BS, a driver circuit region DRV, and a functional circuit region MFNC.

As the substrate BS, a semiconductor substrate containing silicon or germanium as a material (e.g., a single crystal substrate) can be used, for example. Besides the semiconductor substrate, for example, an SOI (Silicon On Insulator) substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, or paper and a base material film containing a fibrous material can be used as the substrate BS. Examples of the glass substrate include barium borosilicate glass, aluminoborosilicate glass, and soda lime glass. As examples of the flexible substrate, the attachment film, the base material film, and the like, plastics typified by polyethylene terephthalate (PET), polyethylene naphthalate (PEN), polyether sulfone (PES), and polytetrafluoroethylene (PTFE) can be given. Another example is a synthetic resin such as an acrylic resin. Other examples include polypropylene, polyester, polyvinyl fluoride, and polyvinyl chloride. Other examples include polyamide, polyimide, aramid, an epoxy resin, an inorganic vapor deposition film, and paper. Note that in the case where the fabrication process of the display apparatus DSP includes heat treatment, a highly heat-resistant material is preferably selected for the substrate BS.

In the case where the substrate BS is a semiconductor substrate containing silicon as a material, for example, transistors included in the driver circuit region DRV and the functional circuit region MFNC can be Si transistors.

For another example, in the case where the substrate BS is a glass substrate, the transistors included in the driver circuit region DRV and the functional circuit region MFNC can be OS transistors.

The driver circuit region DRV and the functional circuit region MFNC are provided over the substrate BS.

The driver circuit region DRV includes, for example, a driver circuit for driving a display pixel circuit included in the pixel layer PXAL to be described later. Note that a specific structure example of the driver circuit region DRV will be described later.

The functional circuit region MFNC includes a GPU (Graphics Processing Unit), for example. In the case where the display apparatus DSP includes a touch panel, the functional circuit region MFNC may include a sensor controller for controlling a touch sensor included in the touch panel. In the case where a light-emitting device using an organic EL material is used as a display element of the display apparatus DSP, an EL correction circuit may be included. In the case where a liquid crystal element is used as the display element of the display apparatus DSP, a gamma correction circuit may be included.

A wiring is provided in the wiring layer LINL, for example. The wiring included in the wiring layer LINL functions as, for example, a wiring that electrically connects the driver circuit included in the driver circuit region DRV provided below the wiring layer LINL and the circuit included in the pixel layer PXAL provided above the wiring layer LINL.

The pixel layer PXAL includes, for example, a plurality of display pixel circuits. The plurality of display pixel circuits may be arranged in a matrix in the pixel layer PXAL.

Each of the plurality of display pixel circuits can express one color or a plurality of colors. In particular, the plurality of colors can be, for example, three colors of red (R), green (G), and blue (B). Alternatively, for example, the plurality of display pixel circuits may express four or more colors; one or more colors selected from cyan, magenta, yellow, and white may be expressed in addition to the three colors of red (R), green (G), and blue (B). Note that in the case where display pixel circuits expressing different colors are each called a subpixel and white is expressed by a plurality of subpixels expressing different colors, the plurality of subpixels are sometimes collectively called a pixel. In this specification and the like, a subpixel is referred to as a pixel for convenience.

Figure 13:
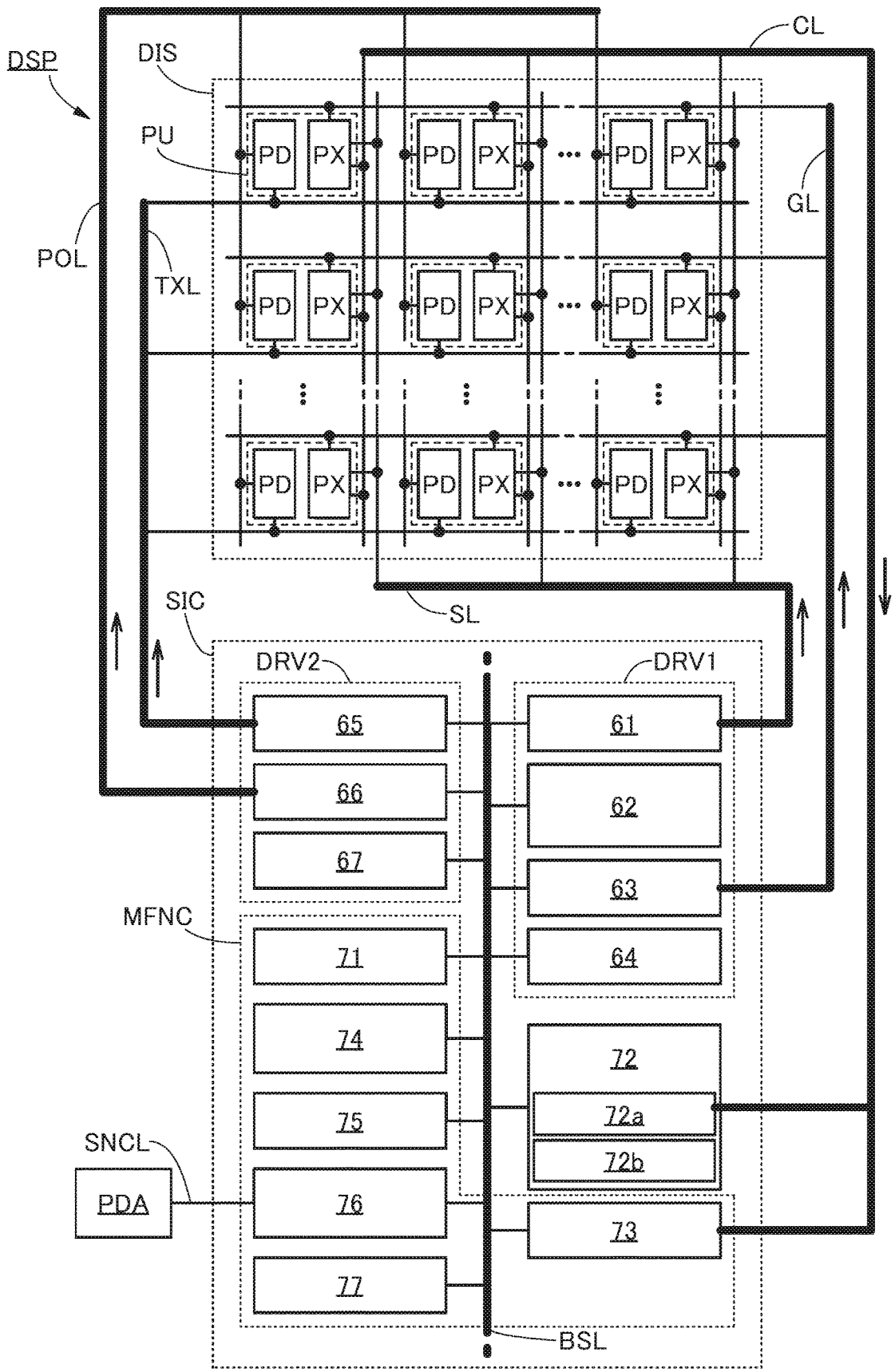
FIG. 13 is a block diagram illustrating a structure example of a display apparatus.

FIG. 13 is a block diagram illustrating a structure example of the display apparatus DSP illustrated in FIG. 12. The display apparatus DSP illustrated in FIG. 13 includes a display portion DIS and a circuit portion SIC, for example. A sensor PDA illustrated in FIG. 13 may be placed inside the display portion DIS or outside the display apparatus DSP.

Note that wirings denoted by thick solid lines in FIG. 13 are a plurality of wirings or bus wirings.

In FIG. 13, a plurality of circuits PX functioning as display pixel circuits and a plurality of circuits PD functioning as imaging pixel circuits are arranged in a matrix in the display portion DIS, for example. In particular, one circuit PX and one circuit PD are illustrated as one circuit PU in FIG. 13. Each of the circuits PX can be, for example, a pixel that includes at least one of a liquid crystal display device, a light-emitting device containing an organic EL material, and a light-emitting device including a light-emitting diode such as a micro LED. Note that in the description in this embodiment, the circuits PX in the display portion DIS each include a light-emitting device containing an organic EL material. The circuit PU can be the pixel circuit PUa or the pixel circuit PUb described in the above embodiment. A circuit applicable to the display portion DIS, the circuits PX, and the like will be described in detail in Embodiment 4.

The pixel density (also referred to as "resolution") of the display portion DIS is preferably higher than or equal to 100 ppi and lower than or equal to 10000 ppi, further preferably higher than or equal to 1000 ppi and lower than or equal to 10000 ppi. For example, the resolution may be higher than or equal to 2000 ppi and lower than or equal to 6000 ppi, or higher than or equal to 3000 ppi and lower than or equal to 5000 ppi.

Note that there is no particular limitation on the aspect ratio of the display portion DIS. For example, the display portion DIS is compatible with a variety of aspect ratios such as 1:1 (a square), 4:3, 16:9, and 16:10.

The diagonal size of the display portion DIS is at least greater than or equal to 0.1 inches and less than or equal to 100 inches and may be greater than or equal to 100 inches.

The structure of transistors included in the display portion DIS may be selected as appropriate depending on the diagonal size of the display portion DIS. For example, single crystal Si transistors can be used in the display portion DIS with a screen diagonal size greater than or equal to 0.1 inches and less than or equal to 3 inches. In addition, LTPS transistors (transistors each including an LTPS in a channel formation region) can be used in the display portion DIS with a screen diagonal size greater than or equal to 0.1 inches and less than or equal to 30 inches, preferably greater than or equal to 1 inch and less than or equal to 30 inches. In addition, LTPO (a structure in which an LTPS transistor and an OS transistor are combined) can be used in the display portion DIS with a screen diagonal size greater than or equal to 0.1 inches and less than or equal to 50 inches, preferably greater than or equal to 1 inch and less than or equal to 50 inches. In addition, OS transistors can be used in a display panel with a screen diagonal size greater than or equal to 0.1 inches and less than or equal to 200 inches, preferably greater than or equal to 50 inches and less than or equal to 100 inches.

Note that with single crystal Si transistors, a size increase is extremely difficult because of the size of a single crystal Si substrate. Furthermore, since a laser crystallization apparatus is used in the manufacturing process, LTPS transistors are unlikely to respond to a size increase (typically to a screen diagonal size greater than 30 inches). By contrast, since the manufacturing process does not necessarily require a laser crystallization apparatus or the like or can be performed at a relatively low process temperature (typically, lower than or equal to 450° C.), OS transistors are applicable to a display panel with a relatively large area (typically, a diagonal size greater than or equal to 50 inches and less than or equal to 100 inches). In addition, LTPO is applicable to a display panel with a size midway between the case of using LTPS transistors and the case of using OS transistors (typically, a diagonal size greater than or equal to 1 inch and less than or equal to 50 inches).

In FIG. 13, the circuit portion SIC includes a driver circuit region DRV1, a driver circuit region DRV2, and the functional circuit region MFNC. Note that the driver circuit region DRV1 and the driver circuit region DRV2 in FIG. 13 are included in the driver circuit region DRV illustrated in FIG. 12.

The driver circuit region DRV1 functions as a peripheral circuit for driving the plurality of circuits PX included in the display portion DIS, for example. Specifically, the driver circuit region DRV1 includes, for example, a source driver circuit 61, a digital-analog converter circuit 62, a gate driver circuit 63, and a level shifter 64.

The driver circuit region DRV2 functions as a peripheral circuit for driving the plurality of circuits PD included in the display portion DIS, for example. Specifically, the driver circuit region DRV2 includes, for example, a sensor row driver circuit 65, a sensor column driver circuit 66, and a buffer memory 67.

The functional circuit region MFNC can be provided with, for example, a memory device storing image data to be displayed on the display portion DIS, a decoder for restoring encoded image data, a GPU (Graphic Processing Unit) for processing image data, a power supply circuit, a correction circuit, a CPU, and the like. In FIG. 13, the functional circuit region MFNC includes, for example, a memory device 71, a GPU (AI accelerator) 72, an EL correction circuit 73, a timing controller 74, a CPU 75, a sensor controller 76, and a power supply circuit 77.

In the display apparatus DSP in FIG. 13, for example, a bus wiring BSL is electrically connected to each of the circuits included in the driver circuit region DRV1, each of the circuits included in the driver circuit region DRV2, and each of the circuits included in the functional circuit region MFNC.

The source driver circuit 61 has a function of transmitting image data to the circuits PX included in the display portion DIS, for example. Thus, the source driver circuit 61 is electrically connected to the circuits PX through the wiring SL.

The digital-analog converter circuit 62 has a function of, for example, converting image data, which has been digitally processed by the GPU, correction circuit, or the like described later, into analog data. The image data converted into analog data is transmitted to the display portion DIS through the source driver circuit 61. Note that the digital-analog converter circuit 62 may be included in the source driver circuit 61, and the image data may be transmitted to the source driver circuit 61, the digital-analog converter circuit 62, and the display portion DIS in this order.

The gate driver circuit 63 has a function of selecting the circuit PX to which image data is to be transmitted in the display portion DIS, for example. Thus, the gate driver circuit 63 is electrically connected to the circuits PX through the wiring GL.

The level shifter 64 has a function of converting signals to be input to at least one of the source driver circuit 61, the digital-analog converter circuit 62, and the gate driver circuit 63 into signals having appropriate levels, for example.

The sensor row driver circuit 65 has a function of selecting the circuit PD that performs image capturing in the display portion DIS, for example. Thus, the sensor row driver circuit 65 is electrically connected to the circuits PD through a wiring TXL.

The sensor column driver circuit 66 has a function of reading data captured by the circuit PD in the display portion DIS, for example. Thus, the sensor column driver circuit 66 is referred to as a reading circuit in some cases. The sensor column driver circuit 66 may include an amplifier circuit for amplifying data and an analog-digital converter circuit. Furthermore, the sensor column driver circuit 66 is electrically connected to the circuits PD through a wiring POL.

The buffer memory 67 has a function of temporarily retaining captured data from the circuit PD read by the sensor column driver circuit 66, for example.

The memory device 71 has a function of storing image data to be displayed on the display portion DIS, for example. Note that the memory device 71 can be configured to store the image data as digital data or analog data.

In the case where the memory device 71 stores image data, the memory device 71 is preferably a nonvolatile memory. In that case, a NAND memory or the like can be used as the nonvolatile memory, for example.

In the case where the memory device 71 stores temporary data generated in the GPU 72, the EL correction circuit 73, the CPU 75, or the like, the memory device 71 is preferably a volatile memory. In that case, an SRAM (Static Random Access Memory), a DRAM (Dynamic Random Access Memory), or the like can be used as the volatile memory, for example.

The memory device 71 may store captured data captured by the circuit PD of the display portion DIS.

The GPU 72 has a function of performing processing for rendering image data read from the memory device 71 on the display portion DIS, for example. Specifically, the GPU 72 is configured to perform pipeline processing in parallel and can thus perform high-speed processing of image data to be displayed on the display portion DIS. The GPU 72 can also function as a decoder for restoring an encoded image.

The functional circuit region MFNC may include a plurality of circuits that can improve the display quality of the display portion DIS. Such circuits may be, for example, correction circuits (toning or dimming) that sense color irregularity of an image displayed on the display portion DIS and correct the color irregularity to obtain an optimal image. Furthermore, in the case where a light-emitting device using an organic EL material is used in each of the pixels in the display portion DIS, the functional circuit region MFNC may be provided with an EL correction circuit.

The EL correction circuit has a function of appropriately adjusting the amount of current input to the light-emitting device containing an EL material, for example. Since the emission luminance of the light-emitting device containing an EL material is proportional to current, the luminance of light emitted from the light-emitting device might be lower than a desired luminance when the characteristics of a driving transistor electrically connected to the light-emitting device are not favorable. For example, the EL correction circuit monitors the amount of current flowing through the light-emitting device and increases the amount of current flowing through the light-emitting device when the amount of current is smaller than a desired amount of current, whereby the luminance of light emitted from the light-emitting device can be increased. By contrast, when the amount of current is larger than a desired amount of current, the amount of current flowing through the light-emitting device may be adjusted to be small.

Note that since the description in this embodiment is made on the assumption that a light-emitting device containing an organic EL material is used in each of the circuits PX in the display portion DIS, the functional circuit region MFNC includes the EL correction circuit 73, for example.

The above-described image correction may be performed using artificial intelligence. For example, current flowing through a display device included in a display pixel circuit (or voltage applied to the display device) may be monitored and acquired, an image displayed on the display portion DIS may be acquired with an image sensor or the like, the current (or voltage) and the image may be used as input data in an arithmetic operation of the artificial intelligence (e.g., an artificial neural network), and the output result may be used to determine whether the image should be corrected.

Such an arithmetic operation of artificial intelligence can be applied not only to image correction but also to upconversion processing of image data. Accordingly, upconversion of low-definition image data can be performed in accordance with the definition of the display portion DIS, which enables a high-display-quality image to be displayed on the display portion DIS. Furthermore, the arithmetic operation of artificial intelligence may perform downconversion processing instead of upconversion processing on image data.

Note that the above-described arithmetic operation of artificial intelligence can be performed by using the GPU 72 included in the functional circuit region MFNC. That is, the GPU 72 can be used to perform arithmetic operations for various kinds of correction (color irregularity correction, upconversion (downconversion), and the like).

The GPU 72 may include a correction circuit 72a for image correction and a converter 72b for performing upconversion (downconversion).

FIG. 13 illustrates a structure in which the correction circuit 72a and the EL correction circuit 73 are electrically connected to the circuits PX through a wiring CL to correct image data displayed by the circuits PX included in the display portion DIS.

Note that in this specification and the like, a GPU performing an arithmetic operation of artificial intelligence is referred to as an AI accelerator. That is, the GPU included in the functional circuit region MFNC may be replaced with an AI accelerator in the description in this specification and the like.

The timing controller 74 has a function of, for example, changing the frame rate at which an image is displayed on the display portion DIS. For example, the display apparatus DSP can be driven at a frame rate decreased by the timing controller 74 in the case where the display portion DIS displays a still image; for another example, the display apparatus DSP can be driven at a frame rate increased by the timing controller 74 in the case where the display portion DIS displays a moving image. That is, when the display apparatus DSP is provided with the timing controller 74, a frame rate can be changed depending on which of a still image and a moving image is displayed. Specifically, since the frame rate when the display portion DIS displays a still image can be decreased, the power consumption of the display apparatus DSP can be reduced.

The CPU 75 has a function of performing general-purpose processing such as execution of an operating system, control of data, and execution of various kinds of arithmetic operations and programs, for example. In the display apparatus DSP, the CPU 75 has a function of, for example, giving an instruction for a writing operation or a reading operation of image data in the memory device 71, an operation for correcting image data, or an operation for a later-described sensor. For another example, the CPU 75 may have a function of transmitting a control signal to one or more circuits selected from the circuits included in the functional circuit region MFNC, such as the memory device, the GPU, the correction circuit, the timing controller, and a high frequency circuit.

The CPU 75 may include a circuit for temporarily backing up data (hereinafter, referred to as a backup circuit). The backup circuit is preferably capable of, for example, retaining the data even after supply of power supply voltage is stopped. For example, in the case where the display portion DIS displays a still image, the CPU 75 can cease to work until an image different from the currently displayed still image is displayed. Accordingly, the data under processing by the CPU 75 is temporarily backed up in the backup circuit and then supply of power supply voltage to the CPU 75 is stopped to stop the CPU 75, whereby dynamic power consumption by the CPU 75 can be reduced. In this specification and the like, a CPU including a backup circuit is referred to as an NoffCPU (registered trademark).

The sensor controller 76 has a function of controlling the sensor PDA, for example. FIG. 13 illustrates a wiring SNCL as a wiring for electrical connection to the sensor PDA.

The sensor PDA can be, for example, a touch sensor that can be provided above or below the display portion DIS, or inside the display portion DIS.

Alternatively, the sensor PDA can be an illuminance sensor, for example. Specifically, the illuminance sensor acquiring the intensity of external light with which the display portion DIS is irradiated makes it possible to change the brightness (luminance) of an image displayed on the display portion DIS in accordance with the external light. For example, under bright external light, the luminance of an image displayed on the display portion DIS can be increased to enhance the viewability of the image. By contrast, under dark external light, the luminance of an image displayed on the display portion DIS can be lowered to reduce the power consumption.

Alternatively, the sensor PDA can be an image sensor, for example. By acquiring an image or the like with the image sensor, for example, the image can be displayed on the display portion DIS.

The power supply circuit 77 has a function of, for example, generating voltage to be supplied to the circuits included in the driver circuit region DRV, the circuits included in the functional circuit region MFNC, the display pixel circuits included in the display portion DIS, and the like. Note that the power supply circuit 77 may have a function of selecting a circuit to which voltage is to be supplied. The power supply circuit 77 can stop supply of voltage to the CPU 75, the GPU 72, and the like during a period in which the display portion DIS displays a still image so that the power consumption of the whole display apparatus DSP can be reduced, for example.

Note that this embodiment can be combined with any of the other embodiments described in this specification as appropriate.

Embodiment 4

In this embodiment, a display apparatus that can be provided in an electronic device of one embodiment of the present invention will be described. Note that the display apparatus described in this embodiment can be used in the display portion DIS described in the above embodiment.

Structure Example of Display Apparatus

Figure 14:
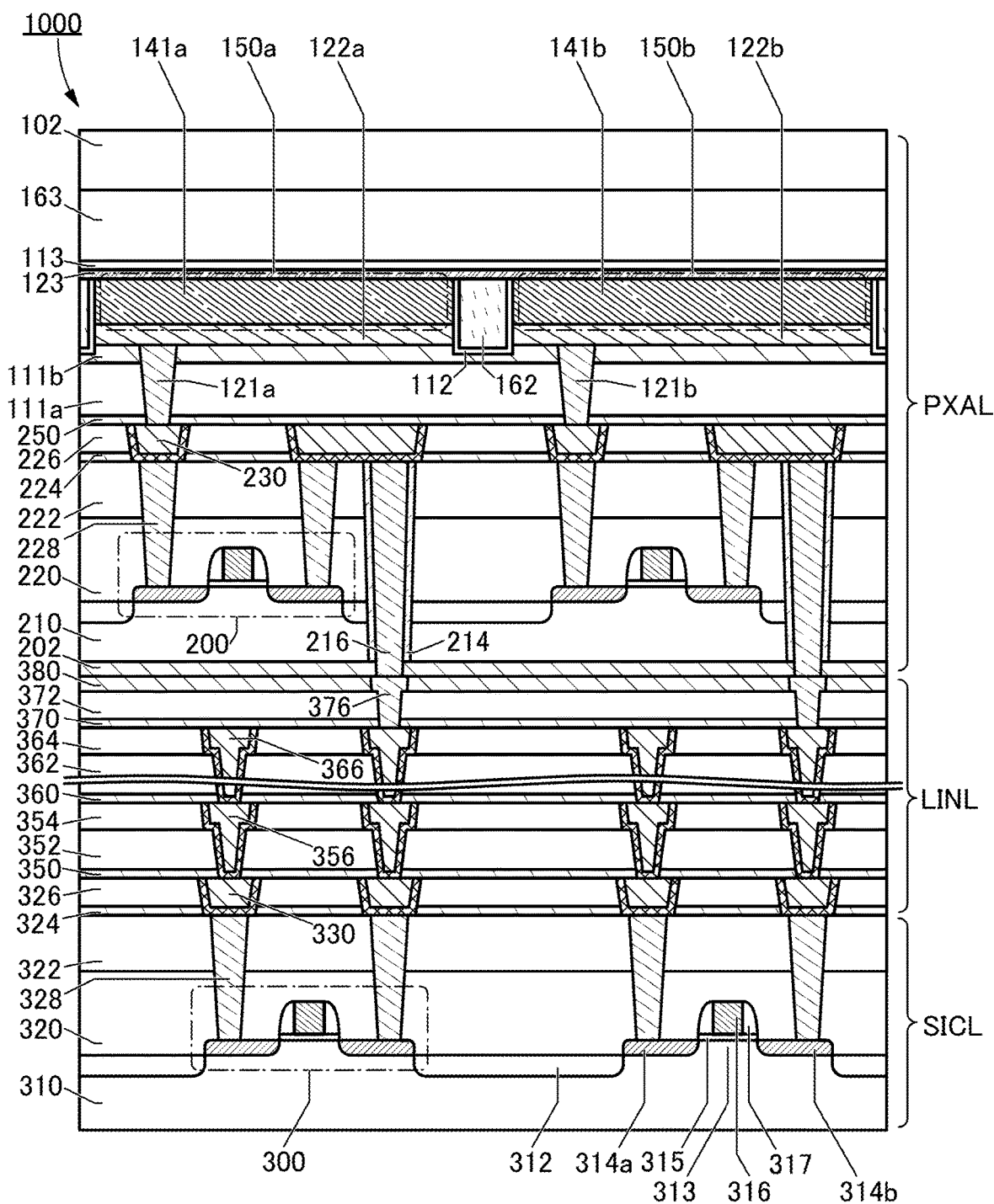
FIG. 14 is a schematic cross-sectional view illustrating a structure example of a display apparatus.

FIG. 14 is a cross-sectional view illustrating an example of a display apparatus of one embodiment of the present invention. A display apparatus 1000 illustrated in FIG. 14 has a structure in which a pixel circuit, a driver circuit, and the like are provided over a substrate 310, for example. Note that the display apparatus DSP and the like described in the above embodiment can have a structure of the display apparatus 1000 in FIG. 14. The pixel circuit described in this embodiment can be the display pixel circuit described in the above embodiment.

Specifically, for example, the circuit layer SICL, the wiring layer LINL, and the pixel layer PXAL in the display apparatus DSP can be those in the display apparatus 1000 in FIG. 14. The circuit layer SICL includes the substrate 310, for example, and a transistor 300 is formed over the substrate 310. The wiring layer LINL is provided above the transistor 300, and the wiring layer LINL includes a wiring that electrically connects the transistor 300, a transistor 200 to be described later, a light-emitting device 150a and a light-emitting device 150b to be described later, and the like. The pixel layer PXAL is provided above the wiring layer LINL, and the pixel layer PXAL includes, for example, the transistor 200 and a light-emitting device 150 (the light-emitting device 150a and the light-emitting device 150b in FIG. 14).

As the substrate 310, a semiconductor substrate containing silicon or germanium as a material (e.g., a single crystal substrate) can be used, for example. Besides the semiconductor substrate, for example, an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, or paper or a base material film containing a fibrous material can be used as the substrate 310. Examples of the glass substrate include barium borosilicate glass, aluminoborosilicate glass, and soda lime glass. As examples of the flexible substrate, the attachment film, and the base material film, plastics typified by polyethylene terephthalate (PET), polyethylene naphthalate (PEN), polyether sulfone (PES), and polytetrafluoroethylene (PTFE) can be given. Another example is a synthetic resin such as an acrylic resin. Other examples include polypropylene, polyester, polyvinyl fluoride, and polyvinyl chloride. Other examples include polyamide, polyimide, aramid, an epoxy resin, an inorganic vapor deposition film, and paper. Note that in the case where the fabrication process of the display apparatus 1000 includes heat treatment, a highly heat-resistant material is preferably selected for the substrate 310.

In the description of this embodiment, the substrate 310 is a semiconductor substrate containing silicon or the like as a material.

The transistor 300 is provided on the substrate 310 and includes an element isolation layer 312, a conductor 316, an insulator 315, an insulator 317, a semiconductor region 313 that is part of the substrate 310, and a low-resistance region 314a and a low-resistance region 314b that function as a source region and a drain region. Thus, the transistor 300 is a Si transistor. Although FIG. 14 illustrates a structure in which one of the source and the drain of the transistor 300 is electrically connected to a conductor 330, a conductor 356, and a conductor 366, which are described later, through a conductor 328 described later, the electrical connection in the display apparatus of one embodiment of the present invention is not limited thereto. The display apparatus of one embodiment of the present invention may have a structure in which, for example, a gate of the transistor 300 is electrically connected to the conductor 330, the conductor 356, and the conductor 366 through the conductor 328.

The transistor 300 can be a fin type when, for example, the top surface of the semiconductor region 313 and the side surface thereof in the channel width direction are covered with the conductor 316 with the insulator 315 functioning as a gate insulating film therebetween. The effective channel width can be increased in the fin-type transistor 300, so that the on-state characteristics of the transistor 300 can be improved. In addition, contribution of the electric field of the gate electrode can be increased, so that the off-state characteristics of the transistor 300 can be improved.

Note that the transistor 300 may be either a p-channel transistor or an n-channel transistor. Alternatively, a plurality of the transistors 300 may be provided and both the p-channel transistor and the n-channel transistor may be used.

A region of the semiconductor region 313 where a channel is formed, a region in the vicinity thereof, and the low-resistance region 314a and the low-resistance region 314b that function as the source region and the drain region preferably contain a silicon-based semiconductor, specifically, preferably contain single crystal silicon. Alternatively, each of the regions may be formed using a material containing germanium (Ge), silicon germanium (SiGe), gallium arsenide (GaAs), aluminum gallium arsenide (GaAlAs), or gallium nitride (GaN), for example. Alternatively, a structure using silicon whose effective mass is controlled by applying stress to the crystal lattice and changing the lattice spacing may be employed. Alternatively, the transistor 300 may be a HEMT (High Electron Mobility Transistor) using gallium arsenide and aluminum gallium arsenide.

For the conductor 316 functioning as a gate electrode, a semiconductor material such as silicon containing an element that imparts n-type conductivity, such as arsenic or phosphorus, or an element that imparts p-type conductivity, such as boron or aluminum, can be used. Alternatively, for the conductor 316, a conductive material such as a metal material, an alloy material, or a metal oxide material can be used, for example.

Note that since the work function of a conductor depends on the material of the conductor, the threshold voltage of the transistor can be adjusted by selecting the material of the conductor. Specifically, it is preferable to use one or both of titanium nitride and tantalum nitride as the material of the conductor. Moreover, in order to ensure both conductivity and embeddability, it is preferable to use stacked layers of metal materials of one or both of tungsten and aluminum for the conductor, and it is particularly preferable to use tungsten in terms of heat resistance.

The element isolation layer 312 is provided to separate a plurality of transistors formed on the substrate 310 from each other. The element isolation layer can be formed by, for example, a LOCOS (Local Oxidation of Silicon) method, an STI (Shallow Trench Isolation) method, or a mesa isolation method.

Note that the transistor 300 illustrated in FIG. 14 is an example and the structure is not limited thereto; an appropriate transistor is used in accordance with a circuit structure, a driving method, or the like. For example, the transistor 300 may have a planar structure instead of a fin-type structure.

Over the transistor 300 illustrated in FIG. 14, an insulator 320, an insulator 322, an insulator 324, and an insulator 326 are stacked in this order from the substrate 310 side.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

The insulator 322 may have a function of a planarization film for eliminating a level difference caused by the transistor 300 or the like covered with the insulator 320 and the insulator 322. For example, the top surface of the insulator 322 may be planarized by planarization treatment using a chemical mechanical polishing (CMP) method to improve planarity.

For the insulator 324, it is preferable to use a barrier insulating film preventing diffusion of impurities such as water and hydrogen from the substrate 310, the transistor 300, or the like to a region above the insulator 324 (e.g., the region where the transistor 200, the light-emitting device 150a, the light-emitting device 150b, and the like are provided). Accordingly, for the insulator 324, it is preferable to use an insulating material that has a function of inhibiting diffusion of impurities such as a hydrogen atom, a hydrogen molecule, and a water molecule (through which the above impurities are less likely to pass). Furthermore, depending on the situation, for the insulator 324, it is preferable to use an insulating material that has a function of inhibiting diffusion of impurities such as a nitrogen atom, a nitrogen molecule, a nitrogen oxide molecule (e.g., $N_2O$, NO, and $NO_2$), and a copper atom (through which the above impurities are less likely to pass). In addition, it is preferable that the insulator 324 have a function of inhibiting diffusion of oxygen (e.g., one or both of an oxygen atom and an oxygen molecule).

For the film having a barrier property against hydrogen, silicon nitride deposited by a CVD (Chemical Vapor Deposition) method can be used, for example.

The amount of released hydrogen can be analyzed by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$ in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for an interlayer film, the parasitic capacitance generated between wirings can be reduced.

In addition, the conductor 328 and the conductor 330 that are connected to the light-emitting devices and the like provided above the insulator 326 are embedded in the insulator 320, the insulator 322, the insulator 324, and the insulator 326. Note that the conductor 328 and the conductor 330 each function as a plug or a wiring. A plurality of conductors functioning as plugs or wirings are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases.

As a material of each of plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 14, an insulator 350, an insulator 352, and an insulator 354 are provided to be stacked in this order above the insulator 326 and the conductor 330. Furthermore, the conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

Note that like the insulator 324, for example, the insulator 350 is preferably formed using an insulator having a barrier property against hydrogen, oxygen, and water. Like the insulator 326, the insulator 352 and the insulator 354 are preferably formed using an insulator having a relatively low dielectric constant to reduce parasitic capacitance generated between wirings. An insulator 362 and an insulator 364 each have functions of an interlayer insulating film and a planarization film. Furthermore, the conductor 356 preferably includes a conductor having a barrier property against hydrogen, oxygen, and water.

For the conductor having a barrier property against hydrogen, tantalum nitride is preferably used, for example. The use of a stack including tantalum nitride and tungsten that has high conductivity can inhibit diffusion of hydrogen from the transistor 300 while the conductivity of a wiring is kept. In that case, a tantalum nitride layer having a barrier property against hydrogen is preferably in contact with the insulator 350 having a barrier property against hydrogen.

An insulator 360, the insulator 362, and the insulator 364 are stacked in this order over the insulator 354 and the conductor 356.

Like the insulator 324 or the like, the insulator 360 is preferably formed using an insulator having a barrier property against impurities such as water and hydrogen. Thus, the insulator 360 can be formed using any of the materials that can be used for the insulator 324, for example.

The insulator 362 and the insulator 364 each have functions of an interlayer insulating film and a planarization film. Like the insulator 324, the insulator 362 and the insulator 364 are preferably formed using an insulator having a barrier property against impurities such as water and hydrogen. Thus, one or both of the insulator 362 and the insulator 364 can be formed using any of the materials that can be used for the insulator 324.

An opening portion is provided in regions of the insulator 360, the insulator 362, and the insulator 364 that overlap with part of the conductor 356, and the conductor 366 is provided to fill the opening portion. The conductor 366 is also formed over the insulator 362. The conductor 366 has a function of a plug or a wiring connected to the transistor 300, for example. Note that the conductor 366 can be provided using a material similar to those for the conductor 328 and the conductor 330.

An insulator 370 and an insulator 372 are stacked in this order over the insulator 364 and the conductor 366.

Like the insulator 324 or the like, the insulator 370 is preferably formed using an insulator having a barrier property against impurities such as water and hydrogen. Thus, the insulator 370 can be formed using any of the materials that can be used for the insulator 324 or the like, for example.

The insulator 372 has functions of an interlayer insulating film and a planarization film. Like the insulator 324, the insulator 372 is preferably formed using an insulator having a barrier property against impurities such as water and hydrogen. Thus, the insulator 372 can be formed using any of the materials that can be used for the insulator 324.

An opening portion is formed in regions of the insulator 370 and the insulator 372 that overlap with part of the conductor 366, and a conductor 376 is provided to fill the opening portion. The conductor 376 is also formed over the insulator 372. After that, the conductor 376 is patterned into a form of a wiring, a terminal, or a pad by etching treatment or the like.

For example, copper, aluminum, tin, zinc, tungsten, silver, platinum, or gold can be used for the conductor 376. The material used for the conductor 376 preferably contains the same component as the material used for a later-described conductor 216 included in the pixel layer PXAL.

Then, an insulator 380 is deposited to cover the insulator 372 and the conductor 376 and is subsequently subjected to planarization treatment by, for example, a chemical mechanical polishing (CMP) method until the conductor 376 is exposed. In this manner, the conductor 376 serving as a wiring, a terminal, or a pad can be formed over the substrate 310.

Like the insulator 324, the insulator 380 is preferably formed using a film having a barrier property that prevents diffusion of impurities such as water and hydrogen, for example. That is, the insulator 380 is preferably formed using any of the materials that can be used for the insulator 324. Like the insulator 326, the insulator 380 may be formed using an insulator having a relatively low dielectric constant to reduce parasitic capacitance generated between wirings, for example. That is, the insulator 380 may be formed using any of the materials that can be used for the insulator 326.

The pixel layer PXAL is provided with, for example, a substrate 210, the transistor 200, the light-emitting device 150 (the light-emitting device 150a and the light-emitting device 150b in FIG. 14), and a substrate 102. Moreover, the pixel layer PXAL is provided with, for example, an insulator 220, an insulator 222, an insulator 226, an insulator 250, an insulator 111a, an insulator 111b, an insulator 112, an insulator 113, an insulator 162, and a resin layer 163. Furthermore, the pixel layer PXAL is provided with, for example, the conductor 216, a conductor 228, a conductor 230, a conductor 121 (a conductor 121a and a conductor 121b in FIG. 14), a conductor 122 (a conductor 122a and a conductor 122b in FIG. 14), and a conductor 123.

An insulator 202 in FIG. 14 functions as a bonding layer together with the insulator 380, for example. The insulator 202 preferably contains, for example, the same component as the material used for the insulator 380.

The substrate 210 is provided above the insulator 202. In other words, the insulator 202 is formed on the bottom surface of the substrate 210. The substrate 210 is preferably a substrate that can be used as the substrate 310, for example. Note that in the description of the display apparatus 1000 in FIG. 14, the substrate 310 is a semiconductor substrate containing silicon as a material.

On the substrate 210, the transistor 200 is formed, for example. Being formed on the substrate 210 that is a semiconductor substrate containing silicon as a material, the transistor 200 functions as a Si transistor. Note that refer to the description of the transistor 300 for the structure of the transistor 200.

Above the transistor 200, the insulator 220 and the insulator 222 are provided. Like the insulator 320, the insulator 220 has functions of an interlayer insulating film and a planarization film, for example. Like the insulator 322, the insulator 222 has functions of an interlayer insulating film and a planarization film, for example.

A plurality of opening portions are provided in the insulator 220 and the insulator 222. The plurality of opening portions are formed in regions overlapping with a source and a drain of the transistor 200, a region overlapping with the conductor 376, and the like. The conductor 228 is formed in each of the opening portions formed in the regions overlapping with the source and the drain of the transistor 200, among the plurality of opening portions. An insulator 214 is formed on the side surface of the opening portion formed in the region overlapping with the conductor 376, among the other opening portions, and the conductor 216 is formed in the remaining space of the opening portion. The conductor 216 is sometimes particularly referred to as a TSV (Through Silicon Via).

For the conductor 216 or the conductor 228, any of the materials that can be used for the conductor 328 can be used, for example. In particular, the conductor 216 is preferably formed using the same material as the conductor 376.

The insulator 214 has a function of insulating the conductor 216 from the substrate 210, for example. Note that the insulator 214 is preferably formed using, for example, any of the materials that can be used for the insulator 320 or the insulator 324.

The insulator 380 and the conductor 376 that are formed over the substrate 310 are bonded to the insulator 202 and the conductor 216 that are formed on the substrate 210 by a bonding step, for example.

Before the bonding step, for example, planarization treatment is performed to make the surfaces of the insulator 380 and the conductor 376 level with each other on the substrate 310 side. In a similar manner, planarization treatment is performed to make the surfaces of the insulator 202 and the conductor 216 level with each other on the substrate 210 side.

In the case where bonding of the insulator 380 and the insulator 202, i.e., bonding of insulating layers, is performed in the bonding step, a hydrophilic bonding method can be employed in which, after high planarity is obtained by polishing, the surfaces subjected to hydrophilicity treatment with oxygen plasma are brought into contact to be bonded to each other temporarily, and then dehydrated by heat treatment to perform final bonding, for example. The hydrophilic bonding method can also cause bonding at an atomic level; thus, mechanically excellent bonding can be obtained.

When bonding of the conductor 376 and the conductor 216, i.e., bonding of the conductors, is performed, a surface activated bonding method can be employed in which an oxide film, a layer adsorbing impurities, and the like on the surface are removed by sputtering treatment or the like and the cleaned and activated surfaces are brought into contact to be bonded to each other. Alternatively, a diffusion bonding method in which the surfaces are bonded to each other by using temperature and pressure together can be employed, for example. Both methods cause bonding at an atomic level; thus, not only electrically but also mechanically excellent bonding can be obtained.

Through the above-described bonding step, the conductor 376 on the substrate 310 side can be electrically connected to the conductor 216 on the substrate 210 side. In addition, mechanically strong connection can be established between the insulator 380 on the substrate 310 side and the insulator 202 on the substrate 210 side.

In the case where the substrate 310 and the substrate 210 are bonded to each other, the insulating layers and the metal layers coexist on their bonding surfaces; thus, the surface activated bonding method and the hydrophilic bonding method are performed in combination, for example. For example, it is possible to employ a method in which the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as gold.

Note that the substrate 310 and the substrate 210 may be bonded to each other by a bonding method other than the above-described methods. For example, as the bonding method of the substrate 310 and the substrate 210, flip-chip bonding may be employed. In the case of employing flip-chip bonding, a connection terminal such as a bump may be provided above the conductor 376 on the substrate 310 side or below the conductor 216 on the substrate 210 side. Flip-chip bonding can be performed by, for example, injecting a resin containing anisotropic conductive particles between the insulator 380 and the insulator 202 and between the conductor 376 and the conductor 216, or by using a Sn—Ag solder. Alternatively, ultrasonic wave bonding can be employed in the case where the bump and a conductor connected to the bump are each gold. To reduce thermal stress, physical stress such as an impact, or the like, the above-described flip-chip bonding may be combined with injection of an underfill agent between the insulator 380 and the insulator 202 and between the conductor 376 and the conductor 216. Furthermore, a die bonding film may be used in bonding of the substrate 310 and the substrate 210, for example. An insulator 224 and the insulator 226 are stacked in this order over the insulator 222, the insulator 214, the conductor 216, and the conductor 228.

Like the insulator 324, the insulator 224 is preferably a barrier insulating film preventing diffusion of impurities such as water and hydrogen or the like to the region above the insulator 224. Thus, the insulator 224 is preferably formed using any of the materials that can be used for the insulator 324, for example.

Like the insulator 326, the insulator 226 is preferably an interlayer film with a low permittivity. Thus, the insulator 226 is preferably formed using any of the materials that can be used for the insulator 326, for example.

In the insulator 224 and the insulator 226, the conductor 230 electrically connected to the transistor 200, the light-emitting device 150, and the like is embedded. Note that the conductor 230 and the like each function as a plug or a wiring. Note that the conductor 230 can be formed using any of the materials that can be used for the conductor 328, the conductor 330, or the like, for example.

Over the insulator 224 and the insulator 226, the insulator 250, the insulator 111a, and the insulator 111b are stacked in this order.

Like the insulator 324 and the like, the insulator 250 is preferably formed using an insulator having a barrier property against impurities such as water and hydrogen. Thus, the insulator 250 can be formed using any of the materials that can be used for the insulator 324 or the like, for example.

As each of the insulator 111a and the insulator 111b, a variety of inorganic insulating films such as an oxide insulating film, a nitride insulating film, an oxynitride insulating film, and a nitride oxide insulating film can be suitably used. As the insulator 111a, an oxide insulating film or an oxynitride insulating film, such as a silicon oxide film, a silicon oxynitride film, or an aluminum oxide film, is preferably used. As the insulator 111b, a nitride insulating film or a nitride oxide insulating film, such as a silicon nitride film or a silicon nitride oxide film, is preferably used. More specifically, it is preferable that a silicon oxide film be used as the insulator 111a and a silicon nitride film be used as the insulator 111b. The insulator 111b preferably functions as an etching protective film. Alternatively, a nitride insulating film or a nitride oxide insulating film may be used as the insulator 111a, and an oxide insulating film or an oxynitride insulating film may be used as the insulator 111b. Although this embodiment describes an example in which a depressed portion is provided in the insulator 111b, a depressed portion is not necessarily provided in the insulator 111b.

An opening portion is formed in regions of the insulator 250, the insulator 111a, and the insulator 111b that overlap with part of the conductor 230, and the conductor 121 is provided to fill the opening portion. Note that in this specification and the like, the conductor 121a and the conductor 121b illustrated in FIG. 14 are collectively referred to as the conductor 121. Note that the conductor 121 can be provided using a material similar to those for the conductor 328 and the conductor 330.

A pixel electrode described in this embodiment contains a material that reflects visible light, and a counter electrode contains a material that transmits visible light, for example.

The display apparatus 1000 has a top-emission structure. Light from the light-emitting device is emitted toward the substrate 102. For the substrate 102, a material having a high visible-light-transmitting property is preferably used.

The light-emitting device 150a and the light-emitting device 150b are provided above the conductor 121.

Here, the light-emitting device 150a and the light-emitting device 150b will be described.

The light-emitting device described in this embodiment refers to a self-luminous light-emitting device such as an organic EL element (also referred to as an OLED (Organic Light Emitting Diode)), for example. The light-emitting device electrically connected to the pixel circuit can be a self-luminous light-emitting device such as an LED (Light Emitting Diode), a micro LED, a QLED (Quantum-dot Light Emitting Diode), or a semiconductor laser.

The conductor 122a and the conductor 122b can be formed in the following manner, for example: a conductive film is formed over the insulator 111b, the conductor 121a, the conductor 121b, and the like, and the conductive film is subjected to a patterning step and an etching step.

The conductor 122a and the conductor 122b function respectively as anodes of the light-emitting device 150a and the light-emitting device 150b included in the display apparatus 1000, for example.

Indium tin oxide (sometimes referred to as ITO) or the like can be used for the conductor 122a and the conductor 122b, for example.

Each of the conductor 122a and the conductor 122b may have a stacked-layer structure of two or more layers instead of a single-layer structure. For example, a conductor having a high visible-light reflectance can be used for the first-layer conductor and a conductor having a high light-transmitting property can be used for the uppermost-layer conductor. Examples of a conductor having a high visible-light reflectance include silver, aluminum, and an alloy film of silver (Ag), palladium (Pd), and copper (Cu) (Ag—Pd—Cu (APC) film). Examples of a conductor having a high light-transmitting property include indium tin oxide described above. The conductor 122a and the conductor 122b can each be, for example, a stacked-layer film in which a pair of titanium films sandwich aluminum (a film in which Ti, Al, and Ti are stacked in this order), a stacked-layer film in which a pair of indium tin oxide films sandwich silver (a film in which ITO, Ag, and ITO are stacked in this order), or the like.

An EL layer 141a is provided over the conductor 122a. An EL layer 141b is provided over the conductor 122b.

The EL layer 141a and the EL layer 141b preferably include light-emitting layers emitting light of different colors. For example, the EL layer 141a can include a light-emitting layer emitting light of any one of red (R), green (G), and blue (B), and the EL layer 141b can include a light-emitting layer emitting light of one of the other two colors. Although not illustrated in FIG. 14, in the case where an EL layer different from the EL layer 141a and the EL layer 141b is provided, the EL layer can include a light-emitting layer emitting light of the remaining one color. Thus, the display apparatus 1000 may have a structure (an SBS structure) in which light-emitting layers of different colors are formed over a plurality of pixel electrodes (the conductor 121a, the conductor 121b, and the like).

Note that the combination of colors of light emitted from the light-emitting layers included in the EL layer 141a and the EL layer 141b is not limited to the above, and a color such as cyan, magenta, or yellow may also be used, for example. The number of colors of light emitted from the light-emitting devices 150 included in the display apparatus 1000, which is three in the above example, may be two, three, or four or more.

The EL layer 141a and the EL layer 141b may each include one or more of an electron-injection layer, an electron-transport layer, a hole-injection layer, and a hole-transport layer in addition to the layer containing a light-emitting organic compound (the light-emitting layer).

The EL layer 141a and the EL layer 141b can be formed, for example, by an evaporation method (a vacuum evaporation method or the like), a coating method (e.g., a dip coating method, a die coating method, a bar coating method, a spin coating method, or a spray coating method), or a printing method (e.g., an inkjet method, a screen printing (stencil) method, an offset printing (planography) method, a flexography (relief printing) method, a gravure printing method, or a micro-contact printing method).

In the case where a deposition method such as the coating method or the printing method is employed, for example, a high-molecular compound (e.g., an oligomer, a dendrimer, and a polymer), a middle-molecular compound (a compound between a low-molecular compound and a high-molecular compound with a molecular weight of 400 to 4000), or an inorganic compound (e.g., a quantum dot material) can be used. As the quantum dot material, a colloidal quantum dot material, an alloyed quantum dot material, a core-shell quantum dot material, or a core quantum dot material can be used.

Figure 15A:
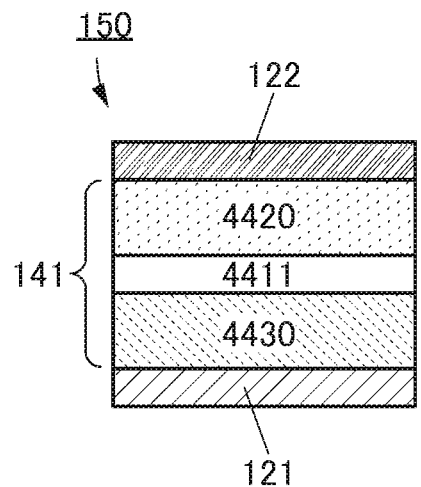
FIG. 15A to FIG. 15D are schematic views illustrating structure examples of a light-emitting device.

Like the light-emitting device 150 illustrated in FIG. 15A, for example, the light-emitting device 150a and the light-emitting device 150b in FIG. 14 can each be formed of a plurality of layers such as a light-emitting layer 4411 and a layer 4430.

A layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes (the conductor 121 and the conductor 122 described later), can function as a single light-emitting unit, and the structure in FIG. 15A is referred to as a single structure in this specification and the like.

Figure 15B:
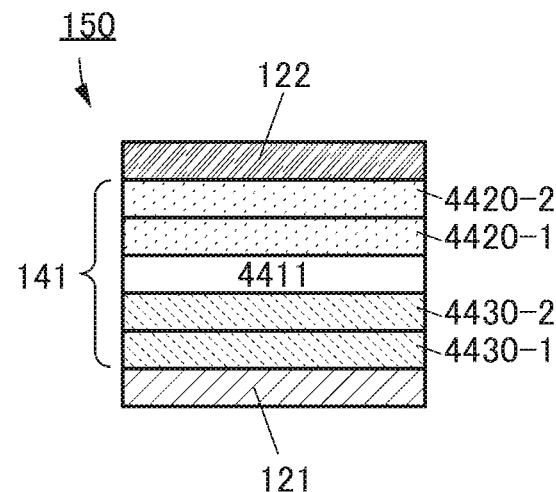

FIG. 15B is a modification example of the EL layer 141 included in the light-emitting device 150 illustrated in FIG. 15A. Specifically, the light-emitting device 150 illustrated in FIG. 15B includes a layer 4430-1 over the conductor 121, a layer 4430-2 over the layer 4430-1, the light-emitting layer 4411 over the layer 4430-2, a layer 4420-1 over the light-emitting layer 4411, a layer 4420-2 over the layer 4420-1, and the conductor 122 over the layer 4420-2. For example, when the conductor 121 functions as an anode and the conductor 122 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the conductor 121 functions as a cathode and the conductor 122 functions as an anode, the layer 4430-1 functions as an electron-injection layer, the layer 4430-2 functions as an electron-transport layer, the layer 4420-1 functions as a hole-transport layer, and the layer 4420-2 functions as a hole-injection layer. With such a layer structure, carriers can be efficiently injected to the light-emitting layer 4411, and the efficiency of the recombination of carriers in the light-emitting layer 4411 can be enhanced.

Figure 15C:
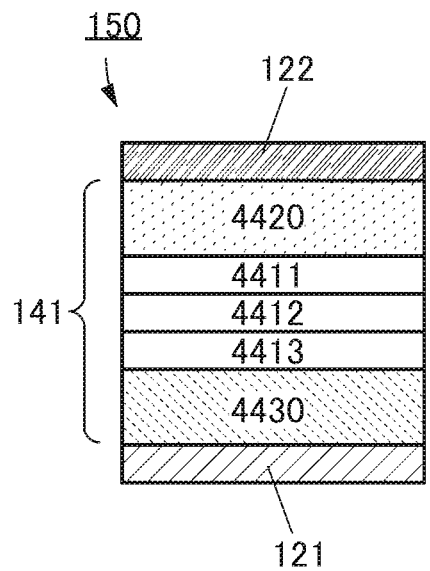

Note that the structure in which a plurality of light-emitting layers (the light-emitting layer 4411, a light-emitting layer 4412, and a light-emitting layer 4413) are provided between the layer 4420 and the layer 4430 as illustrated in FIG. 15C is also a variation of the single structure.

Figure 15D:
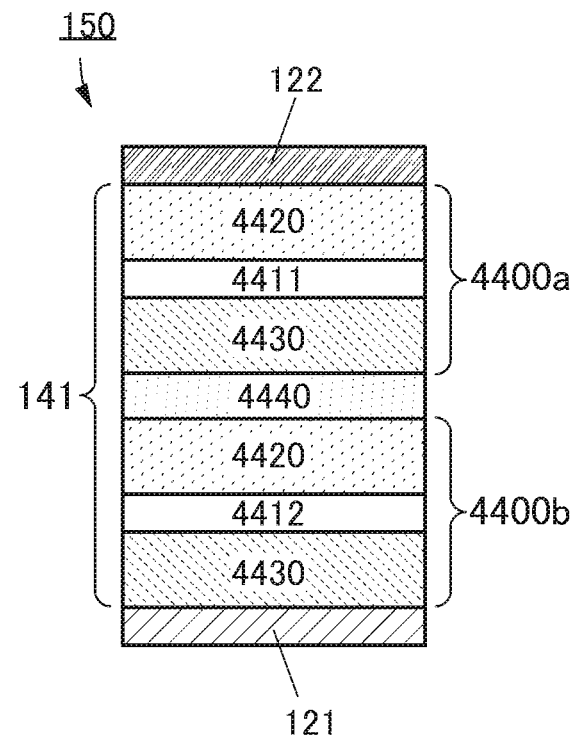

A stack including a plurality of layers such as the layer 4420, the light-emitting layer 4411, and the layer 4430 is sometimes referred to as a light-emitting unit. A plurality of light-emitting units can be connected in series with an intermediate layer (a charge-generation layer) therebetween. Specifically, a light-emitting unit 4400a and a light-emitting unit 4400b, which are a plurality of light-emitting units, can be connected in series with an intermediate layer (a charge-generation layer) 4440 therebetween as illustrated in FIG. 15D. Note that such a structure is referred to as a tandem structure in this specification. A tandem structure may be rephrased as, for example, a stack structure in this specification and the like. Note that a light-emitting device capable of high-luminance light emission can be obtained when the light-emitting device has a tandem structure. By having a tandem structure, a light-emitting device presumably has increased emission efficiency, an extended lifetime, and the like. In the case where the light-emitting device 150 of the display apparatus 1000 in FIG. 14 has a tandem structure, the EL layer 141 can include, for example, the layer 4420, the light-emitting layer 4411, and the layer 4430 that are included in the light-emitting unit 4400a, the intermediate layer 4440, and the layer 4420, the light-emitting layer 4412, and the layer 4430 that are included in the light-emitting unit 4400b.

In displaying white, the aforementioned SBS structure consumes lower power than the aforementioned single structure and tandem structure. To reduce power consumption, the SBS structure is thus suitably used. Meanwhile, the single structure and the tandem structure are suitable in terms of lower manufacturing cost or higher manufacturing yield because the manufacturing processes of the single structure and the tandem structure are simpler than that of the SBS structure.

The emission color of the light-emitting device 150 can be red, green, blue, cyan, magenta, yellow, or white depending on the material that constitutes the EL layer 141. Furthermore, the color purity can be further increased when the light-emitting device 150 has a microcavity structure.

A light-emitting device that emits white light preferably contains two or more kinds of light-emitting substances in its light-emitting layer. When white light emission is obtained using two light-emitting layers, the two light-emitting layers are selected such that emission colors of the two light-emitting layers are complementary colors. For example, by making the emission color of a first light-emitting layer and the emission color of a second light-emitting layer complementary colors, the light-emitting device can be configured to emit white light as a whole. When white light emission is obtained using three or more light-emitting layers, the light-emitting device is configured to emit white light as a whole by combining emission colors of the three or more light-emitting layers.

The light-emitting layer preferably contains two or more selected from light-emitting substances that emit light of R (red), G (green), B (blue), Y (yellow), and O (orange). Alternatively, the light-emitting layer preferably contains two or more light-emitting substances that emit light containing two or more selected from spectral components of R, G, and B.

As illustrated in FIG. 14, there is a gap between two EL layers of adjacent light-emitting devices. Specifically, in FIG. 14, a depressed portion is formed between the adjacent light-emitting devices, and the insulator 112 is provided to cover the side surfaces (the side surfaces of the conductor 121a, the conductor 122a, and the EL layer 141a and the side surfaces of the conductor 121b, the conductor 122b, and the EL layer 141b) and the bottom surface (a region in the insulator 111b) of the depressed portion. The insulator 162 is formed over the insulator 112 to fill the depressed portion. In this manner, the EL layer 141a and the EL layer 141b are preferably provided so as not to be in contact with each other. This suitably prevents unintentional light emission (also referred to as crosstalk) from being caused by current flowing through two adjacent EL layers (also referred to as lateral leakage current, side leakage current, or the like). As a result, the contrast can be increased to achieve a display apparatus with high display quality. Furthermore, with the structure with an extremely low lateral leakage current between light-emitting devices, for example, the display apparatus can perform black display with as little light leakage or the like as possible (such display is also referred to as completely black display).

As an example of the formation method of the EL layer 141a and the EL layer 141b, a method with photolithography can be given. For example, the EL layer 141a and the EL layer 141b can be formed in the following manner: an EL film to be the EL layer 141a and the EL layer 141b is deposited over the conductor 122 and then subjected to patterning by a photolithography method. Accordingly, a gap can be provided between two EL layers of adjacent light-emitting devices.

In the case where the EL film is subjected to patterning by a photolithography method, damage to the light-emitting layer (e.g., processing damage) or the like might significantly degrade the reliability. In view of this, in fabrication of the electronic device of one embodiment of the present invention, a sacrificial layer or the like is preferably formed over a layer above the light-emitting layer (e.g., a carrier-transport layer or a carrier-injection layer, and specifically an electron-transport layer or an electron-injection layer), followed by the processing of the light-emitting layer into an island shape. Such a method provides a highly reliable electronic device.

The insulator 112 can be an insulating layer containing an inorganic material. As the insulator 112, an inorganic insulating film such as an oxide insulating film, a nitride insulating film, an oxynitride insulating film, or a nitride oxide insulating film can be used, for example. The insulator 112 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. An aluminum oxide film is particularly preferable because it has high selectivity with respect to the EL layer in etching and has a function of protecting the EL layer during formation of the insulator 162 described later. In particular, when an inorganic insulating film such as an aluminum oxide film, a hafnium oxide film, or a silicon oxide film formed by an ALD (Atomic Layer Deposition) method is used as the insulator 112, the insulator 112 having a small number of pinholes and an excellent function of protecting the EL layer can be formed.

Note that in this specification and the like, oxynitride refers to a material that contains more oxygen than nitrogen in its composition, and nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

The insulator 112 can be formed by a sputtering method, a CVD method, a PLD (Pulsed Laser Deposition) method, an ALD method, or the like. The insulator 112 is preferably formed by an ALD method achieving good coverage.

The insulator 162 provided over the insulator 112 has a planarization function for the depressed portion of the insulator 112, which is formed between the adjacent light-emitting devices. In other words, the insulator 162 has an effect of improving the planarity of the formation surface of the conductor 123 to be described later. As the insulator 162, for example, an insulating layer containing an organic material can be suitably used. For example, as the insulator 162, an acrylic resin, a polyimide resin, an epoxy resin, an imide resin, a polyamide resin, a polyimide-amide resin, a silicone resin, a siloxane resin, a benzocyclobutene-based resin, a phenol resin, or precursors of these resins can be used. For the insulator 162, for example, an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin may be used. Moreover, for the insulator 162, a photosensitive resin can be used, for example. A photoresist may be used as the photosensitive resin, for example. Note that as the photosensitive resin, a positive photosensitive material or a negative photosensitive material can be used.

A difference between the top surface level of the insulator 162 and the top surface level of the EL layer 141a or the EL layer 141b is preferably less than or equal to 0.5 times, further preferably less than or equal to 0.3 times the thickness of the insulator 162, for example. The insulator 162 may be provided, for example, such that the top surface of the EL layer 141a or the EL layer 141b is at a higher level than the top surface of the insulator 162. Alternatively, the insulator 162 may be provided, for example, such that the top surface of the insulator 162 is at a higher level than the top surface of the light-emitting layer included in the EL layer 141a or the EL layer 141b.

The conductor 123 is provided over the EL layer 141a, the EL layer 141b, the insulator 112, and the insulator 162. The insulator 113 is provided over the light-emitting device 150a and the light-emitting device 150b.

The conductor 123 functions as, for example, a common electrode for the light-emitting device 150a and the light-emitting device 150b. The conductor 122 preferably contains a conductive material having a light-transmitting property so that light emitted from the light-emitting device 150 can be extracted to above the display apparatus 1000.

The conductor 123 is preferably a light-transmitting and light-reflective material having high conductivity (sometimes referred to as a semi-transmissive and semi-reflective electrode). For example, an alloy of silver and magnesium, or indium tin oxide can be used as the conductor 122.

The insulator 113 is referred to as a protective layer in some cases, and the insulator 113 provided above the light-emitting device 150a and the light-emitting device 150b can increase the reliability of the light-emitting devices. That is, the insulator 113 functions as a passivation film that protects the light-emitting device 150a and the light-emitting device 150b. Thus, the insulator 113 is preferably formed using a material that prevents entry of water and the like. Any of the materials that can be used for the insulator 111a and the insulator 111b can be used for the insulator 113, for example. Specifically, aluminum oxide, silicon nitride, or silicon nitride oxide can be used.

The resin layer 163 is provided over the insulator 113. The substrate 102 is provided over the resin layer 163.

The substrate 102 is preferably a substrate having a light-transmitting property, for example. Using a substrate having a light-transmitting property as the substrate 102 enables extraction of light emitted from the light-emitting device 150a and the light-emitting device 150b to above the substrate 102.

Note that the structure of the display apparatus of one embodiment of the present invention is not limited to that of the display apparatus 1000 illustrated in FIG. 14. The structure of the display apparatus of one embodiment of the present invention may be changed as appropriate as long as an object is achieved.

For example, the transistor 200 included in the pixel layer PXAL in the display apparatus 1000 in FIG. 14 may be a transistor including a metal oxide in a channel formation region (hereinafter, referred to as an OS transistor). The display apparatus 1000 illustrated in FIG. 16 has a structure in which the light-emitting device 150 and a transistor 500 (an OS transistor), instead of the transistor 200 in the display apparatus 1000 in FIG. 14, are provided above the circuit layer SICL and the wiring layer LINL.

Figure 16:
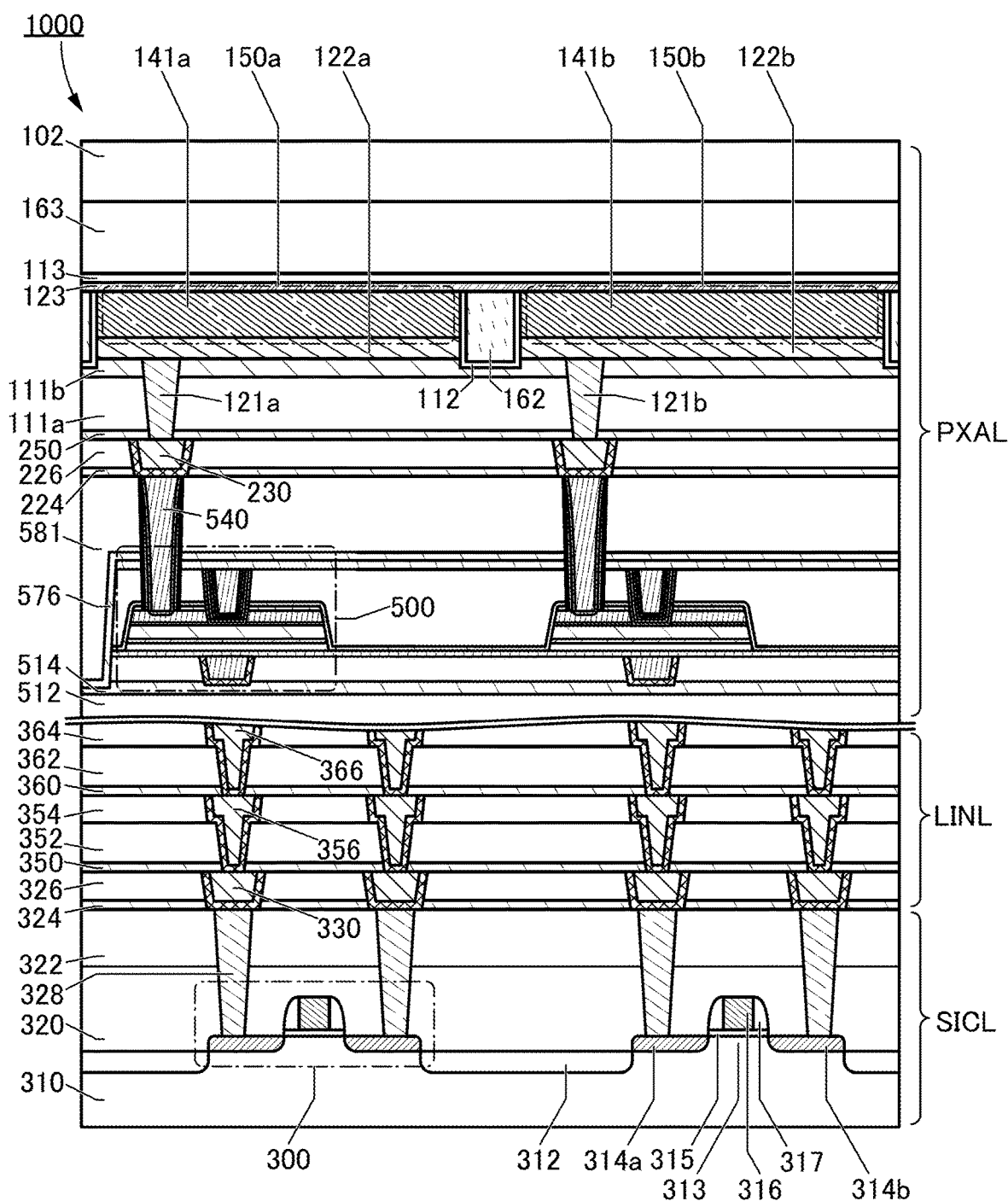
FIG. 16 is a schematic cross-sectional view illustrating a structure example of a display apparatus.

In FIG. 16, the transistor 500 is provided over an insulator 512. The insulator 512 is provided above the insulator 364 and the conductor 366, and the insulator 512 is preferably formed using a substance having a barrier property against oxygen and hydrogen. Specifically, for example, the insulator 512 is formed using silicon oxide, silicon oxynitride, silicon nitride oxide, silicon nitride, aluminum oxide, aluminum oxynitride, aluminum nitride oxide, or aluminum nitride.

For the film having a barrier property against hydrogen, silicon nitride deposited by a CVD method can be used, for example. Here, diffusion of hydrogen into a semiconductor element including an oxide semiconductor (e.g., the transistor 500) degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

A material similar to that for the insulator 320 can be used for the insulator 512, for example. When a material with a relatively low permittivity is used for these insulators, parasitic capacitance generated between wirings can be reduced. A silicon oxide film or a silicon oxynitride film can be used as the insulator 512, for example.

An insulator 514 is provided over the insulator 512, and the transistor 500 is provided over the insulator 514. An insulator 576 is formed over the insulator 512 to cover the transistor 500. An insulator 581 is formed over the insulator 576.

As the insulator 514, it is preferable to use a film having a barrier property that prevents diffusion of impurities such as hydrogen from the substrate 310, a region where the circuit element or the like below the insulator 512 is provided, or the like into a region where the transistor 500 is provided. Thus, silicon nitride deposited by a CVD method can be used for the insulator 514, for example.

The transistor 500 illustrated in FIG. 16 is an OS transistor that includes a metal oxide in a channel formation region, as described above. As the metal oxide, for example, a metal oxide such as an In-M-Zn oxide containing indium, the element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) can be used. Specifically, an oxide containing indium, gallium, and zinc (sometimes referred to as IGZO) may be used as the metal oxide, for example. Alternatively, an oxide containing indium, aluminum, and zinc (sometimes referred to as IAZO) may be used as the metal oxide, for example. Alternatively, an oxide containing indium, aluminum, gallium, and zinc (sometimes referred to as IAGZO) may be used as the metal oxide, for example. Alternatively, besides the above, an In—Ga oxide, an In—Zn oxide, or an indium oxide may be used as the metal oxide.

In particular, the metal oxide functioning as a semiconductor preferably has a band gap of 2 eV or more, preferably 2.5 eV or more. With the use of a metal oxide having such a wide band gap, the off-state current (sometimes referred to as leakage current) of the transistor can be reduced.

In particular, as a driving transistor included in a pixel circuit, a transistor having a sufficiently low off-state current even when the source-drain voltage is high, for example, an OS transistor, is preferably used. With the use of an OS transistor as the driving transistor, the amount of off-state current flowing through the light-emitting device when the driving transistor is in an off state can be reduced, whereby the luminance of light emitted from the light-emitting device through which an off-state current flows can be sufficiently reduced. Thus, in the case where a driving transistor having a high off-state current and a driving transistor having a low off-state current are compared, a pixel circuit including the driving transistor having a low off-state current can have lower emission luminance than a pixel circuit including the driving transistor having a high off-state current when black display is performed by the pixel circuits. That is, the use of an OS transistor can inhibit black blurring when black display is performed by the pixel circuit.

The off-state current value per micrometer of channel width of an OS transistor at room temperature can be lower than or equal to 1 aA ($1 \times 10^{-18}$ A), lower than or equal to 1 zA ($1 \times 10^{-21}$ A), or lower than or equal to 1 yA ($1 \times 10^{-24}$ A). Note that the off-state current value per micrometer of channel width of a Si transistor at room temperature is higher than or equal to 1 fA ($1 \times 10^{-15}$ A) and lower than or equal to 1 pA ($1 \times 10^{-12}$ A). In other words, the off-state current of an OS transistor is lower than the off-state current of a Si transistor by approximately ten orders of magnitude.

To increase the emission luminance of the light-emitting device included in the pixel circuit, the amount of current fed through the light-emitting device needs to be increased. For this, it is necessary to increase the source-drain voltage of a driving transistor included in the pixel circuit. Since an OS transistor has a higher withstand voltage between a source and a drain than a Si transistor, a high voltage can be applied between a source and a drain of an OS transistor. Accordingly, when an OS transistor is used as the driving transistor included in the pixel circuit, a high voltage can be applied between a source and a drain of the OS transistor, so that the amount of current flowing through the light-emitting device can be increased and the emission luminance of the light-emitting device can be increased.

When transistors operate in a saturation region, a change in source-drain current relative to a change in gate-source voltage can be smaller in an OS transistor than in a Si transistor. Accordingly, when an OS transistor is used as the driving transistor included in the pixel circuit, the amount of current flowing between the source and the drain can be set minutely by a change in gate-source voltage; hence, the amount of current flowing through the light-emitting device can be controlled minutely. Therefore, the emission luminance of the light-emitting device can be controlled minutely (the number of gray levels in the pixel circuit can be increased).

Regarding saturation characteristics of current flowing when transistors operate in a saturation region, an OS transistor can feed constant current (saturation current) more stably than a Si transistor even when the source-drain voltage gradually increases. Thus, by using an OS transistor as the driving transistor, a stable constant current can be fed through a light-emitting device that contains an organic EL material even when the current-voltage characteristics of the light-emitting device vary, for example. In other words, when an OS transistor operates in the saturation region, the source-drain current hardly changes with an increase in the source-drain voltage; hence, the emission luminance of the light-emitting device can be stable.

As described above, with the use of an OS transistor as the driving transistor included in the pixel circuit, it is possible to achieve "inhibition of black blurring", "increase in emission luminance", "increase in gray levels", "inhibition of variation in light-emitting devices", and the like. Therefore, a display apparatus including the pixel circuit can display a clear and smooth image; as a result, any one or more of the image clearness (image sharpness) and a high contrast ratio can be observed. Note that image clearness (image sharpness) sometimes refers to one or both of the state where motion blur is inhibited and the state where black blurring is inhibited. When the off-state current that can flow through the driving transistor included in the pixel circuit is extremely low, black display performed by the display apparatus can be display with as little light leakage or the like as possible (completely black display).

At least one of the insulator 576 and the insulator 581 preferably functions as a barrier insulating film that inhibits diffusion of impurities such as water or hydrogen from above the transistor 500 into the transistor 500. Thus, for at least one of the insulator 576 and the insulator 581, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, and $NO_2$), and copper atoms (an insulating material through which the impurities are less likely to pass). Alternatively, it is preferable to use an insulating material having a function of inhibiting diffusion of oxygen (e.g., one or both of oxygen atoms and oxygen molecules) (an insulating material through which the oxygen is less likely to pass).

One or both of the insulator 576 and the insulator 581 are preferably an insulator having a function of inhibiting diffusion of oxygen and impurities such as water and hydrogen; for one or both of the insulator 576 and the insulator 581, for example, aluminum oxide, magnesium oxide, hafnium oxide, gallium oxide, indium-gallium-zinc oxide, silicon nitride, or silicon nitride oxide can be used.

An opening portion for forming a plug or a wiring, is provided in the insulator 581, the insulator 576, and one of the source and drain electrodes of the transistor 500. A conductor 540 functioning as a plug or a wiring is formed in the opening portion.

The insulator 581 is preferably an insulator functioning as one or both of an interlayer film and a planarization film, for example.

The insulator 224 and the insulator 226 are formed above the insulator 581 and the conductor 540. Note that for the description of the insulator 224 and an insulator, a conductor, a circuit element, and the like that are positioned above the insulator 224, refer to the description of the display apparatus 1000 in FIG. 14.

Note that FIG. 14 illustrates a display apparatus formed by bonding the semiconductor substrate provided with the light-emitting device 150, the pixel circuit, and the like and the semiconductor substrate provided with a driver circuit and the like; FIG. 16 illustrates a display apparatus in which the light-emitting device 150, the pixel circuit, and the like are formed over a semiconductor substrate provided with a driver circuit; however, the display apparatus for the electronic device of one embodiment of the present invention is not limited to the those in FIG. 14 and FIG. 16. The display apparatus for the electronic device of one embodiment of the present invention may have a structure in which transistors are formed in only one layer, not a layer structure in which transistors are stacked in two or more layers.

Figure 17A:
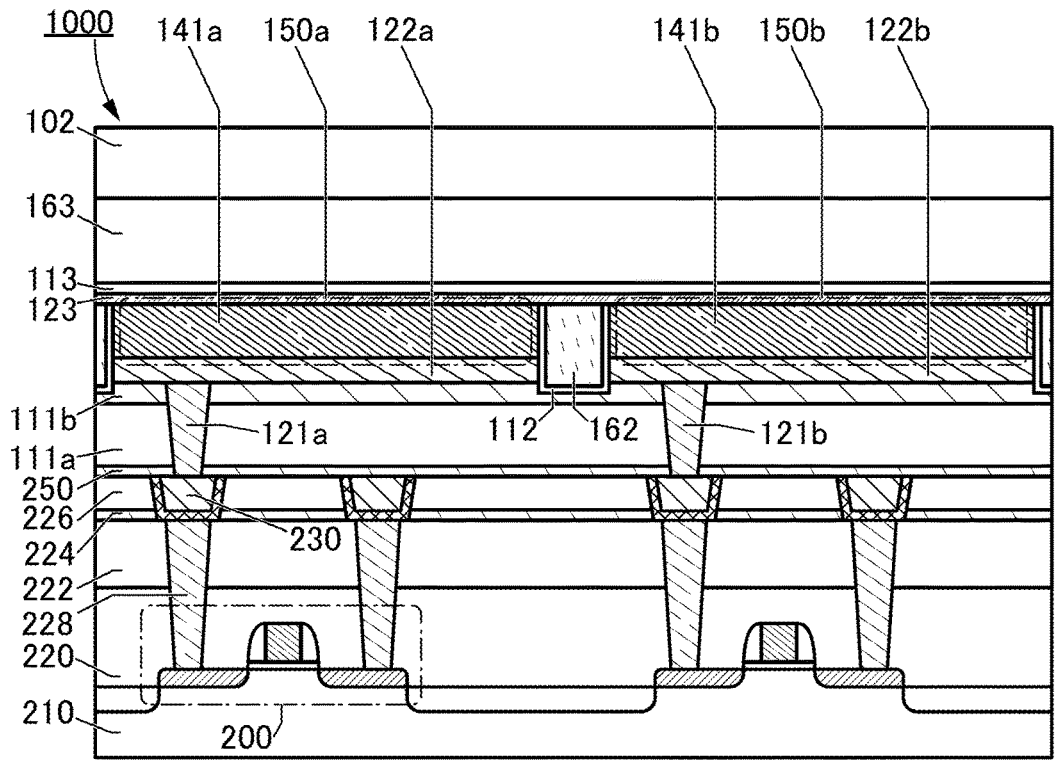
FIG. 17A and FIG. 17B are schematic cross-sectional views illustrating structure examples of a display apparatus.

Specifically, for example, the display apparatus for the electronic device of one embodiment of the present invention may include a circuit including the transistor 200 formed over the substrate 210 and the light-emitting device 150 provided above the transistor 200, like the display apparatus 1000 illustrated in FIG. 17A. For another example, a structure may be employed in which the insulator 512 is formed over a substrate 501, the transistor 500 is provided over the insulator 512, and the light-emitting device 150 is provided above the transistor 500, as in the display apparatus 1000 illustrated in FIG. 17B. Note that as the substrate 501, a substrate that can be used as the substrate 310 can be used, for example, and in particular, a glass substrate is preferably used.

Figure 17B:
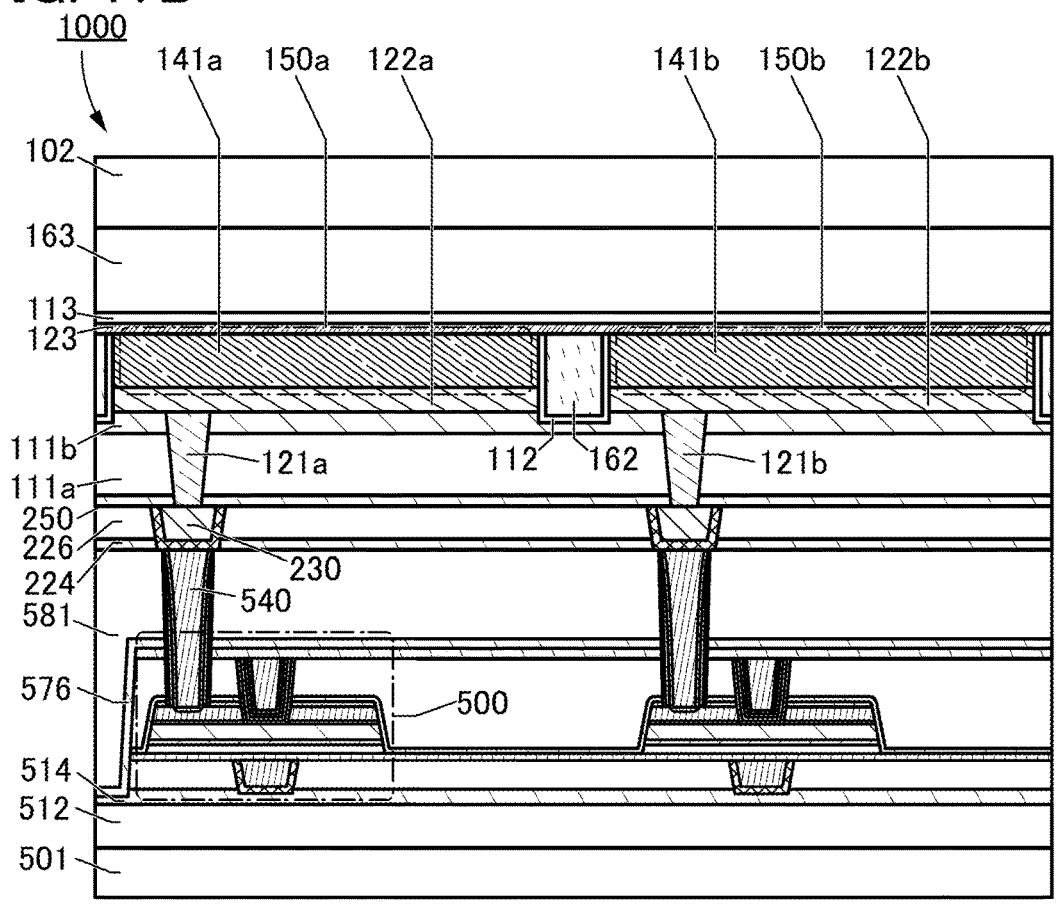

The display apparatus for the electronic device of one embodiment of the present invention may have a structure in which transistors are formed in only one layer and the light-emitting device 150 is provided above the transistors, like the display apparatus 1000 illustrated in each of FIG. 17A and FIG. 17B. Although not illustrated, the display apparatus for the electronic device of one embodiment of the present invention may have a layer structure in which transistors are formed in three or more layers.

Sealing Structure Example of Display Apparatus

Next, a sealing structure of the light-emitting device 150 that can be employed for the display apparatus 1000 in FIG. 14 will be described.

Figure 18A:
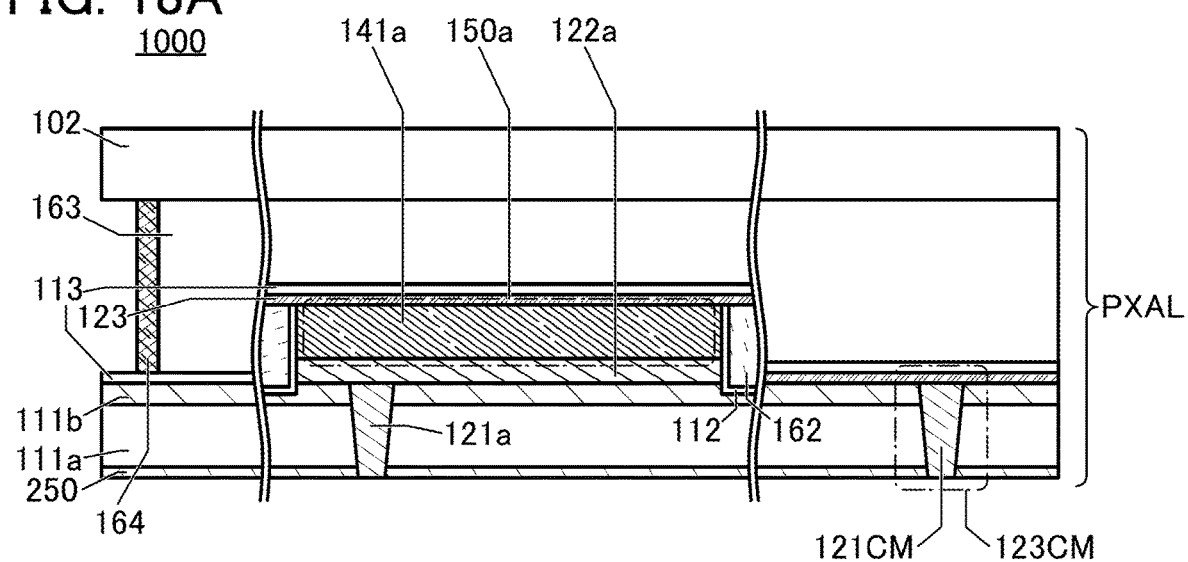
FIG. 18A and FIG. 18B are schematic cross-sectional views illustrating structure examples of a display apparatus.

FIG. 18A is a cross-sectional view illustrating an example of a sealing structure that can be employed for the display apparatus 1000 in FIG. 14. Specifically, FIG. 18A illustrates an end portion of the display apparatus 1000 in FIG. 14 and components provided around the end portion. FIG. 18A selectively illustrates only part of the pixel layer PXAL of the display apparatus 1000. Specifically, FIG. 18A illustrates the insulator 250, and insulators, conductors, the light-emitting device 150a, and the like that are positioned above the insulator 250.

In a region 123CM illustrated in FIG. 18A, for example, an opening portion is provided. In the opening portion, a conductor 121CM is provided, for example. The conductor 123 is electrically connected to a wiring provided below the insulator 250 through the conductor 121CM. Thus, a potential (e.g., an anode potential or a cathode potential of the light-emitting device 150a or the like) can be supplied to the conductor 123 functioning as the common electrode. Note that one or both of a conductor included in the region 123CM and a conductor around the region 123CM are referred to as a connection electrode in some cases.

For the conductor 121CM, any of the materials that can be used for the conductor 121 can be used, for example.

In the display apparatus 1000 in FIG. 18A, an adhesive layer 164 is provided at or around the end portion of the resin layer 163. Specifically, the display apparatus 1000 is fabricated such that the adhesive layer 164 is placed between the insulator 113 and the substrate 102.

The adhesive layer 164 is preferably formed using, for example, a material inhibiting transmission of impurities such as moisture. Using the material for the adhesive layer 164 can increase the reliability of the display apparatus 1000.

A structure in which the insulator 113 and the substrate 102 are bonded to each other with the resin layer 163 therebetween using the adhesive layer 164 is sometimes referred to as a solid sealing structure. In the case where the resin layer 163 in the solid sealing structure has a function of bonding the insulator 113 and the substrate 102 like the adhesive layer 164, the adhesive layer 164 is not necessarily provided.

Meanwhile, a structure in which the insulator 113 and the substrate 102 are bonded to each other with an inert gas filled therebetween, instead of the resin layer 163, by using the adhesive layer 164 is sometimes referred to as a hollow sealing structure (not illustrated). Examples of an inert gas include nitrogen and argon.

Figure 18B:
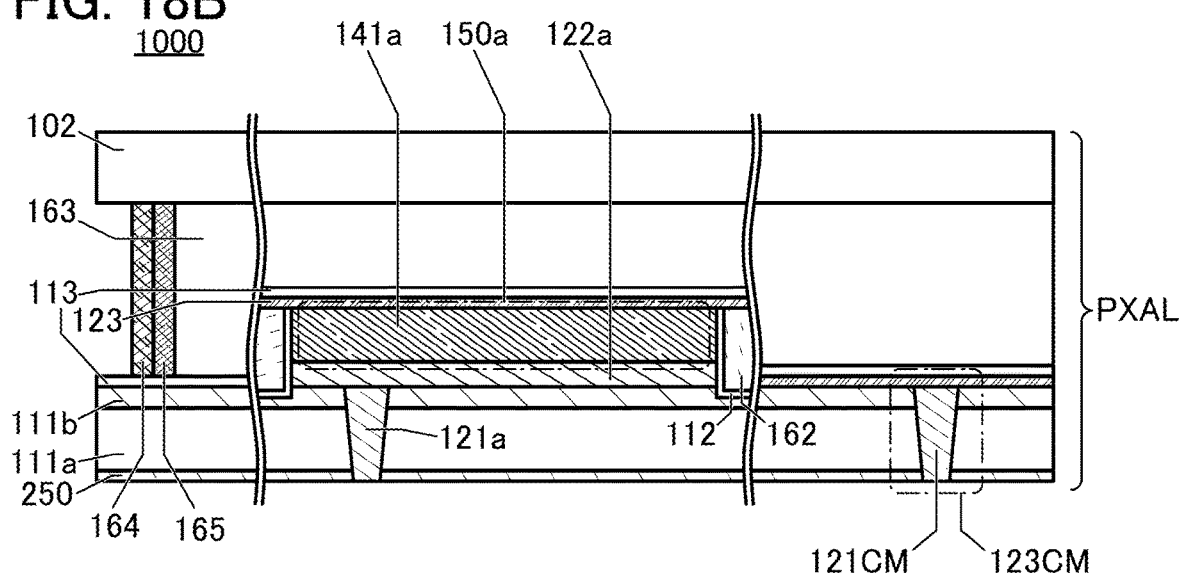

In the sealing structure of the display apparatus 1000 illustrated in FIG. 18A, two or more overlapping adhesive layers may be used. For example, as illustrated in FIG. 18B, an adhesive layer 165 may be further provided on the inner side of the adhesive layer 164 (between the adhesive layer 164 and the resin layer 163). Two or more overlapping adhesive layers can inhibit transmission of an impurity such as moisture, further increasing the reliability of the display apparatus 1000.

A desiccant may be mixed into the adhesive layer 165. In that case, the desiccant adsorbs moisture contained in the resin layer 163, insulators, conductors, and EL layers that are provided on the inner side of the adhesive layer 164 and the adhesive layer 165, increasing the reliability of the display apparatus 1000.

Although the solid sealing structure is illustrated in the display apparatus 1000 in FIG. 18B, a hollow sealing structure may be employed.

Furthermore, an inert liquid may be used instead of the resin layer 163 to fill the space in each of the sealing structures of the display apparatus 1000 in FIG. 18A and FIG. 18B. An example of an inert liquid is a fluorine-based inert liquid.

Modification Example of Display Apparatus

One embodiment of the present invention is not limited to the above-described structures, and the above-described structures can be changed as appropriate in accordance with circumstances. Modification examples of the display apparatus 1000 in FIG. 14 will be described below with reference to FIG. 19A to FIG. 20B. Note that FIG. 19A to FIG. 20B selectively illustrate only part of the pixel layer PXAL of the display apparatus 1000. Specifically, each of FIG. 19A to FIG. 20B illustrates the insulator 250, the insulator 111a, and insulators, conductors, the light-emitting device 150a, the light-emitting device 150b, and the like that are positioned above the insulator 111a. In particular, each of FIG. 19A to FIG. 20B also illustrates a light-emitting device 150c, a conductor 121c, a conductor 122c, and an EL layer 141c.

Note that, for example, the color of light emitted from the EL layer 141c may be different from the colors of light emitted from the EL layer 141a and the EL layer 141b. The display apparatus 1000 may have a structure in which the number of colors of light emitted from the light-emitting device 150a to the light-emitting device 150c is two, for example. Alternatively, for example, the display apparatus 1000 may have a structure in which the number of light-emitting devices 150 is increased so that the number of colors of light emitted from the light-emitting devices is four or more (not illustrated).

Figure 19A:
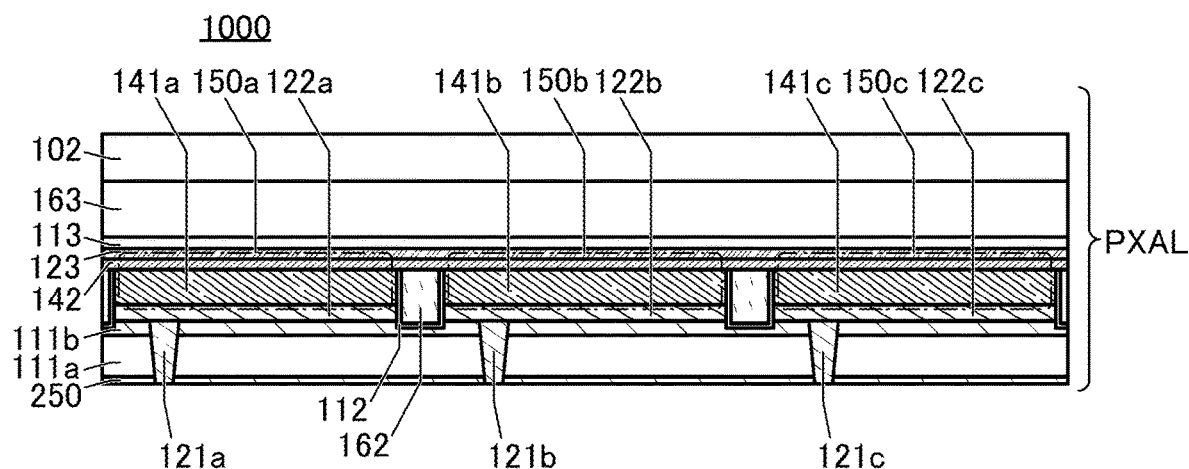
FIG. 19A and FIG. 19B are schematic cross-sectional views illustrating structure examples of a display apparatus.

The display apparatus 1000 may have a structure in which an EL layer 142 is formed over the EL layer 141a to the EL layer 141c, for example, as illustrated in FIG. 19A. Specifically, for example, in FIG. 15A, the EL layer 142 can include the layer 4420 when the EL layer 141a to the EL layer 141c each include the layer 4430 and the light-emitting layer 4411. In that case, the layer 4420 included in the EL layer 142 functions as a common layer shared by the light-emitting device 150a to the light-emitting device 150c. Similarly, for example, in FIG. 15C, the EL layer 142 can include the layer 4420 when the EL layer 141a to the EL layer 141c each include the layer 4430, the light-emitting layer 4411, the light-emitting layer 4412, and the light-emitting layer 4413, in which case the layer 4420 included in the EL layer 142 functions as a common layer shared by the light-emitting device 150a to the light-emitting device

150c. For another example, in FIG. 15D, the EL layer 142 can include the layer 4420 of the light-emitting unit 4400b when the EL layer 141a to the EL layer 141c each include the layer 4430, the light-emitting layer 4412, and the layer 4420 that are included in the light-emitting unit 4400b, the intermediate layer 4440, and the layer 4430 and the light-emitting layer 4411 that are included in the light-emitting unit 4400a, in which case the layer 4420 of the light-emitting unit 4400a included in the EL layer 142 functions as a common layer shared by the light-emitting device 150a to the light-emitting device 150c.

Figure 19B:
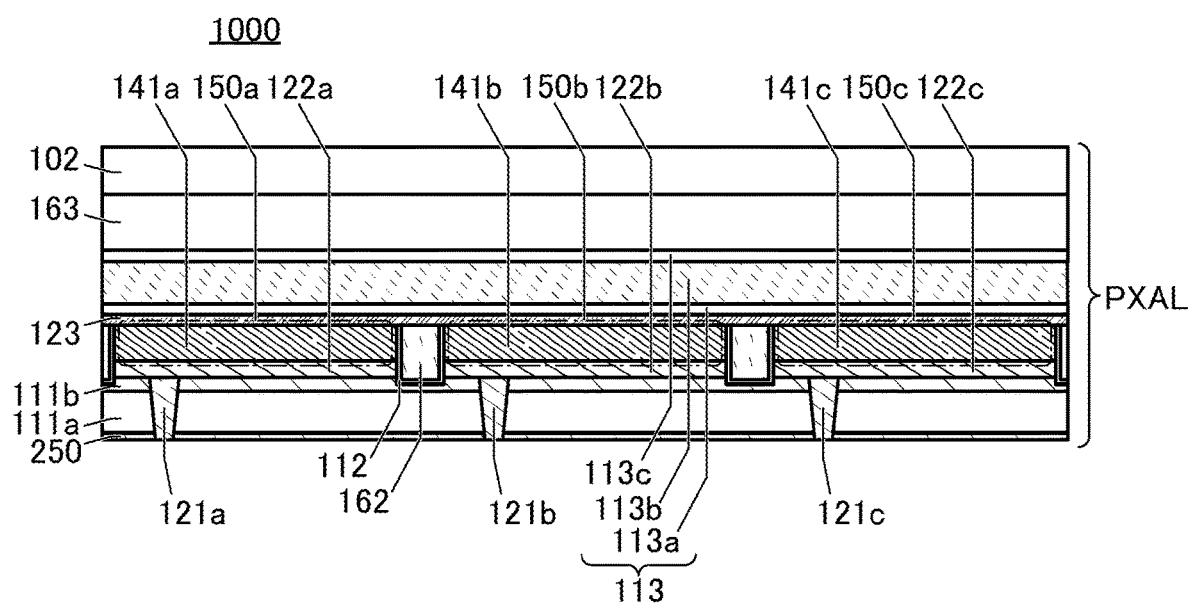

In the structure of the display apparatus 1000, for example, the insulator 113 may have a stacked-layer structure of two or more layers, instead of a single layer. The insulator 113 may have a three-layer structure that includes an insulator made of an inorganic material as the first layer, an insulator made of an organic material as the second layer, and an insulator made of an inorganic material as the third layer. FIG. 19B illustrates a cross-sectional view of part of the display apparatus 1000 in which the insulator 113 has a multilayer structure including an insulator 113a, an insulator 113b, and an insulator 113c; the insulator 113a is an insulator made of an inorganic material, the insulator 113b is an insulator made of an organic material, and the insulator 113c is an insulator made of an inorganic material.

In the structure of the display apparatus 1000, for example, the EL layer 141a to the EL layer 141c may each have a microcavity structure. In the microcavity structure, for example, the conductor 122 as an upper electrode (common electrode) is formed using a light-transmitting and light-reflective conductive material, the conductor 121 as a lower electrode (pixel electrode) is formed using a light-reflective conductive material, and the distance between the bottom surface of the light-emitting layer and the top surface of the lower electrode, i.e., the thickness of the layer 4430 in FIG. 15A, is set to the thickness corresponding to the wavelength of the color of light emitted from the light-emitting layer included in the EL layer 141.

For example, light that is reflected back from the lower electrode (reflected light) considerably interferes with light that directly enters the upper electrode from the light-emitting layer (incident light); therefore, the optical path length between the lower electrode and the light-emitting layer is preferably adjusted to $(2n-1)\lambda/4$ (n is a natural number of 1 or more and $\lambda$ is a wavelength of emitted light to be amplified). By adjusting the optical path length, the phases of the reflected light and the incident light each having the wavelength $\lambda$ can be aligned with each other, and the light emitted from the light-emitting layer can be further amplified. In the case where the reflected light and the incident light have a wavelength other than the wavelength $\lambda$, their phases are not aligned with each other, resulting in attenuation without resonation.

Note that in the above structure, the EL layer may include a plurality of light-emitting layers or may include a single light-emitting layer. The structure of the tandem light-emitting device described above may be combined with a plurality of EL layers; for example, a light-emitting device may have a structure in which a plurality of EL layers are provided with a charge-generation layer provided therebetween, and each EL layer includes a plurality of light-emitting layers or a single light-emitting layer.

With the microcavity structure, emission intensity with a specific wavelength in the front direction can be increased, whereby power consumption can be reduced. Particularly in the case of a device for XR such as VR and AR, light emitted from the light-emitting device in the front direction often enters the eyes of the user wearing the device; thus, a display apparatus of a device for XR suitably has a microcavity structure. Note that in the case of a display apparatus that displays videos with subpixels of four colors of red, yellow, green, and blue, the display apparatus can have excellent characteristics because a microcavity structure suitable for the wavelength of the corresponding color is employed in each subpixel, in addition to the effect of improving luminance owing to yellow light emission.

Figure 20A:
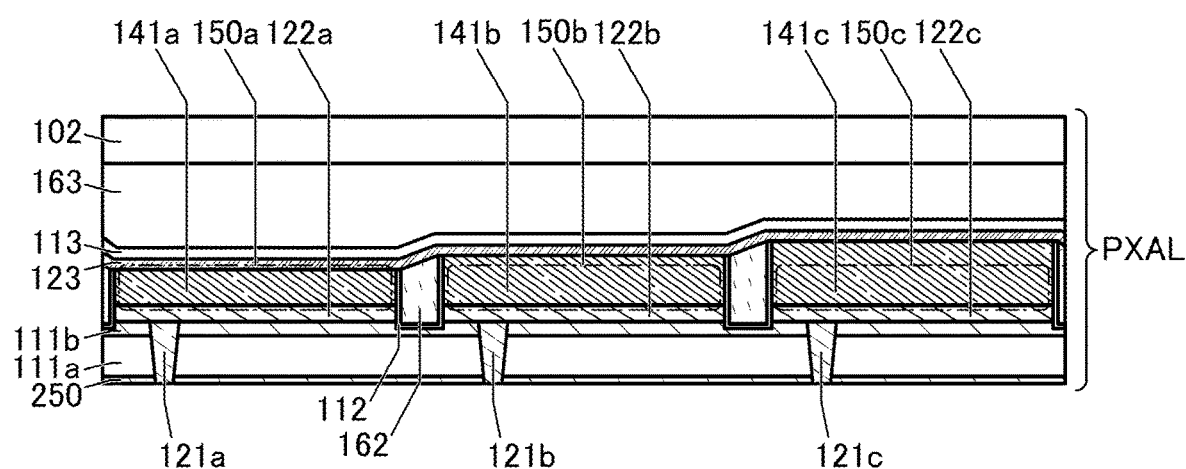
FIG. 20A and FIG. 20B are schematic cross-sectional views illustrating structure examples of a display apparatus.

FIG. 20A illustrates a cross-sectional view of part of the display apparatus 1000 having a microcavity structure, for example. In the case where the light-emitting device 150a includes a light-emitting layer emitting blue (B) light, the light-emitting device 150b includes a light-emitting layer emitting green (G) light, and the light-emitting device 150c includes a light-emitting layer emitting red (R) light, it is preferable that the EL layer 141a have the smallest thickness, the EL layer 141b have the second largest thickness, and the EL layer 141c have the largest thickness as illustrated in FIG. 20A. Specifically, the thicknesses of the layers 4430 included in the EL layer 141a, the EL layer 141b, and the EL layer 141c may be determined depending on the color of the light emitted from the corresponding light-emitting layer. In that case, the layer 4430 included in the EL layer 141a has the smallest thickness and the layer 4430 included in the EL layer 141c has the largest thickness.

Figure 20B:
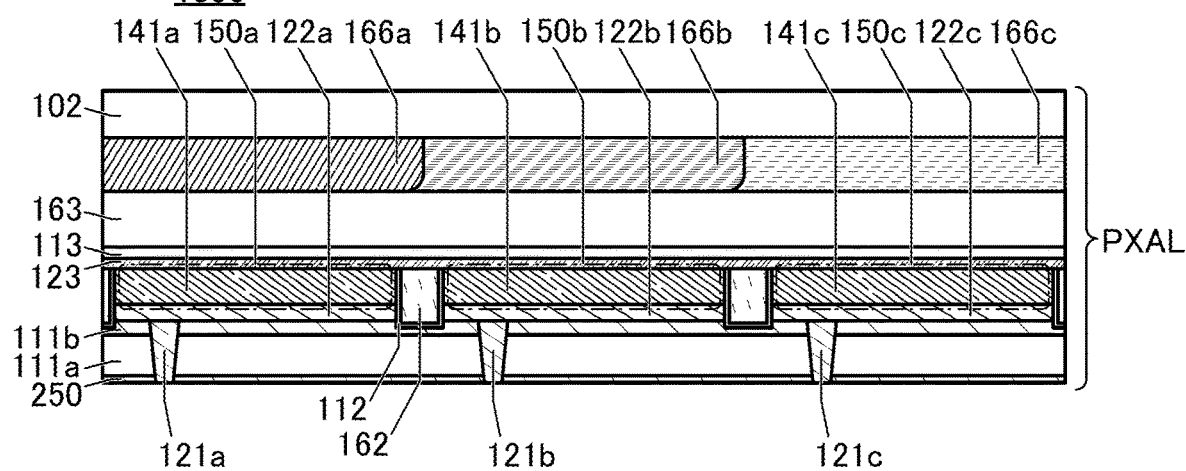

The display apparatus 1000 may include a coloring layer (color filter) or the like, for example. FIG. 20B illustrates a structure in which a coloring layer 166a, a coloring layer 166b, and a coloring layer 166c are included between the resin layer 163 and the substrate 102, for example. Note that the coloring layer 166a to the coloring layer 166c can be formed on the substrate 102, for example. In the case where the light-emitting device 150a includes a light-emitting layer emitting blue (B) light, the light-emitting device 150b includes a light-emitting layer emitting green (G) light, and the light-emitting device 150c includes a light-emitting layer emitting red (R) light, the coloring layer 166a is a blue coloring layer, the coloring layer 166b is a green coloring layer, and the coloring layer 166c is a red coloring layer.

The display apparatus 1000 illustrated in FIG. 20B can be fabricated in the following manner: the substrate 102 provided with the coloring layer 166a to the coloring layer 166c and the substrate 310 over which components up to the light-emitting device 150a to the light-emitting device 150c are formed are bonded to each other with the resin layer 163 therebetween. At this time, the bonding is preferably performed such that the light-emitting device 150a and the coloring layer 166a overlap with each other, the light-emitting device 150b and the coloring layer 166b overlap with each other, and the light-emitting device 150c and the coloring layer 166c overlap with each other. In the display apparatus 1000 provided with the coloring layer 166a to the coloring layer 166c, for example, light emitted from the light-emitting device 150b is not extracted to above the substrate 102 through the coloring layer 166a or the coloring layer 166c, but is extracted to above the substrate 102 through the coloring layer 166b. That is, light emitted from the light-emitting device 150 in an oblique direction (a direction at an elevation angle with the top surface of the substrate 102 used as a horizontal plane) can be blocked in the display apparatus 1000; thus, the viewing angle dependence of the display apparatus 1000 can be reduced, inhibiting the display quality of an image displayed on the display apparatus 1000 from decreasing when the image is viewed from an oblique direction.

The coloring layer 166a to the coloring layer 166c formed on the substrate 102 may be covered with, for example, a resin which is also referred to as an overcoat layer. Specifically, the resin layer 163, the overcoat layer, the coloring layer 166a to the coloring layer 166c, and the substrate 102 may be stacked in this order in the display apparatus 1000 (not illustrated). Note that examples of the resin used for the overcoat layer include a thermosetting material having a light-transmitting property and being based on an acrylic resin or an epoxy resin.

The display apparatus 1000 may include, for example, a black matrix (not illustrated) in addition to the coloring layers. The black matrix provided between the coloring layer 166a and the coloring layer 166b, between the coloring layer 166b and the coloring layer 166c, and between the coloring layer 166c and the coloring layer 166a can block more light emitted from the light-emitting device 150 in an oblique direction (a direction at an elevation angle with the top surface of the substrate 102 used as a horizontal plane) in the display apparatus 1000; thus, the display quality of an image displayed on the display apparatus 1000 can be more prevented from decreasing when the image is viewed from an oblique direction.

In the case where the display apparatus includes coloring layers as illustrated in FIG. 20B and the like, the light-emitting device 150a to the light-emitting device 150c of the display apparatus may each be a light-emitting device emitting white light (not illustrated). The light-emitting device can have a single structure or a tandem structure, for example.

In the above-described structure of the display apparatus 1000, the conductor 121a to the conductor 121c serve as anodes and the conductor 122 serves as a cathode; however, the display apparatus 1000 may have a structure in which the conductor 121a to the conductor 121c serve as cathodes and the conductor 122 serves as an anode. That is, in the above-described fabrication process, the stacking order of the hole-injection layer, the hole-transport layer, the light-emitting layer, the electron-transport layer, and the electron-injection layer that are included in the EL layer 141a to the EL layer 141c and the EL layer 142 may be reversed.

Structure Example of Insulator 162

Next, cross-sectional structures of a region including the insulator 162 and its periphery in the display apparatus 1000 will be described.

Figure 21A:
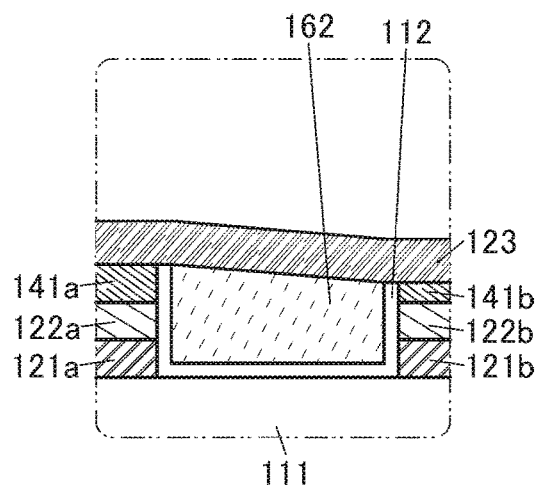
FIG. 21A to FIG. 21F are cross-sectional views illustrating an example of a method for fabricating a display apparatus.

FIG. 21A illustrates an example in which the EL layer 141a and the EL layer 141b have different thicknesses. The top surface level of the insulator 112 is equal to or substantially equal to the top surface level of the EL layer 141a on the EL layer 141a side, and equal to or substantially equal to the top surface level of the EL layer 141b on the EL layer 141b side. The top surface of the insulator 112 has a gentle slope such that the side closer to the EL layer 141a is higher and the side closer to the EL layer 141b is lower. In this manner, the top surfaces of the insulator 112 and the insulator 162 are preferably level with the top surface of an adjacent EL layer. Alternatively, the top surface levels of the insulators may be equal to the top surface level of any adjacent EL layer so that their top surfaces have a flat portion.

Figure 21D:
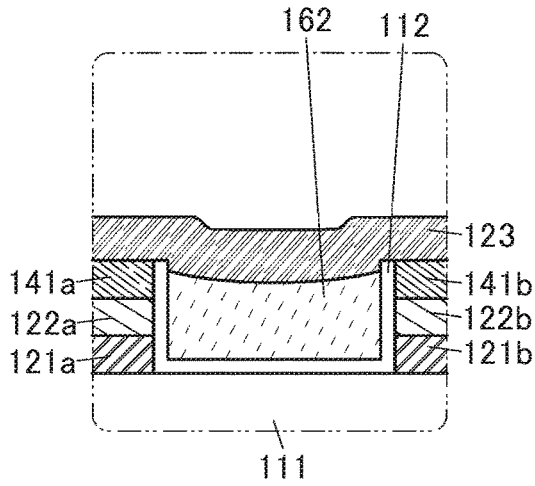
Figure 21B:
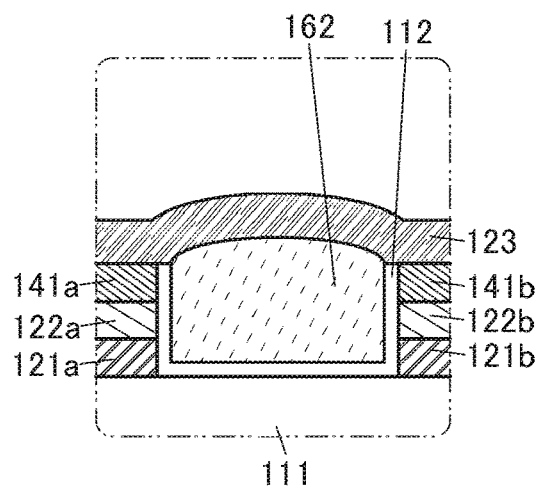

In FIG. 21B, the top surface of the insulator 162 includes a region that is at a higher level than the top surface of the EL layer 141a and the top surface of the EL layer 141b. Moreover, the top surface of the insulator 162 has a convex shape that is gently bulged toward the center.

Figure 21E:
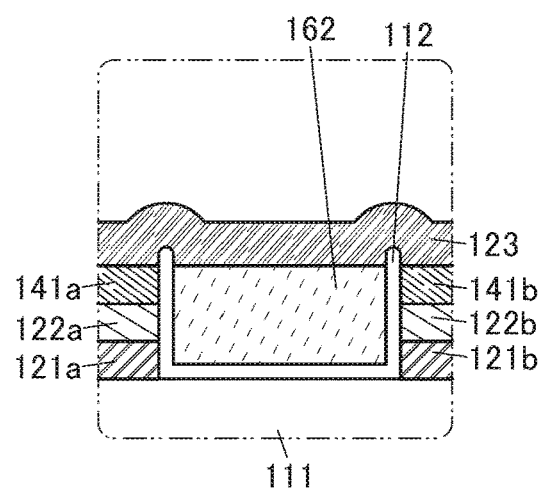
Figure 21C:
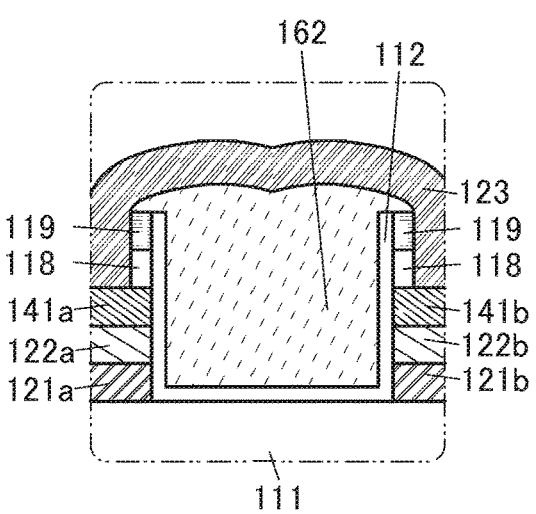

In FIG. 21C, the top surface of the insulator 112 includes a region that is at a higher level than the top surface of the EL layer 141a and the top surface of the EL layer 141b. In a region including the insulator 162 and its periphery, the display apparatus 1000 includes a first region positioned over one or both of a sacrificial layer 118 and a sacrificial layer 119. The first region is at a higher level than the top surface of the EL layer 141a and the top surface of the EL layer 141b, and part of the insulator 162 is formed in the first region. In the region including the insulator 162 and its periphery, the display apparatus 1000 includes a second region positioned over one or both of the sacrificial layer 118 and the sacrificial layer 119. The second region is at a higher level than the top surface of the EL layer 141a and the top surface of the EL layer 141b, and part of the insulator 162 is formed in the second region.

In FIG. 21D, the top surface of the insulator 162 includes a region that is at a lower level than the top surface of the EL layer 141a and the top surface of the EL layer 141b. Moreover, the top surface of the insulator 162 has a concave shape that is gently recessed toward the center.

In FIG. 21E, the top surface of the insulator 112 includes a region that is at a higher level than the top surface of the EL layer 141a and the top surface of the EL layer 141b. That is, the insulator 112 protrudes from the formation surface of the EL layer 141 and forms a projecting portion.

In formation of the insulator 112, for example, when the insulator 112 is formed to be level with or substantially level with the sacrificial layer, a shape such that the insulator 112 protrudes is sometimes formed as illustrated in FIG. 21E.

Figure 21F:
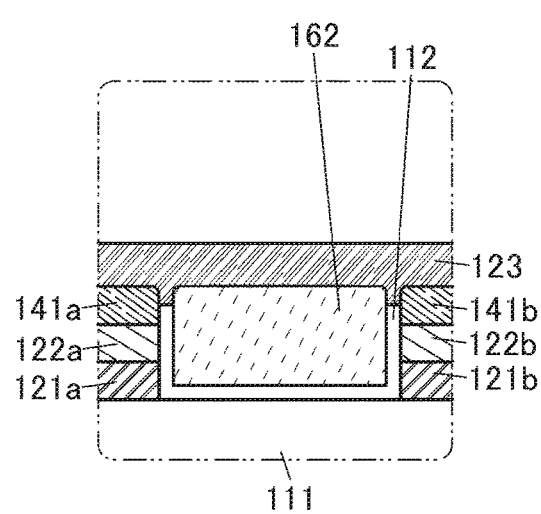

In FIG. 21F, the top surface of the insulator 112 includes a region that is at a lower level than the top surface of EL layer 141a and the top surface of the EL layer 141b. That is, the insulator 112 forms a depressed portion on the formation surface of the EL layer 141.

As described above, the insulator 112 and the insulator 162 can have a variety of shapes.

Structure Example of Pixel Circuit

Here, structure examples of a pixel circuit that can be included in the pixel layer PXAL will be described.

Figure 22A:
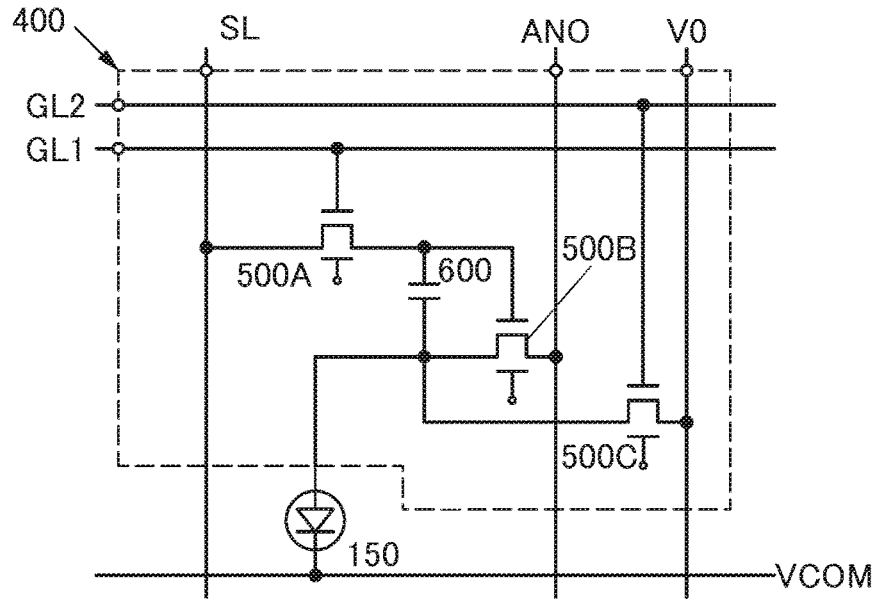
FIG. 22A is a circuit diagram illustrating a structure example of a pixel circuit included in a display apparatus.
Figure 22B:
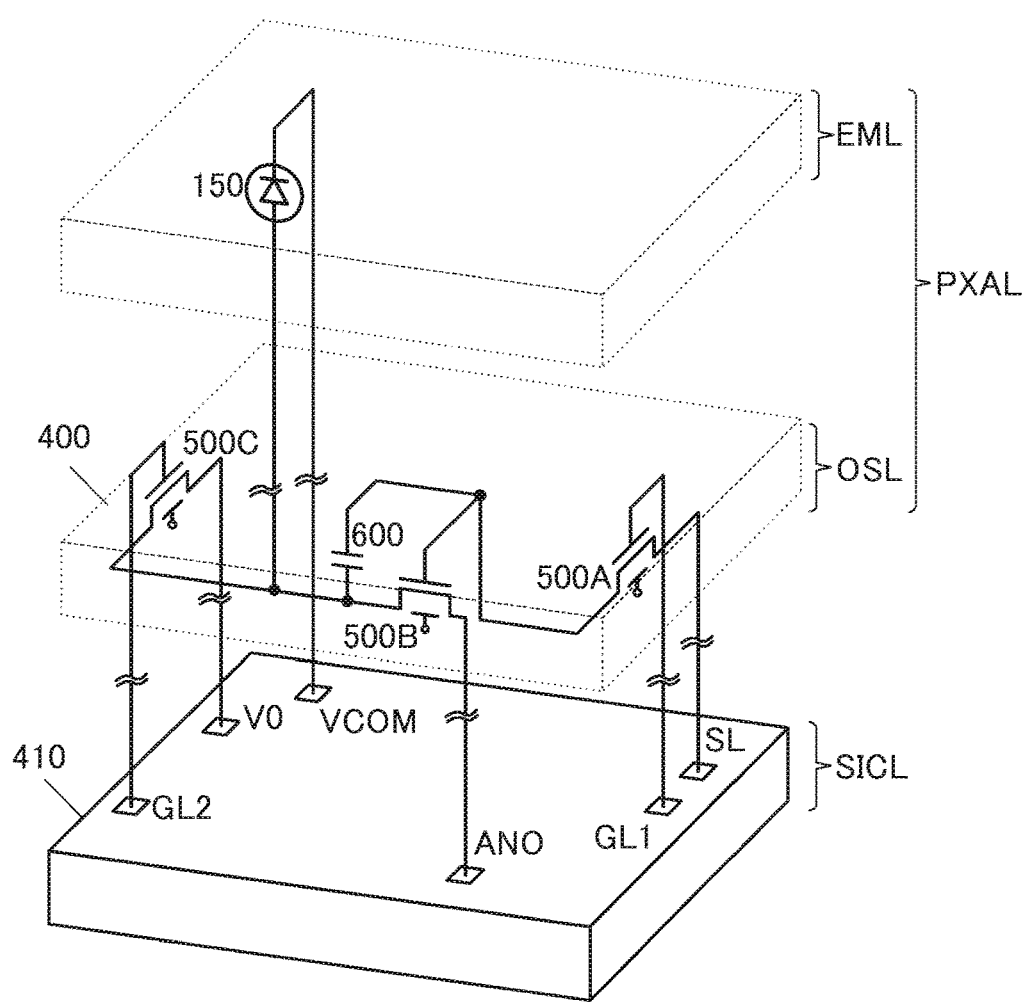
FIG. 22B is a schematic perspective view illustrating the structure example of the pixel circuit included in the display apparatus.

FIG. 22A and FIG. 22B illustrate a structure example of a pixel circuit that can be included in the pixel layer PXAL and the light-emitting device 150 connected to the pixel circuit. FIG. 22A is a diagram illustrating connection of circuit elements included in a pixel circuit 400 included in the pixel layer PXAL, and FIG. 22B is a diagram schematically illustrating the positional relation of the circuit layer SICL including a driver circuit 410 and the like, a layer OSL including a plurality of transistors of the pixel circuit, and a layer EML including the light-emitting device 150. Note that the pixel layer PXAL of the display apparatus 1000 illustrated in FIG. 22B includes the layer OSL and the layer EML, for example. A transistor 500A, a transistor 500B, a transistor 500C, or the like included in the layer OSL illustrated in FIG. 22B corresponds to the transistor 200 in FIG. 14. The light-emitting device 150 included in the layer EML illustrated in FIG. 22B corresponds to the light-emitting device 150a or the light-emitting device 150b in FIG. 14.

The pixel circuit 400 illustrated as an example in FIG. 22A and FIG. 22B includes the transistor 500A, the transistor 500B, the transistor 500C, and a capacitor 600. The transistor 500A, the transistor 500B, and the transistor 500C can be transistors that can be used as the transistor 200 described above as an example. That is, the transistor 500A, the transistor 500B, and the transistor 500C can be Si transistors. Alternatively, the transistor 500A, the transistor 500B, and the transistor 500C can be transistors that can be used as the transistor 500 described above as example. That is, the transistor 500A, the transistor 500B, and the transistor 500C can be OS transistors. In particular, in the case where the transistor 500A, the transistor 500B, and the transistor 500C are OS transistors, each of the transistor 500A, the transistor 500B, and the transistor 500C preferably includes a back gate electrode, in which case a structure in which the back gate electrode is supplied with the same signals as the gate electrode or a structure in which the back gate electrode is supplied with signals different from those supplied to the gate electrode can be employed. Although each of the transistor 500A, the transistor 500B, and the transistor 500C illustrated in FIG. 22A and FIG. 22B includes a back gate electrode, each of the transistor 500A, the transistor 500B, and the transistor 500C does not necessarily include a back gate electrode.

The transistor 500B includes a gate electrode electrically connected to the transistor 500A, a first electrode electrically connected to the light-emitting device 150, and a second electrode electrically connected to a wiring ANO. The wiring ANO supplies a potential for supplying current to the light-emitting device 150.

The transistor 500A includes a first terminal electrically connected to the gate electrode of the transistor 500B, a second terminal electrically connected to the wiring SL functioning as a source line, and the gate electrode having a function of controlling the conducting state or the non-conducting state on the basis of the potential of the wiring GL1 functioning as a gate line.

The transistor 500C includes a first terminal electrically connected to a wiring V0, a second terminal electrically connected to the light-emitting device 150, and the gate electrode having a function of controlling the conducting state or the non-conducting state on the basis of the potential of the wiring GL2 functioning as a gate line. The wiring V0 is a wiring for supplying a reference potential and a wiring for outputting current flowing through the pixel circuit 400 to the driver circuit 410.

The capacitor 600 includes a conductive film electrically connected to the gate electrode of the transistor 500B and a conductive film electrically connected to the second electrode of the transistor 500C.

The light-emitting device 150 includes a first electrode electrically connected to the first electrode of the transistor 500B and a second electrode electrically connected to a wiring VCOM. The wiring VCOM supplies a potential for supplying current to the light-emitting device 150.

Accordingly, the intensity of light emitted from the light-emitting device 150 can be controlled in accordance with an image signal supplied to the gate electrode of the transistor 500B. Furthermore, variations in the gate-source voltage of the transistor 500B can be inhibited by the reference potential of the wiring V0 supplied through the transistor 500C.

Current with an amount that can be used for setting pixel parameters can be output from the wiring V0. Specifically, the wiring V0 can function as a monitor line for outputting current flowing through the transistor 500B or current flowing through the light-emitting device 150 to the outside. Current output to the wiring V0 is converted into voltage by a source follower circuit or the like and output to the outside, for example. Alternatively, current output to the wiring V0 can be converted into a digital signal by an analog-digital converter circuit or the like and output to the AI accelerator described in the above embodiment.

Note that in the structure illustrated as an example in FIG. 22B, the wirings electrically connecting the pixel circuit 400 and the driver circuit 410 can be shortened, so that wiring resistance of the wirings can be reduced. Thus, data writing can be performed at high speed, leading to high-speed operation of the display apparatus 1000. Therefore, even when the number of pixel circuits 400 included in the display apparatus 1000 is large, a sufficiently long frame period can be ensured and thus the pixel density of the display apparatus 1000 can be increased. In addition, the increased pixel density of the display apparatus 1000 can increase the resolution of an image displayed on the display apparatus 1000. For example, the pixel density of the display apparatus 1000 can be higher than or equal to 1000 ppi, higher than or equal to 5000 ppi, or higher than or equal to 7000 ppi. Thus, the display apparatus 1000 can be, for example, a display apparatus for AR or VR and can be suitably used in an electronic device with a short distance between a display portion and the user, such as a head-mounted display.

Although FIG. 22A and FIG. 22B illustrate, as an example, the pixel circuit 400 including three transistors in total, the pixel circuit of the electronic device of one embodiment of the present invention is not limited thereto. Structure examples of a pixel circuit that can be used as the pixel circuit 400 will be described below.

Figure 23A:
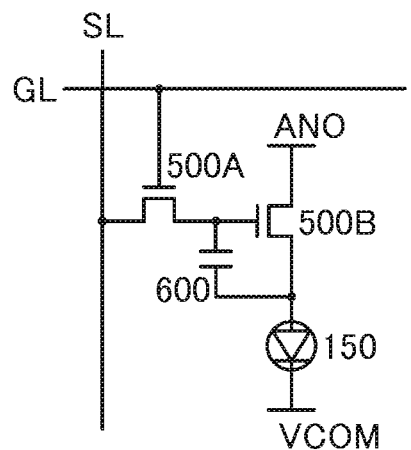
FIG. 23A to FIG. 23D are circuit diagrams illustrating structure examples of pixel circuits included in a display apparatus.

A pixel circuit 400A illustrated in FIG. 23A includes the transistor 500A, the transistor 500B, and the capacitor 600. FIG. 23A illustrates the light-emitting device 150 connected to the pixel circuit 400A. The wiring SL, the wiring GL, the wiring ANO, and the wiring VCOM are electrically connected to the pixel circuit 400A.

A gate of the transistor 500A is electrically connected to the wiring GL, one of a source and a drain of the transistor 500A is electrically connected to the wiring SL, and the other of the source and the drain of the transistor 500A is electrically connected to a gate of the transistor 500B and one electrode of the capacitor 600. One of a source and a drain of the transistor 500B is electrically connected to the wiring ANO and the other of the source and the drain of the transistor 500B is electrically connected to an anode of the light-emitting device 150. The other electrode of the capacitor 600 is electrically connected to the anode of the light-emitting device 150. A cathode of the light-emitting device 150 is electrically connected to the wiring VCOM.

Figure 23B:
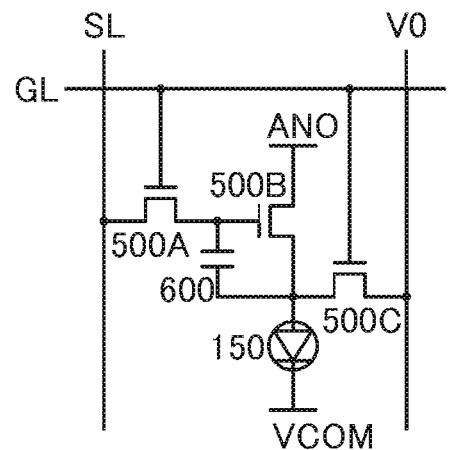

A pixel circuit 400B illustrated in FIG. 23B has a structure in which the transistor 500C is added to the pixel circuit 400A. In addition, the wiring V0 is electrically connected to the pixel circuit 400B.

Figure 23C:
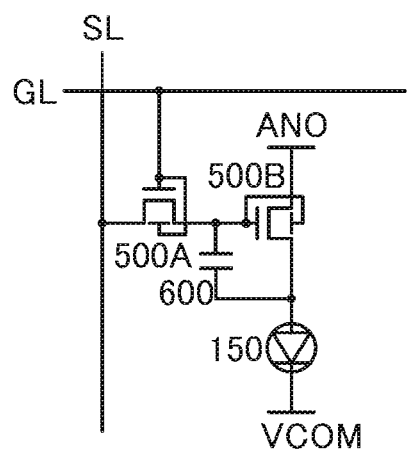
Figure 23D:
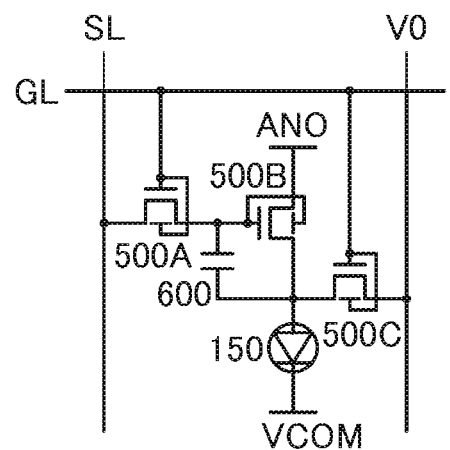

A pixel circuit 400C illustrated in FIG. 23C is an example of the case where a transistor in which a gate and a back gate are electrically connected to each other is used as each of the transistor 500A and the transistor 500B of the pixel circuit 400A. A pixel circuit 400D illustrated in FIG. 23D is an example of the case where such transistors are used in the pixel circuit 400B. Thus, current that can flow through the transistors can be increased. Note that although a transistor in which a pair of gates are electrically connected to each other is used as all the transistors here, one embodiment of the present invention is not limited thereto. A transistor that includes a pair of gates electrically connected to different wirings may be used. For example, when a transistor in which one of gates is electrically connected to a source is used, the reliability can be increased.

Figure 24A:
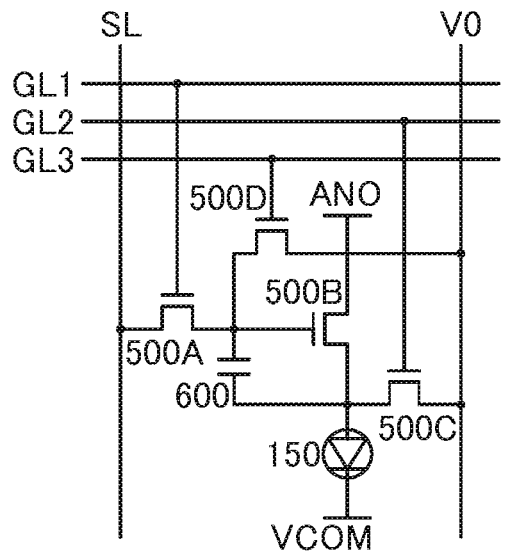
FIG. 24A to FIG. 24D are circuit diagrams illustrating structure examples of pixel circuits included in a display apparatus.

A pixel circuit 400E illustrated in FIG. 24A has a structure in which a transistor 500D is added to the pixel circuit 400B. Three wirings (the wiring GL1, the wiring GL2, and the wiring GL3) functioning as gate lines are electrically connected to the pixel circuit 400E.

A gate of the transistor 500D is electrically connected to the wiring GL3, one of a source and a drain of the transistor 500D is electrically connected to the gate of the transistor 500B, and the other of the source and the drain of the transistor 500D is electrically connected to the wiring V0. The gate of the transistor 500A is electrically connected to the wiring GL1, and the gate of the transistor 500C is electrically connected to the wiring GL2.

When the transistor 500C and the transistor 500D are turned on at the same time, the source and the gate of the transistor 500B have the same potential, so that the transistor 500B can be turned off. Thus, current flowing through the light-emitting device 150 can be blocked forcibly. Such a pixel circuit is suitable for the case of using a display method in which a display period and a non-lighting period are alternately provided.

Figure 24B:
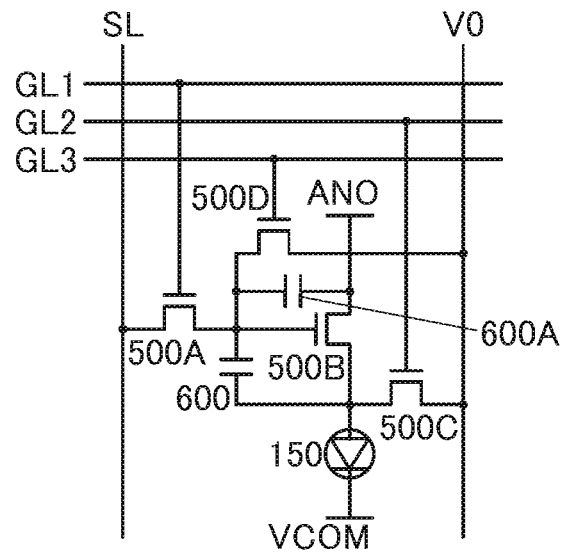

A pixel circuit 400F illustrated in FIG. 24B is an example of the case where a capacitor 600A is added to the pixel circuit 400E. The capacitor 600A functions as a storage capacitor.

Figure 24C:
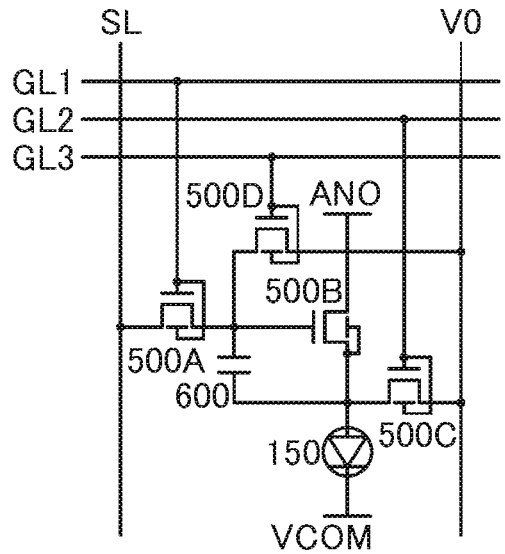
Figure 24D:
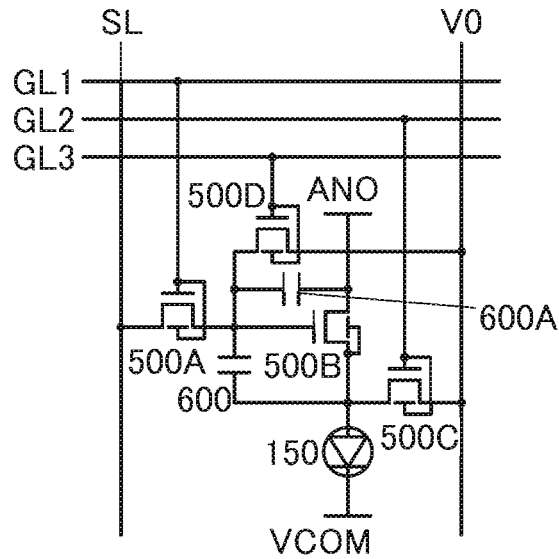

A pixel circuit 400G illustrated in FIG. 24C and a pixel circuit 400H illustrated in FIG. 24D are respectively examples of the cases where transistors each including a gate and a back gate that are electrically connected to each other are used in the pixel circuit 400E and the pixel circuit 400F. A transistor in which a gate and a back gate are electrically connected to each other is used as each of the transistor 500A, the transistor 500C, and the transistor 500D, and a transistor in which a gate is electrically connected to a source is used as the transistor 500B.

<Schematic Top View and Schematic Cross-Sectional View of Light-Emitting Device>

Figure 25A:
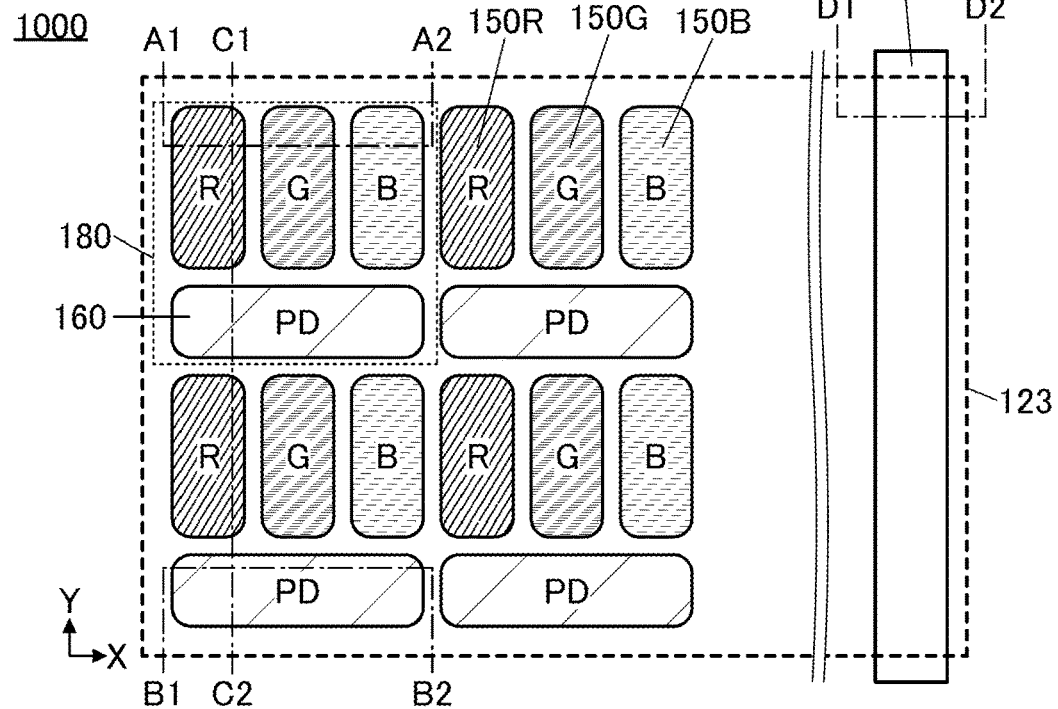
FIG. 25A and FIG. 25B are top views illustrating structure examples of light-emitting devices and light-receiving devices included in a display apparatus.

FIG. 25A is a schematic top view illustrating a structure example of the case where light-emitting devices and a light-receiving device are arranged in one pixel in the display apparatus 1000 of one embodiment of the present invention. The display apparatus 1000 includes a plurality of light-emitting devices 150R that emit red light, a plurality of light-emitting devices 150G that emit green light, a plurality of light-emitting devices 150B that emit blue light, and a plurality of light-receiving devices 160. In FIG. 25A, light-emitting regions of the light-emitting devices 150 are denoted by R, G, and B to easily differentiate the light-emitting devices 150. In addition, light-receiving regions of the light-receiving devices 160 are denoted by PD.

The light-emitting devices 150R, the light-emitting devices 150G, the light-emitting devices 150B, and the light-receiving devices 160 are each arranged in a matrix. FIG. 25A illustrates an example in which the light-emitting devices 150R, the light-emitting devices 150G, and the light-emitting devices 150B are arranged in the X direction and the light-receiving devices 160 are arranged thereunder. FIG. 25A also illustrates a structure example in which the light-emitting devices 150 that emit light of the same color are arranged in the Y direction intersecting the X direction. In the display apparatus 1000 illustrated in FIG. 25A, a pixel 180 can be composed of a subpixel including the light-emitting device 150R, a subpixel including the light-emitting device 150G, and a subpixel including the light-emitting device 150B, which are arranged in the X direction, and a subpixel including the light-receiving device 160 provided under the subpixels, for example.

As each of the light-emitting device 150R, the light-emitting device 150G, and the light-emitting device 150B, an organic EL element such as an OLED (Organic Light Emitting Diode) or a QLED (Quantum-dot Light Emitting Diode) is preferably used. Examples of a light-emitting substance contained in the organic EL element include a substance that emits fluorescent light (a fluorescent material), a substance that emits phosphorescent light (a phosphorescent material), an inorganic compound (a quantum dot material or the like), and a substance exhibiting thermally activated delayed fluorescence (a thermally activated delayed fluorescent (TADF) material).

Note that as a TADF material, a material in which a singlet excited state and a triplet excited state are in a thermal equilibrium state may be used. Since such a TADF material enables a short emission lifetime (excitation lifetime), an efficiency decrease of a light-emitting element in a high-luminance region can be inhibited.

For example, a pn-type or pin-type light-receiving device can be used as the light-receiving device 160. The light-receiving device 160 functions as a photoelectric conversion element that detects light incident on the light-receiving device 160 and generates charge. The amount of generated charge depends on the amount of incident light.

It is particularly preferable to use, as the light-receiving device 160, an organic light-receiving device including a layer containing an organic compound. An organic light-receiving device, which is easily made thin, lightweight, and large in area and has a high degree of freedom for shape and design, can be used in a variety of display apparatuses.

In an electronic device of one embodiment of the present invention, an organic EL element is used as the light-emitting device 150, and an organic light-receiving device is used as the light-receiving device 160. The organic EL elements and the organic light-receiving devices can be formed over one substrate. Thus, the organic light-receiving devices can be incorporated in a display apparatus including the organic EL elements. A photolithography method is preferably employed to separate the organic EL elements from each other, the organic light-receiving devices from each other, and the organic EL element and the organic light-receiving device from each other. This can reduce the interval between the light-emitting devices, between the organic light-receiving devices, or between the light-emitting device and the organic light-receiving device, achieving a display apparatus having a higher aperture ratio than that formed using, for example, a shadow mask such as a metal mask.

FIG. 25A illustrates the conductor 123 functioning as a common electrode and the conductor 121CM functioning as a connection electrode. Here, the conductor 121CM is electrically connected to the conductor 123. The conductor 121CM is provided outside a display portion where the light-emitting devices 150 and the light-receiving devices 160 are arranged. In FIG. 25A, the conductor 123 including a region overlapping with the light-emitting devices 150, the light-receiving devices 160, and the conductor 121CM is shown by dashed lines.

The conductor 121CM can be provided along the outer periphery of the display portion. For example, the conductor 121CM may be provided along one side of the outer periphery of the display portion or two or more sides of the outer periphery of the display portion. That is, the top surface shape of the conductor 121CM can be a band shape, an L shape, a square bracket shape, a quadrangle, or the like in the case where the top surface shape of the display portion is a rectangle.

Figure 25B:
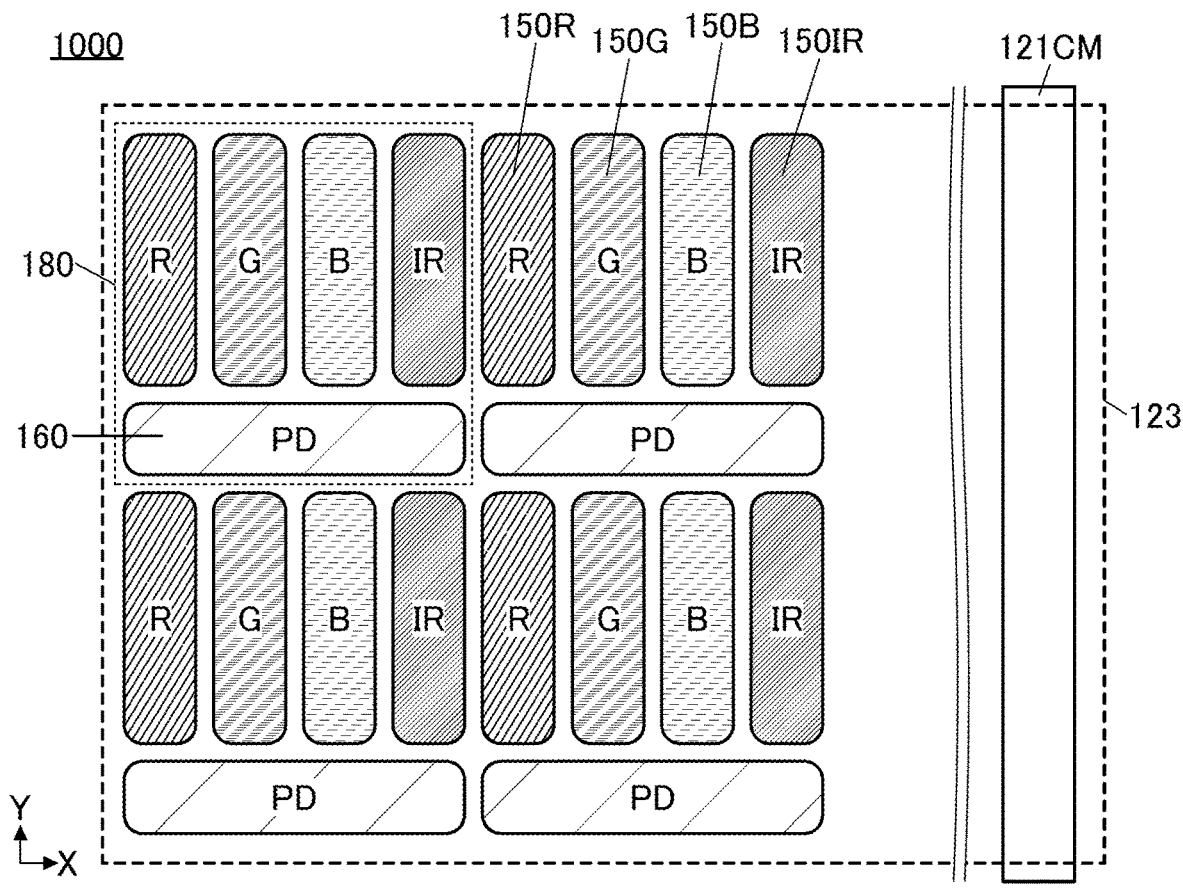

FIG. 25B is a schematic top view illustrating a structure example of the display apparatus 1000 and is a modification example of the display apparatus 1000 illustrated in FIG.

25A. The display apparatus 1000 illustrated in FIG. 25B differs from the display apparatus 1000 illustrated in FIG. 25A in that light-emitting devices 150IR that emit infrared light are included. The light-emitting devices 150IR can emit near-infrared light (light with a wavelength greater than or equal to 750 nm and less than or equal to 1300 nm), for example.

In the example illustrated in FIG. 25B, the light-emitting devices 150IR as well as the light-emitting devices 150R, the light-emitting devices 150G, and the light-emitting devices 150B are arranged in the X direction, and the light-receiving devices 160 are arranged thereunder. The light-receiving device 160 has a function of detecting infrared light.

FIG. 26A is a cross-sectional view taken along the dashed-dotted line A1-A2 in FIG. 25A, and FIG. 26B is a cross-sectional view taken along the dashed-dotted line B1-B2 in FIG. 25A. FIG. 26C is a cross-sectional view taken along the dashed-dotted line C1-C2 in FIG. 25A, and FIG. 26D is a cross-sectional view taken along the dashed-dotted line D1-D2 in FIG. 25A. The light-emitting devices 150R, the light-emitting devices 150G, the light-emitting devices 150B, and the light-receiving devices 160 are provided over the insulator 111. In the case where the display apparatus 1000 includes the light-emitting devices 150IR, the light-emitting devices 150IR are provided over the insulator 111.

In the case where the expression "B over A" or "B under A" is used in this specification and the like, for example, A and B do not always need to include a region where they are in contact with each other.

FIG. 26A illustrates a cross-sectional structure example of the light-emitting device 150R, the light-emitting device 150G, and the light-emitting device 150B in FIG. 25A. FIG. 26B illustrates a cross-sectional structure example of the light-receiving device 160 in FIG. 25A.

The light-emitting device 150R includes a conductor 121R functioning as a pixel electrode, a hole-injection layer 85R, a hole-transport layer 86R, a light-emitting layer 87R, an electron-transport layer 88R, a common layer 89, and the conductor 123. The light-emitting device 150G includes a conductor 121G functioning as a pixel electrode, a hole-injection layer 85G, a hole-transport layer 86G, a light-emitting layer 87G, an electron-transport layer 88G, the common layer 89, and the conductor 123. The light-emitting device 150B includes a conductor 121B functioning as a pixel electrode, a hole-injection layer 85B, a hole-transport layer 86B, a light-emitting layer 87B, an electron-transport layer 88B, the common layer 89, and the conductor 123. The light-receiving device 160 includes a conductor 121PD functioning as a pixel electrode, a hole-transport layer 86PD, a light-receiving layer 90, an electron-transport layer 88PD, the common layer 89, and the conductor 123.

As the conductor 121R, the conductor 121G, and the conductor 121B, for example, the conductor 121a, the conductor 121b, and the conductor 121c illustrated in FIG. 19A to FIG. 20B can be used.

The common layer 89 has a function of an electron-injection layer in the light-emitting device 150. Meanwhile, the common layer 89 has a function of an electron-transport layer in the light-receiving device 160. Therefore, the light-receiving device 160 does not necessarily include the electron-transport layer 88PD.

The hole-injection layer 85, the hole-transport layer 86, the electron-transport layer 88, and the common layer 89 can also be referred to as functional layers.

The conductor 121, the hole-injection layer 85, the hole-transport layer 86, the light-emitting layer 87, and the electron-transport layer 88 can each be separately provided for each element. The common layer 89 and the conductor 123 are provided to be shared by the light-emitting device 150R, the light-emitting device 150G, the light-emitting device 150B, and the light-receiving device 160.

The light-emitting device 150 and the light-receiving device 160 may each include a hole-blocking layer and an electron-blocking layer other than the layers illustrated in FIG. 26A. The light-emitting device 150 and the light-receiving device 160 may each include a layer containing, for example, a substance with a bipolar property (a substance with a high electron-transport property and a high hole-transport property).

An insulating layer 92 is provided to cover an end portion of the conductor 121R, an end portion of the conductor 121G, an end portion of the conductor 121B, and an end portion of the conductor 121PD. An end portion of the insulating layer 92 is preferably tapered. The insulating layer 92 is not necessarily provided when not needed.

Note that the insulating layer 92 may be provided to prevent adjacent pixels (e.g., the light-emitting device 150R and the light-emitting device 150G, or the light-emitting device 150G and the light-emitting device 150B) from being electrically short-circuited and emitting light unintentionally, for example. In the case where the light-emitting devices are formed using a metal mask, the insulating layer 92 may be provided to cover end portions of the conductor 121R, the conductor 121G, the conductor 121B, and the conductor 121PD so as to prevent the metal mask from being in contact with the conductor 121R, the conductor 121G, the conductor 121B, and the conductor 121PD. With this structure, the surface of the insulating layer 92 is higher in level than the surfaces of the conductor 121R, the conductor 121G, the conductor 121B, and the conductor 121PD; thus, the metal mask is not in contact with the conductor 121R, the conductor 121G, the conductor 121B, and the conductor 121PD, whereby damage on the surfaces of the conductor 121R, the conductor 121G, the conductor 121B, and the conductor 121PD can be prevented.

For example, the hole-injection layer 85R, the hole-injection layer 85G, the hole-injection layer 85B, and the hole-transport layer 86PD each include a region in contact with the top surface of the conductor 121 and a region in contact with the surface of the insulating layer 92. In addition, an end portion of the hole-injection layer 85R, an end portion of the hole-injection layer 85G, an end portion of the hole-injection layer 85B, and an end portion of the hole-transport layer 86PD are positioned over the insulating layer 92.

A gap is provided between the common layer 89 and the insulating layer 92. This can inhibit contact between the common layer 89 and each of the side surface of the light-emitting layer 87, the side surface of the light-receiving layer 90, the side surface of the hole-transport layer 86, and the side surface of the hole-injection layer 85. Thus, short-circuit in the light-emitting device 150 and short-circuit in the light-receiving device 160 can be inhibited.

The shorter the distance between the light-emitting layers 87 is, for example, the more easily the gap is formed. For example, when the distance is less than or equal to 1 µm, preferably less than or equal to 500 nm, further preferably less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm, the gap can be suitably formed.

A protective layer 91 is provided over the conductor 123. The protective layer 91 has a function of preventing diffusion of impurities such as water into each light-emitting element from above.

The protective layer 91 can have, for example, a single-layer structure or a stacked-layer structure at least including an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, and a hafnium oxide film. Alternatively, a semiconductor material such as an indium gallium oxide and an indium gallium zinc oxide may be used for the protective layer 91.

A stacked-layer film of an inorganic insulating film and an organic insulating film can be used as the protective layer 91. For example, a structure in which an organic insulating film is interposed between a pair of inorganic insulating films is preferable. Furthermore, the organic insulating film preferably functions as a planarization film. With this, the top surface of the organic insulating film can be flat, and accordingly, coverage with the inorganic insulating film thereover is improved, leading to an improvement in barrier property. The top surface of the protective layer 91 is flat, which is preferable because the influence of an uneven shape due to a component below the protective layer 91 can be reduced in the case where a component (e.g., a color filter, an electrode of a touch sensor, and a lens array) is provided above the protective layer 91.

FIG. 26A illustrates the light-emitting device 150 in which the conductor 121, the hole-injection layer 85, the hole-transport layer 86, the light-emitting layer 87, the electron-transport layer 88, the common layer 89 (electron-injection layer), and the conductor 123 are provided in this order from the bottom, and the light-receiving device 160 in which the conductor 121PD, the hole-transport layer 86PD, the light-receiving layer 90, the electron-transport layer 88PD, the common layer 89, and the conductor 123 are provided in this order from the bottom; however, the structure of the light-emitting device or the light-receiving device of an electronic device of one embodiment of the present invention is not limited to this example. For example, the light-emitting device 150 may include a conductor functioning as a pixel electrode, an electron-injection layer, an electron-transport layer, a light-emitting layer, a hole-transport layer, a hole-injection layer, and a conductor functioning as a common electrode in this order from the bottom, and the light-receiving device 160 may include a conductor functioning as a pixel electrode, an electron-transport layer, a light-receiving layer, a hole-transport layer, and a conductor functioning as a common electrode in this order from the bottom. In that case, the hole-injection layer included in the light-emitting device 150 can be a common layer, and the common layer can be provided between the hole-transport layer included in the light-receiving device 160 and the common electrode. In addition, the electron-injection layers can be separated between the light-emitting devices 150.

<Pixel Layout>

Here, a pixel layout that is different from those illustrated in FIG. 25A and FIG. 25B will be described. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, pentile arrangement, and the like.

Examples of a top surface shape of the subpixel include polygons such as a triangle, a quadrangle (including a rectangle and a square), and a pentagon; polygons with rounded corners; an ellipse; and a circle. Here, the top surface shape of the subpixel corresponds to the top surface shape of a light-emitting region of the light-emitting device.

Figure 28A:
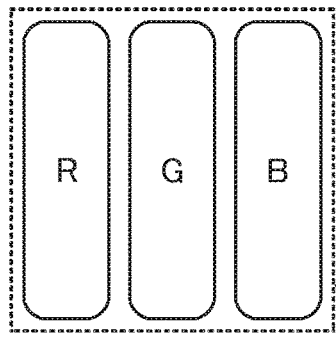
FIG. 28A to FIG. 28F are top views illustrating examples of pixels.

The pixel 180 illustrated in FIG. 27A employs stripe arrangement. The pixel 180 illustrated in FIG. 27A is composed of three subpixels: a subpixel 180a, a subpixel 180b, and a subpixel 180c. For example, as illustrated in FIG. 28A, the subpixel 180a may be a red subpixel R, the subpixel 180b may be a green subpixel G, and the subpixel 180c may be a blue subpixel B.

Figure 28B:
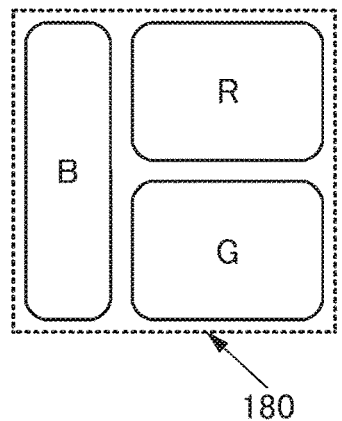

The pixel 180 illustrated in FIG. 27B employs S-stripe arrangement. The pixel 180 illustrated in FIG. 27B is composed of three subpixels: the subpixel 180a, the subpixel 180b, and the subpixel 180c. For example, as illustrated in FIG. 28B, the subpixel 180a may be the blue subpixel B, the subpixel 180b may be the red subpixel R, and the subpixel 180c may be the green subpixel G.

Figure 28C:
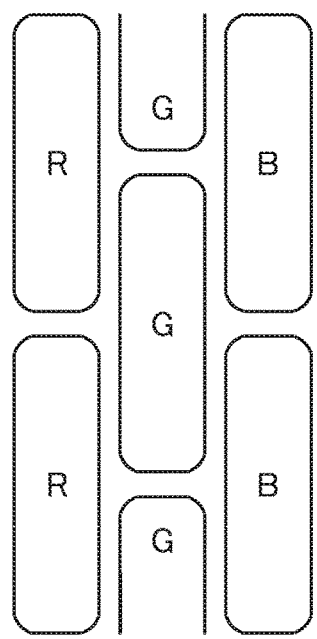

FIG. 27C illustrates an example in which subpixels of different colors are arranged in a zigzag manner. Specifically, the positions of the top sides of two subpixels arranged in the column direction (e.g., the subpixel 180a and the subpixel 180b or the subpixel 180b and the subpixel 180c) are not aligned in the top view. For example, as illustrated in FIG. 28C, the subpixel 180a may be the red subpixel R, the subpixel 180b may be the green subpixel G, and the subpixel 180c may be the blue subpixel B.

Figure 28D:
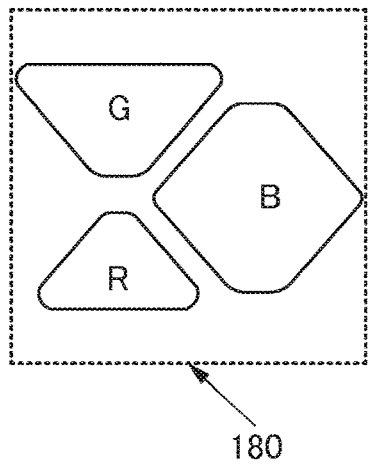

The pixel 180 illustrated in FIG. 27D includes the subpixel 180a whose top surface has a rough trapezoidal shape with rounded corners, the subpixel 180b whose top surface has a rough triangle shape with rounded corners, and the subpixel 180c whose top surface has a rough tetragonal or rough hexagonal shape with rounded corners. The subpixel 180a has a larger light-emitting area than the subpixel 180b. In this manner, the shapes and sizes of the subpixels can be determined independently. For example, the size of a subpixel including a light-emitting device with higher reliability can be smaller. For example, as illustrated in FIG. 28D, the subpixel 180a may be the green subpixel G, the subpixel 180b may be the red subpixel R, and the subpixel 180c may be the blue subpixel B.

Figure 28E:
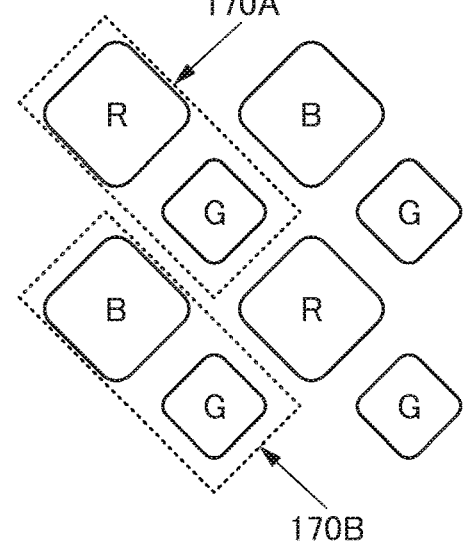

A pixel 170A and a pixel 170B illustrated in FIG. 27E employ pentile arrangement. FIG. 27E illustrates an example in which the pixels 170A including the subpixel 180a and the subpixel 180b and the pixels 170B including the subpixel 180b and the subpixel 180c are alternately arranged. For example, as illustrated in FIG. 28E, the subpixel 180a may be the red subpixel R, the subpixel 180b may be the green subpixel G, and the subpixel 180c may be the blue subpixel B.

Figure 28F:
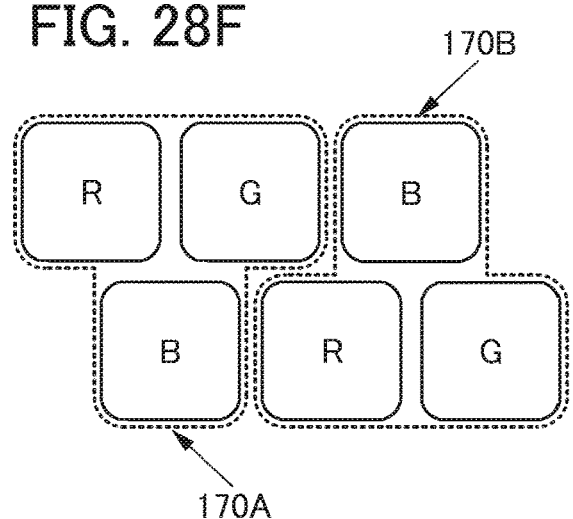

The pixel 170A and the pixel 170B illustrated in FIG. 27F and FIG. 27G employ delta arrangement. The pixel 170A includes two subpixels (the subpixel 180a and the subpixel 180b) in the upper row (first row) and one subpixel (the subpixel 180c) in the lower row (second row). The pixel 170B includes one subpixel (the subpixel 180c) in the upper row (first row) and two subpixels (the subpixel 180a and the subpixel 180b) in the lower row (second row). For example, as illustrated in FIG. 28F, the subpixel 180a may be the red subpixel R, the subpixel 180b may be the green subpixel G, and the subpixel 180c may be the blue subpixel B.

FIG. 27F illustrates an example in which the top surface of each subpixel has a rough quadrangular shape with rounded corners, and FIG. 27G illustrates an example in which the top surface of each subpixel has a circular shape.

In a photolithography method, as a pattern to be processed becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel can have a polygonal shape with rounded corners, an elliptical shape, or a circular shape in some cases.

Furthermore, in the method for fabricating the display apparatus of one embodiment of the present invention, the EL layer is processed into an island shape with the use of a resist mask. A resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film may have a shape different from a desired shape by processing. As a result, the top surface of the EL layer may have a polygonal shape with rounded corners, an elliptical shape, or a circular shape. For example, when a resist mask with a square top surface is intended to be formed, a resist mask with a circular top surface may be formed, and the top surface of the EL layer may be circular.

To obtain a desired top surface shape of the EL layer, a technique of correcting a mask pattern in advance such that a transferred pattern agrees with a design pattern (OPC (Optical Proximity Correction) technique) may be used. Specifically, with the OPC technique, a pattern for correction is added to a corner portion or the like of a figure on a mask pattern.

The pixels 180 illustrated in FIG. 29A to FIG. 29C employ stripe arrangement.

FIG. 29A illustrates an example in which each subpixel has a rectangular top surface shape, FIG. 29B illustrates an example in which each subpixel has a top surface shape formed by combining two half circles and a rectangle, and FIG. 29C illustrates an example in which each subpixel has an elliptical top surface shape.

The pixels 180 illustrated in FIG. 29D to FIG. 29F employ matrix arrangement.

FIG. 29D illustrates an example in which each subpixel has a square top surface shape, FIG. 29E illustrates an example in which each subpixel has a rough square top surface shape with rounded corners, and FIG. 29F illustrates an example in which each subpixel has a circular top surface shape.

Figure 30A:
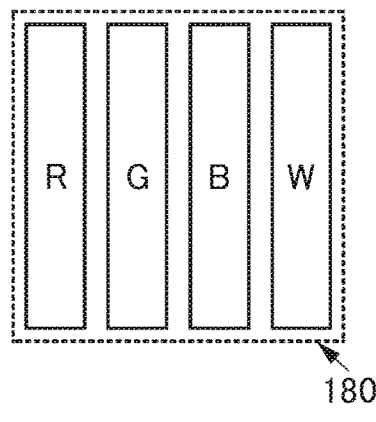
FIG. 30A to FIG. 30D are top views illustrating examples of pixels.
Figure 30B:
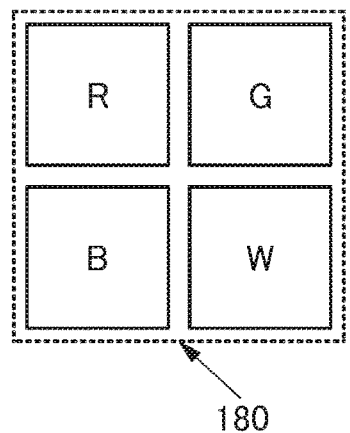

The pixels 180 illustrated in FIG. 29A to FIG. 29F are each composed of four subpixels: the subpixel 180a, the subpixel 180b, the subpixel 180c, and a subpixel 180d. The subpixel 180a, the subpixel 180b, the subpixel 180c, and the subpixel 180d emit light of different colors. For example, the subpixel 180a, the subpixel 180b, the subpixel 180c, and the subpixel 180d can be red, green, blue, and white subpixels, respectively, as illustrated in FIG. 30A and FIG. 30B. Alternatively, the subpixel 180a, the subpixel 180b, the subpixel 180c, and the subpixel 180d can be red, green, blue, and infrared-light subpixels, respectively.

The subpixel 180d includes a light-emitting device. The light-emitting device includes, for example, a pixel electrode, an EL layer, and the conductor 121CM functioning as a common electrode. For the pixel electrode, a material similar to those for the conductor 121a, the conductor 121b, the conductor 121c, the conductor 122a, the conductor 122b, and the conductor 122c can be used. For the EL layer, a material similar to that for the EL layer 141a, the EL layer 141b, and the EL layer 141c can be used, for example.

FIG. 29G illustrates an example in which one pixel 180 is composed of two rows and three columns. The pixel 180 includes three subpixels (the subpixel 180a, the subpixel 180b, and the subpixel 180c) in the upper row (first row) and three subpixels 180d in the lower row (second row). In other words, the pixel 180 includes the subpixel 180a and the subpixel 180d in the left column (first column), the subpixel 180b and another subpixel 180d in the center column (second column), and the subpixel 180c and another subpixel 180d in the right column (third column). Matching the positions of the subpixels in the upper row and the lower row as illustrated in FIG. 29G enables dust and the like that would be produced in the manufacturing process to be removed efficiently. Thus, a display apparatus with high display quality can be provided.

FIG. 29H illustrates an example in which one pixel 180 is composed of two rows and three columns. The pixel 180 includes three subpixels (the subpixel 180a, the subpixel 180b, and the subpixel 180c) in the upper row (first row) and one subpixel (the subpixel 180d) in the lower row (second row). In other words, the pixel 180 includes the subpixel 180a in the left column (first column), the subpixel 180b in the center column (second column), the subpixel 180c in the right column (third column), and the subpixel 180d across these three columns.

Figure 30C:
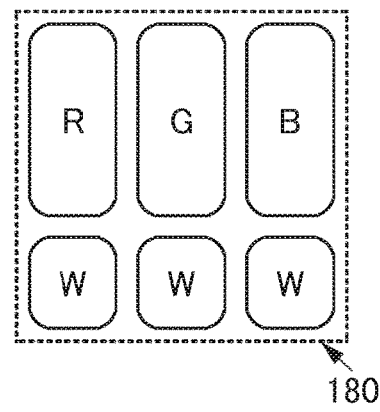
Figure 30D:
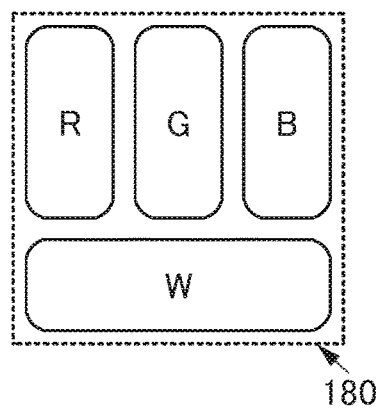

In the pixel 180 illustrated in each of FIG. 29G and FIG. 29H, for example, the subpixel 180a can be the red subpixel R, the subpixel 180b can be the green subpixel G, the subpixel 180c can be the blue subpixel B, and the subpixel 180d can be a white subpixel W, as illustrated in FIG. 30C and FIG. 30D.

The display apparatus of one embodiment of the present invention may include a light-receiving device in the pixel.

Three of the four subpixels included in the pixel 180 illustrated in FIG. 29G may each include a light-emitting device and the other one may include a light-receiving device.

For example, a pn-type or pin-type light-receiving device can be used as the light-receiving device. The light-receiving device functions as a photoelectric conversion device (also referred to as a photoelectric conversion element) that detects light entering the light-receiving device and generates charge. The amount of charge generated from the light-receiving device depends on the amount of light entering the light-receiving device.

It is particularly preferable to use, as the light-receiving device, an organic light-receiving device including a layer containing an organic compound. An organic light-receiving device, which is easily made thin, lightweight, and large in area and has a high degree of freedom for shape and design, can be used in a variety of display apparatuses.

In one embodiment of the present invention, an organic EL device is used as the light-emitting device, and an organic light-receiving device is used as the light-receiving device. The organic EL device and the organic light-receiving device can be formed over the same substrate. Thus, the organic light-receiving device can be incorporated in the display apparatus including the organic EL device.

The light-receiving device includes at least an active layer that functions as a photoelectric conversion layer between a pair of electrodes. In this specification and the like, one of the pair of electrodes may be referred to as a pixel electrode and the other may be referred to as a common electrode.

For example, the subpixel 180a, the subpixel 180b, and the subpixel 180c may be subpixels for three colors of red (R), green (G), and blue (B), and the subpixel 180d may be a subpixel including the light-receiving device. In that case, a fourth layer includes at least an active layer.

One of the pair of electrodes of the light-receiving device functions as an anode, and the other electrode functions as a cathode. Hereinafter, the case where the pixel electrode functions as an anode and the common electrode functions as a cathode is described as an example. When the light-receiving device is driven by application of reverse bias between the pixel electrode and the common electrode, light entering the light-receiving device can be detected and charge can be generated and extracted as current. Alternatively, the pixel electrode may function as a cathode and the common electrode may function as an anode.

A fabrication method similar to that of the light-emitting device can be employed for the light-receiving device. An island-shaped active layer (also referred to as a photoelectric conversion layer) included in the light-receiving device is formed by processing a film that is to be the active layer and formed on the entire surface, not by using a pattern of a metal mask; thus, the island-shaped active layer with a uniform thickness can be formed. In addition, a sacrificial layer provided over the active layer can reduce damage to the active layer in the fabrication process of the display apparatus, increasing the reliability of the light-receiving device.

Here, a layer shared by the light-receiving device and the light-emitting device might have different functions in the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device might have the same function in both the light-emitting device and the light-receiving device. A hole-transport layer functions as a hole-transport layer in both the light-emitting device and the light-receiving device, and an electron-transport layer functions as an electron-transport layer in both the light-emitting device and the light-receiving device.

The active layer included in the light-receiving device includes a semiconductor. Examples of the semiconductor include an inorganic semiconductor such as silicon and an organic semiconductor including an organic compound. This embodiment describes an example in which an organic semiconductor is used as the semiconductor included in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material contained in the active layer include electron-accepting organic semiconductor materials such as fullerene (e.g., $C_{60}$ and $C_{70}$) and fullerene derivatives. Fullerene has a soccer ball-like shape, which is energetically stable. Both the HOMO (highest occupied molecular orbital) level and the LUMO (lowest unoccupied molecular orbital) level of fullerene are deep (low). Having a deep LUMO level, fullerene has an extremely high electron-accepting property (acceptor property). In general, when I-electron conjugation (resonance) spreads in a plane as in benzene, an electron-donating property (donor property) becomes high; however, since fullerene has a spherical shape, fullerene has a high electron-accepting property even when I-electron conjugation widely spreads therein. The high electron-accepting property efficiently causes rapid charge separation and is useful for the light-receiving device. Both $C_{60}$ and $C_{70}$ have a wide absorption band in the visible light region, and $C_{70}$ is especially preferable because of having a larger x-electron conjugation system and a wider absorption band in the long wavelength region than $C_{60}$. Other examples of fullerene derivatives include [6,6]-Phenyl-$C_{71}$-butyric acid methyl ester (abbreviation: PC70BM), [6,6]-Phenyl-C61-butyric acid methyl ester (abbreviation: PC60BM), and 1',1'',4',4''-Tetrahydro-di[1,4]methanonaphthaleno[1,2:2',3',56,60:2'',3''][5,6]fullerene-C60 (abbreviation: ICBA).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Other examples of a p-type semiconductor material include a carbazole derivative, a thiophene derivative, a furan derivative, and a compound having an aromatic amine skeleton. Other examples of a p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer is preferably formed by co-evaporation of an n-type semiconductor and a p-type semiconductor. Alternatively, the active layer may be formed by stacking an n-type semiconductor and a p-type semiconductor.

In addition to the active layer, the light-receiving device may further include a layer containing any of a substance with a high hole-transport property, a substance with a high electron-transport property, or a substance with a bipolar property (a substance with a high electron-transport property and a high hole-transport property). Without limitation to the above, a layer containing one or more selected from a substance with a high hole-injection property, a hole-blocking material, a material with a high electron-injection property, and an electron-blocking material may be further included.

Either a low molecular compound or a high molecular compound can be used in the light-receiving device, and an inorganic compound may also be included. Each layer included in the light-receiving device can be formed by an evaporation method (including a vacuum evaporation method), a transfer method, a printing method, an inkjet method, or a coating method.

As the hole-transport material, a high molecular compound such as poly(3,4-ethylenedioxythiophene)/poly(styrenesulfonic acid) (PEDOT/PSS), or an inorganic compound such as a molybdenum oxide and copper iodide (CuI) can be used, for example. As the electron-transport material, an inorganic compound such as zinc oxide (ZnO) can be used.

For the active layer, a high molecular compound such as Poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

The active layer may contain a mixture of three or more kinds of materials. For example, a third material may be mixed with an n-type semiconductor material and a p-type semiconductor material in order to extend the wavelength range. In that case, the third material may be a low molecular compound or a high molecular compound.

In the display apparatus including the light-emitting device and the light-receiving device in the pixel, the pixel has a light-receiving function, which enables detection of a touch or approach of an object while an image is displayed. For example, all the subpixels included in the display apparatus can display an image; alternatively, some of the subpixels can emit light as a light source and the other subpixels can display an image.

In the display apparatus of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by detecting light with the display portion, an image can be captured or an approach or touch of an object (e.g., a finger, a hand, or a pen) can be detected. Furthermore, in the display apparatus of one embodiment of the present invention, the light-emitting devices can be used as a light source of the sensor. Accordingly, a light-receiving portion and a light source do not need to be provided separately from the display apparatus; hence, the number of components of an electronic device can be reduced.

In the display apparatus of one embodiment of the present invention, when an object reflects (or scatters) light emitted from the light-emitting device included in the display portion, the light-receiving device can detect reflected light (or scattered light); thus, image capturing or touch detection is possible even in a dark place.

In the case where the light-receiving devices are used as the image sensor, the display apparatus can capture an image with the use of the light-receiving devices. For example, the display apparatus of this embodiment can be used as a scanner.

For example, data on biological information such as a fingerprint or a palm print can be obtained with the use of the image sensor. That is, a biometric authentication sensor can be incorporated in the display apparatus. When the display apparatus incorporates a biometric authentication sensor, the number of components of an electronic device can be reduced as compared to the case where a biometric authentication sensor is provided separately from the display apparatus; thus, the size and weight of the electronic device can be reduced.

In the case where the light-receiving devices are used as the touch sensor, the display apparatus can detect an approach or touch of an object with the use of the light-receiving devices.

Pixels illustrated in FIG. 31A to FIG. 31D each include the subpixel G, the subpixel B, the subpixel R, and the subpixel PS.

Figure 31A:
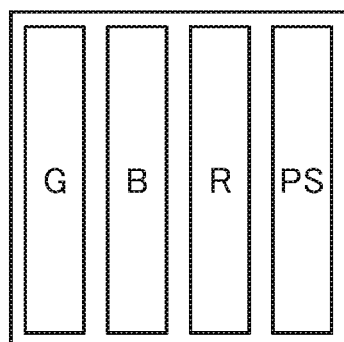
FIG. 31A to FIG. 31D are top views illustrating examples of pixels.
Figure 31B:
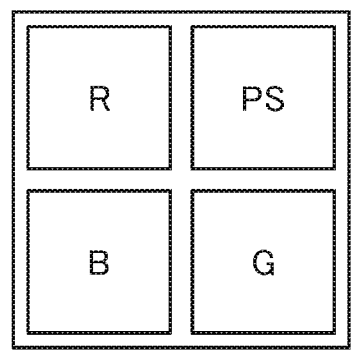

The pixel illustrated in FIG. 31A employs stripe arrangement. The pixel illustrated in FIG. 31B employs matrix arrangement.

Figure 31C:
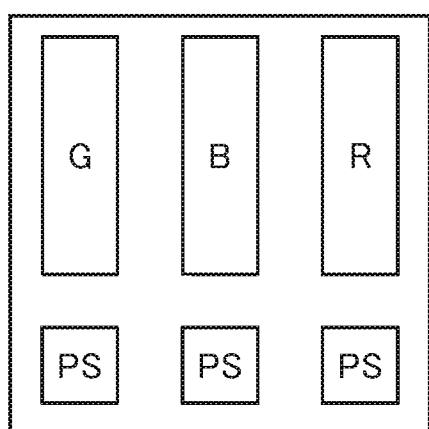
Figure 31D:
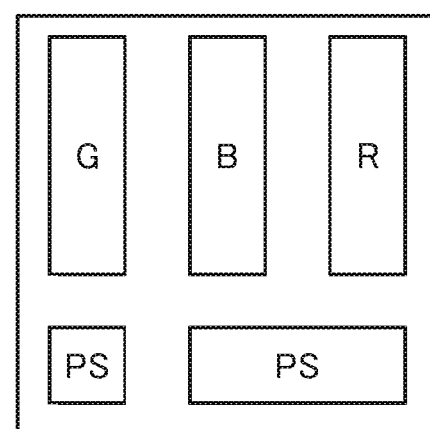

FIG. 31C and FIG. 31D illustrate an example in which one pixel is provided in two rows and three columns. Three subpixels (the subpixel G, the subpixel B, and the subpixel R) are provided in the upper row (first row). In FIG. 31C, three subpixels PS are provided in the lower row (second row). In FIG. 31D, two subpixels PS are provided in the lower row (second row). Aligning the positions of the subpixels in the upper row and the lower row as illustrated in FIG. 31C enables foreign matter such as dust that would be produced in the manufacturing process to be removed efficiently. Thus, a display apparatus with high display quality can be provided. Note that the layout of the subpixels is not limited to the structures illustrated in FIG. 31A to FIG. 31D.

Each of the subpixel R, the subpixel G, and the subpixel B includes a light-emitting device that emits white light. In each of the subpixel R, the subpixel G, and the subpixel B, the corresponding coloring layer is provided to overlap with the light-emitting device.

The subpixel PS includes a light-receiving device. There is no particular limitation on the wavelength of light detected by the subpixel PS.

The light-receiving device included in the subpixel PS preferably detects visible light, and preferably detects one or more of blue light, violet light, bluish violet light, green light, yellowish green light, yellow light, orange light, and red light, for example. The light-receiving device included in the subpixel PS may detect infrared light.

Figure 31E:
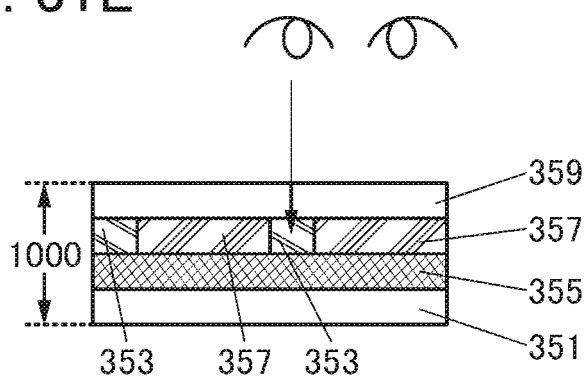
FIG. 31E is a cross-sectional view illustrating an example of a display apparatus.

The display apparatus 1000 illustrated in FIG. 31E includes, between a substrate 351 and a substrate 359, a layer 353 including a light-receiving device, a functional layer 355, and a layer 357 including a light-emitting device.

The functional layer 355 includes a circuit for driving a light-receiving device and a circuit for driving a light-emitting device. For example, a switch, a transistor, a capacitor, a resistor, a wiring, and a terminal can be provided in the functional layer 355. Note that in the case where the light-emitting device and the light-receiving device are driven by a passive-matrix method, a structure including neither a switch nor a transistor may be employed.

For example, after light emitted from the light-emitting device in the layer 357 including the light-emitting device is reflected by a human eye and its surroundings as illustrated in FIG. 31E, the light-receiving device in the layer 353 including the light-receiving device detects the reflected light. Accordingly, information of the surroundings, surface, or inside of the human eye (e.g., the number of times of eye blinking, the movement of an eyeball, and the movement of an eyelid) can be detected.

Note that the insulators, the conductors, and the semiconductors disclosed in this specification and the like can be formed by a PVD (Physical Vapor Deposition) method or a CVD method. Examples of a PVD method include a sputtering method, a resistance heating evaporation method, an electron beam evaporation method, and a PLD method. The formation by a plasma CVD method or a thermal CVD method can be given as a CVD method. In particular, examples of a thermal CVD method include an MOCVD (Metal Organic Chemical Vapor Deposition) method and an ALD method.

A thermal CVD method, which is a deposition method not using plasma, has an advantage that a defect due to plasma damage is not generated.

Deposition by a thermal CVD method may be performed in the following manner: a source gas and an oxidizer are supplied into a chamber at a time, the pressure in the chamber is set to an atmospheric pressure or a reduced pressure, and they are made to react with each other in the vicinity of the substrate or over the substrate to be deposited over the substrate.

Deposition by an ALD method may be performed in the following manner: pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves); in order to avoid mixing of the plurality of kinds of source gases, an inert gas (e.g., argon or nitrogen) or the like is introduced at the same time as or after introduction of a first source gas and then a second source gas is introduced. Note that in the case where the first source gas and the inert gas are introduced at a time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on the surface of the substrate to deposit a first thin layer, and then the second source gas is introduced to react with the first thin layer; as a result, a second thin layer is stacked over the first thin layer, so that a thin film is formed. The sequence of the gas introduction is controlled and repeated a plurality of times until a desired thickness is obtained, so that a thin film with excellent step coverage can be formed. The thickness of the thin film can be adjusted by the number of repetition times of the sequence of the gas introduction; therefore, an ALD method makes it possible to accurately adjust the thickness and is thus suitable for fabricating a minute FET.

A variety of films such as the metal film, the semiconductor film, or the inorganic insulating film disclosed in the above-described embodiments can be formed by a thermal CVD method such as an MOCVD method and an ALD method; for example, in the case of depositing an In—Ga—Zn—O film, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can also be used instead of trimethylgallium, and diethylzinc ($Zn(C_2H_5)_2$) can also be used instead of dimethylzinc.

For example, in the case where a hafnium oxide film is formed with a deposition apparatus utilizing an ALD method, two kinds of gases, ozone ($O_3$) as an oxidizer and a source gas which is obtained by vaporizing liquid containing a solvent and a hafnium precursor compound (e.g., hafnium alkoxide or hafnium amide such as tetrakis(dimethylamide)hafnium (TDMAH, $Hf[N(CH_3)_2]_4$)), are used. Examples of another material include tetrakis(ethylmethylamide)hafnium.

For example, in the case where an aluminum oxide film is formed with a deposition apparatus utilizing an ALD method, two kinds of gases, $H_2O$ as an oxidizer and a source gas which is obtained by vaporizing liquid containing a solvent and an aluminum precursor compound (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus utilizing an ALD method, hexachlorodisilane is adsorbed on a surface on which a film is to be formed, and radicals of an oxidizing gas (e.g., $O_2$ and dinitrogen monoxide) are supplied to react with the adsorbate.

For example, in the case where a tungsten film is deposited by a deposition apparatus utilizing an ALD method, a $WF_6$ gas and a $B_2H_6$ gas are sequentially and repeatedly introduced to form an initial tungsten film, and then a $WF_6$ gas and an $H_2$ gas are sequentially and repeatedly introduced to form a tungsten film. Note that a $SiH_4$ gas may be used instead of a $B_2H_6$ gas.

In the case where an In—Ga—Zn—O film is deposited as an oxide semiconductor film with a deposition apparatus utilizing an ALD method, for example, a precursor (generally referred to as a metal precursor or the like in some cases) and an oxidizer (generally referred to as a reactant, a non-metal precursor, or the like in some cases) are sequentially and repeatedly introduced. Specifically, for example, an $In(CH_3)_3$ gas as a precursor and an $O_3$ gas as an oxidizer are introduced to form an In—O layer; a $Ga(CH_3)_3$ gas as a precursor and an $O_3$ gas as an oxidizer are introduced to form a GaO layer; and then, a $Zn(CH_3)_2$ gas as a precursor and an $O_3$ gas as an oxidizer are introduced to form a ZnO layer. Note that the order of these layers is not limited to this example. A mixed oxide layer such as an In—Ga—O layer, an In—Zn—O layer, or a Ga—Zn—O layer may be formed with the use of these gases. Note that although an $H_2O$ gas which is obtained by bubbling water with an inert gas such as Ar may be used instead of an $O_3$ gas, it is preferable to use an $O_3$ gas which does not contain H. Furthermore, instead of an $In(CH_3)_3$ gas, an $In(C_2H_5)_3$ gas may be used. Furthermore, instead of a $Ga(CH_3)_3$ gas, a $Ga(C_2H_5)_3$ gas may be used. Furthermore, a $Zn(CH_3)_2$ gas may be used.

There is no particular limitation on the screen ratio (aspect ratio) of the display portion of the electronic device of one embodiment of the present invention. For example, the display portion is compatible with a variety of screen ratios such as 1:1 (a square), 4:3, 16:9, and 16:10.

There is no particular limitation on the shape of the display portion of the electronic device of one embodiment of the present invention. The display portion can have any of various shapes such as a rectangular shape, a polygonal shape (e.g., octagon), a circular shape, and an elliptical shape.

Note that this embodiment can be combined with any of the other embodiments described in this specification as appropriate.

Embodiment 5

In this embodiment, a display module that can be used for the electronic device of one embodiment of the present invention will be described.

Structure Example of Display Module

First, a display module including the display apparatus that can be used for the electronic device of one embodiment of the present invention will be described.

Figure 32A:
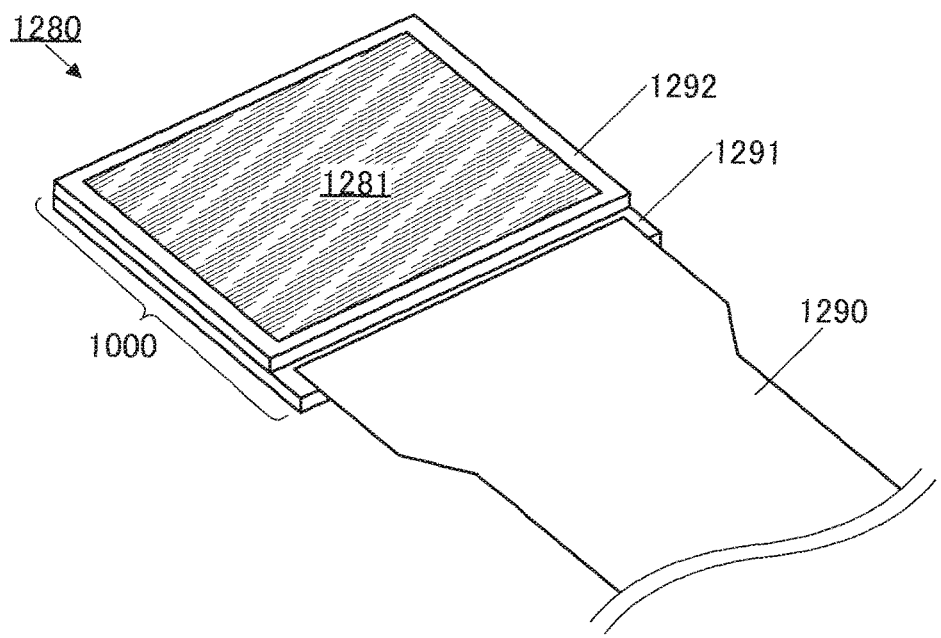
FIG. 32A and FIG. 32B are diagrams illustrating a structure example of a display module.

FIG. 32A is a perspective view of a display module 1280. The display module 1280 includes the display apparatus 1000 and an FPC 1290.

The display module 1280 includes a substrate 1291 and a substrate 1292. The display module 1280 includes a display portion 1281. The display portion 1281 is a region of the display module 1280 where an image is displayed, and is a region where light emitted from pixels provided in a pixel portion 1284 described later can be seen.

Figure 32B:
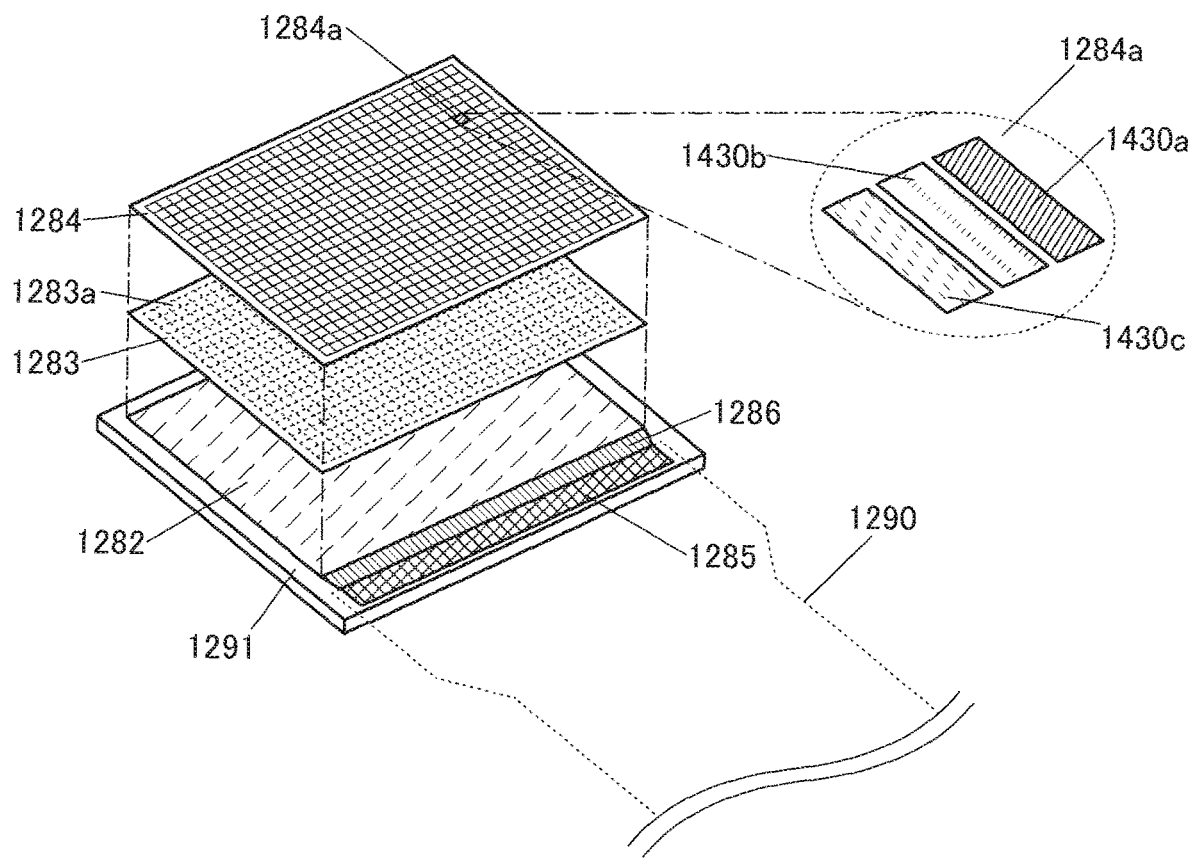

FIG. 32B is a perspective view schematically illustrating a structure on the substrate 1291 side. A circuit portion 1282, a pixel circuit portion 1283 over the circuit portion 1282, and the pixel portion 1284 over the pixel circuit portion 1283 are stacked over the substrate 1291. In addition, a terminal portion 1285 for connection to the FPC 1290 is provided in a portion not overlapping with the pixel portion 1284 over the substrate 1291. The terminal portion 1285 and the circuit portion 1282 are electrically connected to each other through a wiring portion 1286 formed of a plurality of wirings.

Note that the pixel portion 1284 and the pixel circuit portion 1283 correspond to the pixel layer PXAL described above, for example. The circuit portion 1282 corresponds to the circuit layer SICL described above, for example.

The pixel portion 1284 includes a plurality of pixels 1284*a* arranged periodically. An enlarged view of one pixel 1284*a* is illustrated on the right side in FIG. 32B. The pixel 1284*a* includes a light-emitting device 1430*a*, a light-emitting device 1430*b*, and a light-emitting device 1430*c* that emit light of different colors. Note that the light-emitting device 1430*a*, the light-emitting device 1430*b*, and the light-emitting device 1430*c* (e.g., the plurality of light-emitting devices described above corresponding to the light-emitting device 150*a*, the light-emitting device 150*b*, and the light-emitting device 150*c* described above) may be arranged in a stripe pattern as illustrated in FIG. 32B. Alternatively, a variety of arrangement methods, such as delta arrangement and pentile arrangement, can be employed.

The pixel circuit portion 1283 includes a plurality of pixel circuits 1283*a* arranged periodically.

One pixel circuit 1283*a* is a circuit that controls light emission from three light-emitting devices included in one pixel 1284*a*. One pixel circuit 1283*a* may be provided with three circuits each of which controls light emission from one light-emitting device. For example, the pixel circuit 1283*a* can include at least one selection transistor, one current control transistor (driving transistor), and a capacitor for one light-emitting device. In that case, a gate signal is input to a gate of the selection transistor, and a source signal is input to one of a source and a drain of the selection transistor. Thus, an active-matrix display apparatus is achieved.

The circuit portion 1282 includes a circuit for driving the pixel circuits 1283*a* in the pixel circuit portion 1283. For example, one or both of a gate line driver circuit and a source line driver circuit are preferably included. In addition, one or more selected from an arithmetic circuit, a memory circuit, and a power supply circuit may be included.

The FPC 1290 functions as a wiring for supplying a video signal or a power supply potential to the circuit portion 1282 from the outside. In addition, an IC may be mounted on the FPC 1290.

The display module 1280 can have a structure in which one or both of the pixel circuit portion 1283 and the circuit portion 1282 are stacked below the pixel portion 1284; thus, the aperture ratio (the effective display area ratio) of the display portion 1281 can be significantly high. For example, the aperture ratio of the display portion 1281 can be higher than or equal to 40% and lower than 100%, preferably higher than or equal to 50% and lower than or equal to 95%, further preferably higher than or equal to 60% and lower than or equal to 95%. Furthermore, the pixels 1284*a* can be arranged extremely densely and thus the display portion 1281 can have an extremely high resolution. For example, the pixels 1284*a* are preferably arranged in the display portion 1281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 1280 has an extremely high resolution and thus can be suitably used for a VR device such as a head-mounted display or a glasses-type AR device. For example, even with a structure in which the display portion of the display module 1280 is seen through a lens, pixels of the extremely-high-resolution display portion 1281 included in the display module 1280 are prevented from being perceived when the display portion is enlarged by the lens, so that display providing a strong sense of immersion can be performed. Without being limited thereto, the display module 1280 can be suitably used for electronic devices including relatively small display portions. For example, the display module 1280 can be suitably used for a display portion of a wearable electronic device such as a wristwatch.

Note that this embodiment can be combined with any of the other embodiments described in this specification as appropriate.

Embodiment 6

In this embodiment, electronic devices each including a display apparatus will be described as examples of an electronic device of one embodiment of the present invention.

Figure 33A:
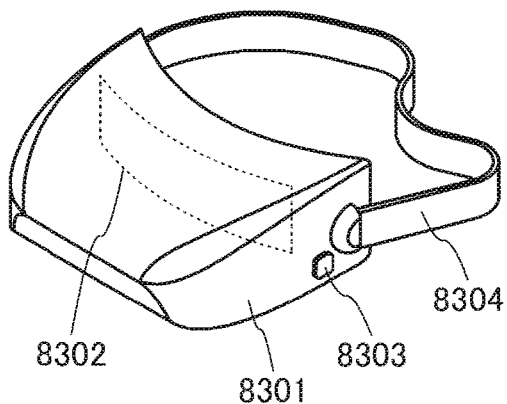
FIG. 33A to FIG. 33F are diagrams illustrating a structure example of an electronic device.
Figure 33B:
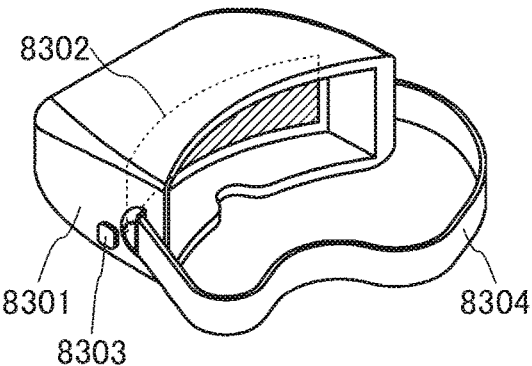

FIG. 33A and FIG. 33B each illustrate an appearance of an electronic device 8300 that is a head-mounted display.

The electronic device 8300 includes a housing 8301, a display portion 8302, an operation button 8303, and a band-shaped fixing unit 8304.

The operation button 8303 has a function of a power button or the like. The electronic device 8300 may include a button other than the operation button 8303.

Figure 33C:
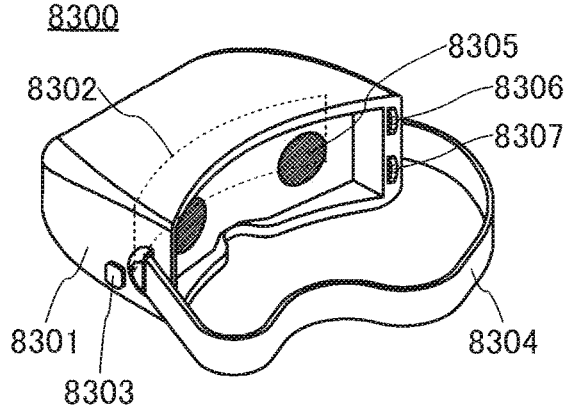

As illustrated in FIG. 33C, lenses 8305 may be included between the display portion 8302 and the positions of the user's eyes. The user can see magnified images on the display portion 8302 through the lenses 8305, leading to a higher realistic sensation. In that case, as illustrated in FIG. 33C, a dial 8306 for changing the positions of the lenses and adjusting visibility may be included.

For the display portion 8302, a display apparatus with an extremely high resolution is preferably used, for example. When a high-resolution display apparatus is used for the display portion 8302, it is possible to display a more realistic video that does not allow the user to perceive pixels even when the image is magnified using the lenses 8305 as illustrated in FIG. 33C.

FIG. 33A to FIG. 33C illustrate an example in which one display portion 8302 is provided. Such a structure can reduce the number of components.

The display portion 8302 can display an image for the right eye and an image for the left eye side by side on a right region and a left region, respectively. Thus, a three-dimensional video using binocular disparity can be displayed.

One image that can be seen by both eyes may be displayed on the entire display portion 8302. A panorama video can thus be displayed from end to end of the field of view, which can provide a stronger sense of reality.

Here, the electronic device 8300 preferably has, for example, a mechanism for changing the curvature of the display portion 8302 to an optimal value in accordance with one or more selected from the size of the user's head and the positions of the user's eyes. For example, the user himself or herself may adjust the curvature of the display portion 8302 by operating a dial 8307 for adjusting the curvature of the display portion 8302. Alternatively, a sensor for detecting the size of the user's head or the positions of the user's eyes (e.g., a camera, a contact sensor, and a noncontact sensor) may be provided on the housing 8301, and a mechanism for adjusting the curvature of the display portion 8302 on the basis of detection data obtained by the sensor may be provided.

In the case where the lenses 8305 are used, a mechanism for adjusting the positions and angle of the lenses 8305 in synchronization with the curvature of the display portion 8302 is preferably provided. Alternatively, the dial 8306 may have a function of adjusting the angle of the lenses.

Figure 33D:
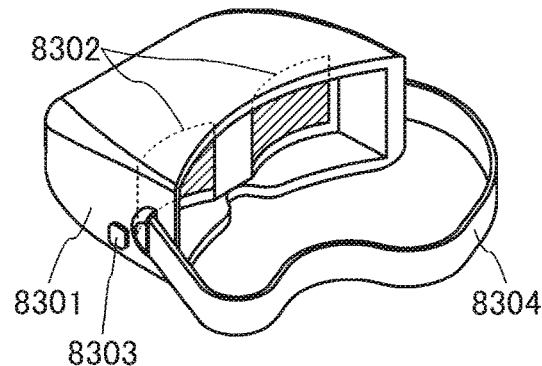
Figure 33E:
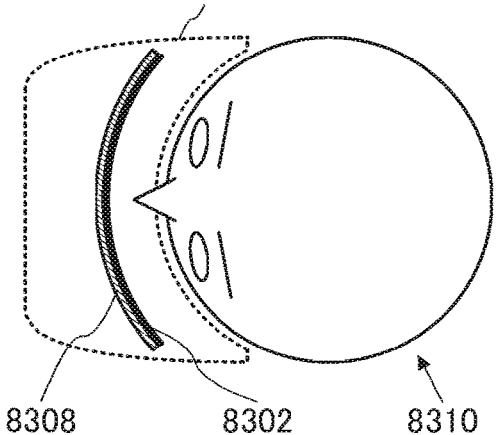
Figure 33F:
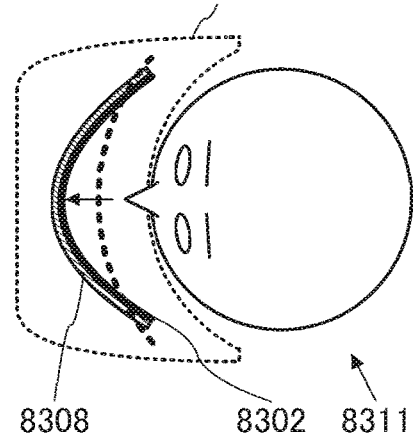

FIG. 33E and FIG. 33F illustrate an example in which a driver portion 8308 controlling the curvature of the display portion 8302 is provided. The driver portion 8308 is fixed to at least part of the display portion 8302. The driver portion 8308 has a function of changing the shape of the display portion 8302 when the part that is fixed to the display portion 8302 changes in shape or moves.

FIG. 33E is a schematic view illustrating the case where a user 8310 having a relatively large head wears the housing 8301. In that case, the driver portion 8308 adjusts the shape of the display portion 8302 such that the curvature is relatively small (the radius of curvature is large).

By contrast, FIG. 33F illustrates the case where a user 8311 having a smaller head than the user 8310 wears the housing 8301. The user 8311 has a shorter distance between the eyes than the user 8310. In that case, the driver portion 8308 adjusts the shape of the display portion 8302 such that the curvature of the display portion 8302 is large (the radius of curvature is small). In FIG. 33F, the position and shape of the display portion 8302 in FIG. 33E are denoted by a dashed line.

When the electronic device 8300 has such a mechanism for adjusting the curvature of the display portion 8302, an optimal display can be offered to a variety of users of all ages and genders.

When the curvature of the display portion 8302 is changed in accordance with contents displayed on the display portion 8302, the user can have a more realistic sensation. For example, shaking can be expressed by fluctuating the curvature of the display portion 8302. In this way, it is possible to produce various effects depending on the scene in contents, and provide the user with new experiences. A further realistic display can be provided when the display portion 8302 operates in conjunction with a vibration module provided in the housing 8301.

Note that the electronic device 8300 may include two display portions 8302 as illustrated in FIG. 33D.

Since the two display portions 8302 are included, the user's eyes can see their respective display portions. This allows a high-definition video to be displayed even when three-dimensional display using parallax is performed. In addition, the display portion 8302 is curved around an arc with the user's eye as an approximate center. This allows a uniform distance between the user's eye and the display surface of the display portion; thus, the user can see a more natural video. Even when the luminance or chromaticity of light from the display portion is changed depending on the angle at which the user sees it, since the user's eye is positioned in a normal direction of the display surface of the display portion, the influence of the change can be substantially ignorable and thus a more realistic video can be displayed.

Figure 34A:
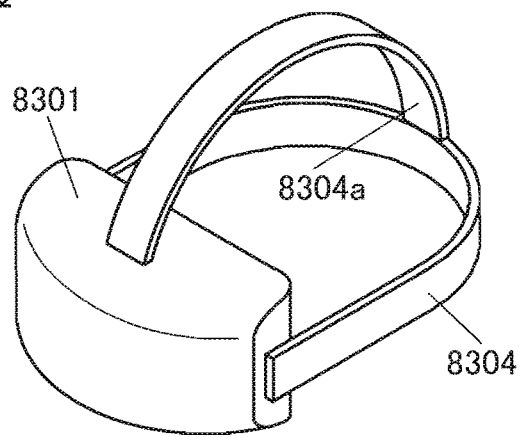
FIG. 34A to FIG. 34D are diagrams illustrating structure examples of electronic devices.
Figure 34B:
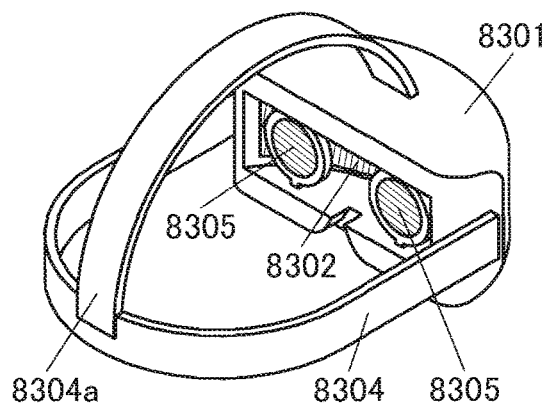
Figure 34C:
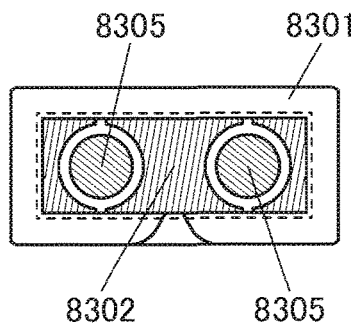

FIG. 34A to FIG. 34C are diagrams illustrating an appearance of another electronic device 8300, which is different from the electronic devices 8300 illustrated in FIG. 33A to FIG. 33D. Specifically, FIG. 34A to FIG. 34C are different from FIG. 33A to FIG. 33D in including a fixing unit 8304a worn on a head and a pair of lenses 8305, for example.

The user can see display on the display portion 8302 through the lenses 8305. The display portion 8302 is preferably curved so that the user can feel high realistic sensation. Another image displayed on another region of the display portion 8302 is seen through the lenses 8305, so that three-dimensional display using parallax can be performed. Note that the structure is not limited to the structure in which one display portion 8302 is provided; two display portions 8302 may be provided and one display portion may be provided per eye of the user.

For the display portion 8302, a display apparatus with an extremely high resolution is preferably used, for example. When a high-resolution display apparatus is used for the display portion 8302, it is possible to display a more realistic video that does not allow the user to perceive pixels even when the video is magnified using the lenses 8305 as illustrated in FIG. 34C. The head-mounted display, which is an electronic device of one embodiment of the present invention, may be an electronic device 8200 illustrated in FIG. 34D, which is a glasses-type head-mounted display.

The electronic device 8200 includes a mounting portion 8201, a lens 8202, a main body 8203, a display portion 8204, a cable 8205, and the like. A battery 8206 is incorporated in the mounting portion 8201.

The cable 8205 supplies power from the battery 8206 to the main body 8203. The main body 8203 includes a wireless receiver and can display received video information on the display portion 8204. The main body 8203 includes a camera, and information on the movement of the eyeballs or the eyelids of the user can be used as an input means.

The mounting portion 8201 may include a plurality of electrodes capable of sensing current flowing accompanying with the movement of the user's eyeballs at a position in contact with the user to recognize the user's gaze. The mounting portion 8201 may also have a function of monitoring the user's pulse with use of current flowing through the electrodes. The mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, and the like.

Figure 34D:
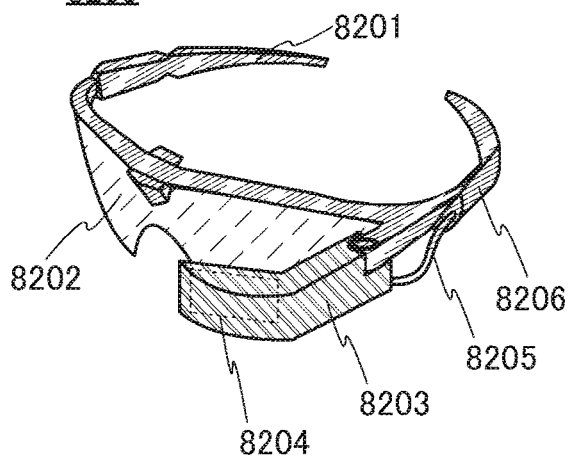
Figure 35A:
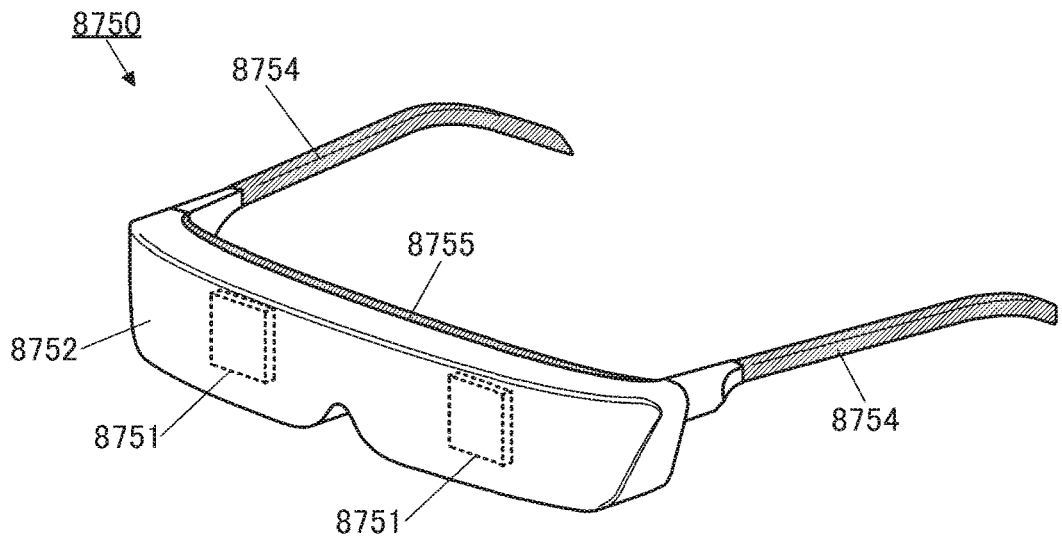
FIG. 35A to FIG. 35C are diagrams illustrating a structure example of an electronic device.
Figure 35B:
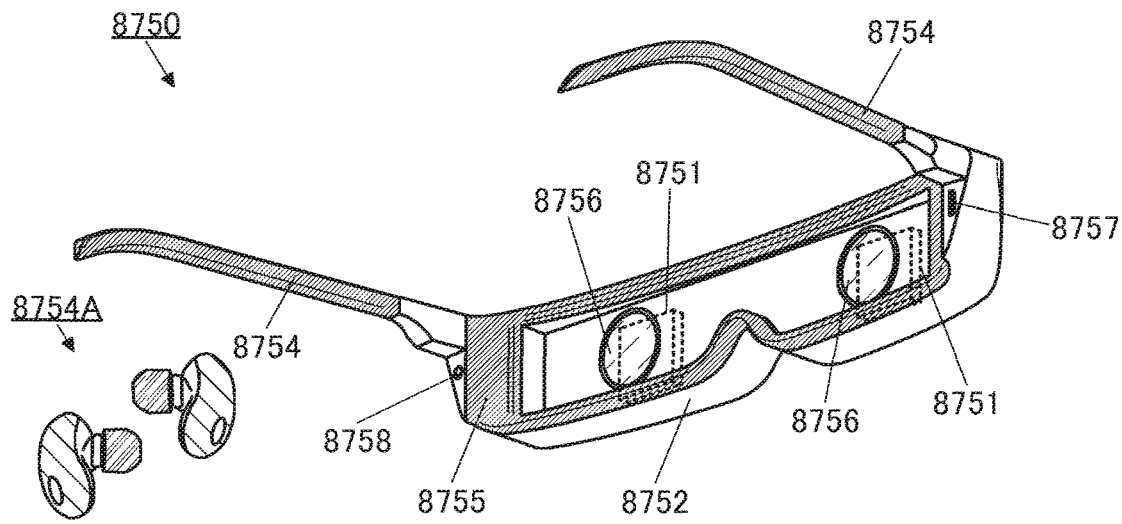
Figure 35C:
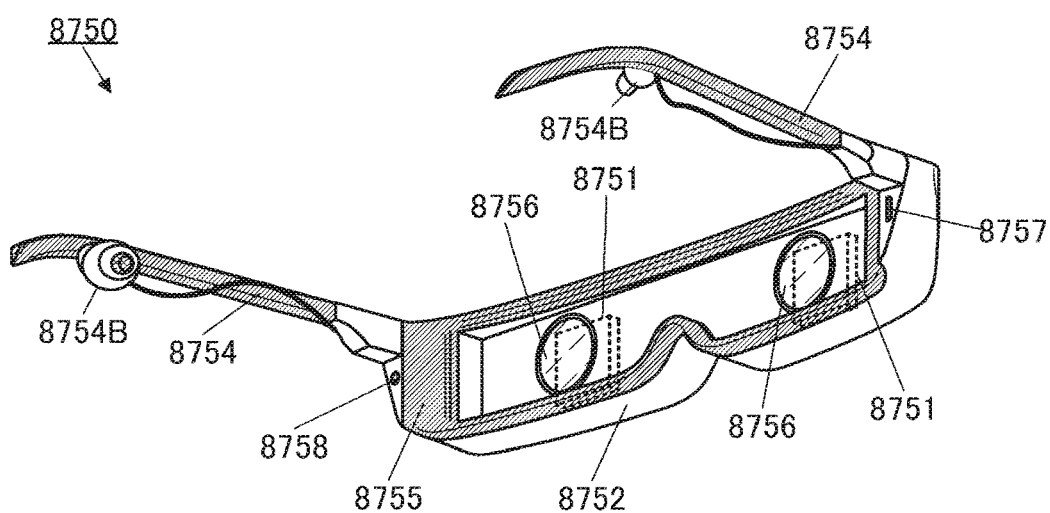

FIG. 35A to FIG. 35C are diagrams illustrating an appearance of an electronic device 8750, which is different from the electronic devices 8300 illustrated in FIG. 33A to FIG. 33D and FIG. 34A to FIG. 34C and the electronic device 8200 illustrated in FIG. 34D.

FIG. 35A is a perspective view illustrating the front surface, the top surface, and the left side surface of the electronic device 8750, and FIG. 35B and FIG. 35C are each a perspective view illustrating the back surface, the bottom surface, and the right side surface of the electronic device 8750.

The electronic device 8750 includes a pair of display apparatuses 8751, a housing 8752, a pair of mounting portions 8754, a cushion 8755, a pair of lenses 8756, and the like. The pair of display apparatuses 8751 is positioned to be seen through the lenses 8756 inside the housing 8752.

Here, one of the pair of display apparatuses 8751 corresponds to the display apparatus DSP illustrated in FIG. 13, for example. Although not illustrated, the electronic device 8750 illustrated in FIG. 35A to FIG. 35C includes an electronic component including the processing unit described in the above embodiment (e.g., the circuits included in the functional circuit region MFNC and the driver circuit region DRV illustrated in FIG. 13). Although not illustrated, the electronic device 8750 illustrated in FIG. 35A to FIG. 35C includes a camera (e.g., the sensor PDA illustrated in FIG. 13). The camera can take an image of the user's eye and its periphery. Although not illustrated, in the housing 8752 of the electronic device 8750 illustrated in FIG. 35A to FIG. 35C, a motion detection portion, an audio, a control portion, a communication portion, and a battery are provided.

The electronic device 8750 is an electronic device for VR. The user wearing the electronic device 8750 can see an image displayed on the display apparatus 8751 through the lens 8756. Furthermore, the pair of display apparatuses 8751 may display different images, whereby three-dimensional display using parallax can be performed.

An input terminal 8757 and an output terminal 8758 are provided on the back side of the housing 8752. To the input terminal 8757, a cable for supplying a video signal from a video output device or power for charging a battery provided in the housing 8752 can be connected. The output terminal 8758 can function as, for example, an audio output terminal to which earphones or headphones can be connected.

The housing 8752 preferably includes a mechanism by which the left and right positions of the lens 8756 and the display apparatus 8751 can be adjusted to the optimal positions in accordance with the position of the user's eye. In addition, the housing 8752 preferably includes a mechanism for adjusting focus by changing the distance between the lens 8756 and the display apparatus 8751.

With use of the camera, the display apparatus 8751, and the electronic component, the electronic device 8750 can estimate the state of the user of the electronic device 8750 and can display information on the estimated user's state on the display apparatus 8751. Alternatively, information on a state of the user of an electronic device connected to the electronic device 8750 through a network can be displayed on the display apparatus 8751.

The cushion 8755 is a portion in contact with the user's face (e.g., forehead and cheek). The cushion 8755 is in close contact with the user's face, so that light leakage can be prevented, which increases the sense of immersion. A soft material is preferably used for the cushion 8755 so that the cushion 8755 is in close contact with the face of the user wearing the electronic device 8750. For example, a material such as rubber, silicone rubber, urethane, and sponge can be used. Furthermore, when a sponge whose surface is covered with cloth or leather (e.g., natural leather and synthetic leather) is used, a gap is unlikely to be generated between the user's face and the cushion 8755, whereby light leakage can be suitably prevented. Furthermore, using such a material is preferable because it has a soft texture and the user does not feel cold when wearing the device in a cold season, for example. The member in contact with user's skin, such as the cushion 8755 or the mounting portion 8754, is preferably detachable because cleaning or replacement can be easily performed.

The electronic device in this embodiment may further include earphones 8754A. The earphones 8754A include a communication portion (not illustrated) and have a wireless communication function. The earphones 8754A can output audio data with the wireless communication function. Note that the earphones 8754A may include a vibration mechanism to function as bone-conduction earphones.

Like earphones 8754B illustrated in FIG. 35C, the earphones 8754A can be connected to the mounting portion 8754 directly or by wiring. The earphones 8754B and the mounting portion 8754 may each have a magnet. This is preferable because the earphones 8754B can be fixed to the mounting portion 8754 with magnetic force and thus can be easily housed.

The earphones 8754A may include a sensor portion. With use of the sensor portion, the state of the user of the electronic device can be estimated.

The electronic device of one embodiment of the present invention may include one or more selected from an antenna, a battery, a camera, a speaker, a microphone, a touch sensor, and an operation button, in addition to any one of the above components.

The electronic device of one embodiment of the present invention may include a secondary battery, and it is preferable that the secondary battery be capable of being charged by contactless power transmission.

Examples of the secondary battery include a lithium ion secondary battery (e.g., a lithium polymer battery using a gel electrolyte (a lithium ion polymer battery)), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display a video, information, or the like on a display portion. When the electronic device includes an antenna and a secondary battery, the antenna may be used for contactless power transmission.

A display portion in an electronic device of one embodiment of the present invention can display a video with a definition of, for example, full high definition, 4K2K, 8K4K, 16K8K, or higher.

Note that this embodiment can be combined with any of the other embodiments described in this specification as appropriate.

REFERENCE NUMERALS

DSP: display apparatus, DSP_L: display apparatus, DSP_R: display apparatus, PUa: pixel circuit, PUb: pixel circuit, LNS: lens, BW: bus wiring, ME: eye, YH: macula, CSK: fovea, MM: retina, MK: blood vessel, DIM: display image, TIM: captured image, WK: frame, WD: region, VCL: moving object, HDL: steering wheel, PIL: pillar, S61: step, S62: step, S63: step, S64: step, S71: step, S72: step, PXAL: pixel layer, LINL: wiring layer, SICL: circuit layer, MFNC: functional circuit region, DRV: driver circuit region, DRV1: driver circuit region, DRV2: driver circuit region, BS: substrate, DIS: display portion, SIC: circuit portion, PDA: sensor, PU: circuit, PX: circuit, PD: circuit, SL: wiring, GL: wiring, CL: wiring, TXL: wiring, POL: wiring, SNCL: wiring, BSL: bus wiring, ALP: array portion, ILD: circuit, WLD: circuit, XLD: circuit, AFP: circuit, MP: circuit, MP[1,1]: circuit, MP[m,1]: circuit, MP[1,n]: circuit, MP[m,n]: circuit, MC: circuit, MCr: circuit, HC: circuit, HCr: circuit, ACTF[1]: circuit, ACTF[j]: circuit, ACTF[n]: circuit, M1: transistor, M2: transistor, M3: transistor, M4: transistor, M1r: transistor, M2r: transistor, M3r: transistor, M4r: transistor, C1: capacitor, C1r: capacitor, n1: node, n1r: node, WL: wiring, WL[1]: wiring, WL[i]: wiring, WL[m]: wiring, WXIL: wiring, WXIL[1]: wiring, WXIL[i]: wiring, WXIL[m]: wiring, X2L: wiring, X2L[1]: wiring, X2L[i]: wiring, X2L[m]: wiring, OL: wiring, OL[1]: wiring, OL[j]: wiring, OL[n]: wiring, OLB: wiring, OLB[1]: wiring, OLB[j]: wiring, OLB[n]: wiring, ZL[1]: wiring, ZL[j]: wiring, ZL[n]: wiring, VE: wiring, VEr: wiring, GL1: wiring, GL2: wiring, GL3: wiring, ANO: wiring, VCOM: wiring, V0: wiring, EML: layer, OSL: layer, 10R: light-emitting device, 10G: light-emitting device, 10B: light-emitting device, 10LS: light-emitting device, 10PS: light-receiving device, 11: substrate, 12: substrate, 13: support plate, 15: protective member, 16: layer, 19: pixel region, 20: driver circuit portion, 22: frame memory, 50: electronic device, 51_L: optical system, 51_R: optical system, 52: image processing portion, 53: motion detection portion, 54: audio, 55: camera, 56: control portion, 57: communication portion, 58: battery, 61: source driver circuit, 62: digital-analog converter circuit, 63: gate driver circuit, 64: level shifter, 65: sensor row driver circuit, 66: sensor column driver circuit, 67: buffer memory, 71: memory device, 72: GPU, 72a: correction circuit, 72b: converter, 73: EL correction circuit, 74: timing controller, 75: CPU, 76: sensor controller, 77: power supply circuit, 85R: hole-injection layer, 85G: hole-injection layer, 85B: hole-injection layer, 86R: hole-transport layer, 86G: hole-transport layer, 86B: hole-transport layer, 86PD: hole-transport layer, 87R: light-emitting layer, 87G: light-emitting layer, 87B: light-emitting layer, 88R: electron-transport layer, 88G: electron-transport layer, 88B: electron-transport layer, 88PD: electron-transport layer, 89: common layer, 90: light-receiving layer, 91: protective layer, 92: insulating layer, 102: substrate, 111: insulator, 111a: insulator, 111b: insulator, 112: insulator, 113: insulator, 113a: insulator, 113b: insulator, 113c: insulator, 118: sacrificial layer, 119: sacrificial layer, 121a: conductor, 121b: conductor, 121c: conductor, 121CM: conductor, 121B: conductor, 121G: conductor, 121R: conductor, 121PD: conductor, 122a: conductor, 122b: conductor, 122c: conductor, 123: conductor, 123CM: region, 141a: EL layer, 141b: EL layer, 141c: EL layer, 142: EL layer, 150a: light-emitting device, 150b: light-emitting device, 150c: light-emitting device, 150B: light-emitting device, 150G: light-emitting device, 150R: light-emitting device, 150IR: light-emitting device, 160: light-receiving device, 162: insulator, 163: resin layer, 164: adhesive layer, 165: adhesive layer, 166a: coloring layer, 166b: coloring layer, 166c: coloring layer, 170A: pixel, 170B: pixel, 180: pixel, 180a: subpixel, 180b: subpixel, 180c: subpixel, 180d: subpixel, 200: transistor, 202: insulator, 210: substrate, 214: insulator, 216: conductor, 220: insulator, 222: insulator, 224: insulator, 226: insulator, 228: conductor, 230: conductor, 250: insulator, 300: transistor, 310: substrate, 312: element isolation layer, 313: semiconductor region, 314a: low-resistance region, 314b: low-resistance region, 315: insulator, 316: conductor, 317: insulator, 320: insulator, 322: insulator, 324: insulator, 326: insulator, 328: conductor, 330: conductor, 350: insulator, 351: substrate, 352: insulator, 353: layer, 354: insulator, 355: functional layer, 356: conductor, 357: layer, 359: substrate, 360: insulator, 362: insulator, 364: insulator, 366: conductor, 370: insulator, 372: insulator, 376: conductor, 380: insulator, 400: pixel circuit, 400A: pixel circuit, 400B: pixel circuit, 400C: pixel circuit, 400D: pixel circuit, 400E: pixel circuit, 400F: pixel circuit, 400G: pixel circuit, 400H: pixel circuit, 410: driver circuit, 500: transistor, 500A: transistor, 500B: transistor, 500C: transistor, 500D: transistor, 501: substrate, 512: insulator, 514: insulator, 540: conductor, 576: insulator, 581: insulator, 600: capacitor, 600A: capacitor, 1000: display apparatus, 1280: display module, 1281: display portion, 1290: FPC, 1282: circuit portion, 1283: pixel circuit portion, 1283a: pixel circuit, 1284: pixel portion, 1284a: pixel, 1285: terminal portion, 1286: wiring portion, 1291: substrate, 1292: substrate, 1430a: light-emitting device, 1430b: light-emitting device, 1430c: light-emitting device, 2000: arithmetic circuit, 4400a: light-emitting unit, 4400b: light-emitting unit, 4411: light-emitting layer, 4412: light-emitting layer, 4413: light-emitting layer, 4420: layer, 4420-1: layer, 4420-2: layer, 4430: layer, 4430-1: layer, 4430-2: layer, 4440: intermediate layer, 8200: electronic device, 8201: mounting portion, 8202: lens, 8203: main body, 8204: display portion, 8205: cable, 8206: battery, 8300: electronic device, 8301: housing, 8302: display portion, 8303: operation button, 8304: fixing unit, 8304a: fixing unit, 8305: lens, 8306: dial, 8307: dial, 8308: driver portion, 8310: user, 8311: user, 8750: electronic device, 8751: display apparatus, 8752: housing, 8754: mounting portion, 8754A: earphone, 8754B: earphone, 8756: lens, 8757: input terminal, 8758: output terminal

The invention claimed is:

1. An electronic device comprising a display apparatus, an image processing portion, and a control portion,
wherein the display apparatus comprises a first light-emitting device, a second light-emitting device as a light source, and a light-receiving device,
wherein the first light-emitting device is configured to emit light to a user's eye as a display image,
wherein the light-receiving device is configured to capture light from the second light-emitting device reflected by a retina of the user's eye as a captured image,
wherein the first light-emitting device, the second light-emitting device, and the light-receiving device are provided on a same layer,
wherein the image processing portion is configured to detect a macula included in the retina from the captured image and is configured to calculate position data of the macula, and
wherein the control portion is configured to obtain a position of a user's gaze destination on the display image from the position data of the macula.

2. The electronic device according to claim 1,
wherein from the captured image, the image processing portion is configured to detect a defocused object included in the captured image and is configured to sense a user's eye blinking.

3. The electronic device according to claim 1, wherein the image processing portion comprises a product-sum operation circuit and a circuit performing an arithmetic operation of an activation function.

4. An electronic device comprising a display apparatus, an image processing portion, and a control portion,
  wherein the display apparatus comprises a first light-emitting device, a second light-emitting device as a light source, and a light-receiving device,
  wherein the first light-emitting device is configured to emit light to a user's eye as a display image,
  wherein the light-receiving device is configured to capture light from the second light-emitting device reflected by a retina of the user's eye as a captured image,
  wherein the first light-emitting device, the second light-emitting device, and the light-receiving device are provided over a support plate,
  wherein the image processing portion is configured to detect a macula included in the retina from the captured image and is configured to calculate position data of the macula, and
  wherein the control portion is configured to obtain a position of a user's gaze destination on the display image from the position data of the macula.

\* \* \* \* \*